(12) United States Patent
Talapin et al.

(10) Patent No.: US 11,720,017 B2
(45) Date of Patent: Aug. 8, 2023

(54) PHOTOACTIVE, INORGANIC LIGAND-CAPPED INORGANIC NANOCRYSTALS

(71) Applicant: The University of Chicago, Chicago, IL (US)

(72) Inventors: Dmitri V. Talapin, Riverside, IL (US); Yuanyuan Wang, Chicago, IL (US); Hao Zhang, Urbana, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 774 days.

(21) Appl. No.: 16/604,045

(22) PCT Filed: Apr. 18, 2018

(86) PCT No.: PCT/US2018/028068
§ 371 (c)(1),
(2) Date: Oct. 9, 2019

(87) PCT Pub. No.: WO2018/195143
PCT Pub. Date: Oct. 25, 2018

(65) Prior Publication Data
US 2020/0249570 A1 Aug. 6, 2020

Related U.S. Application Data

(60) Provisional application No. 62/486,566, filed on Apr. 18, 2017, provisional application No. 62/608,839, filed on Dec. 21, 2017.

(51) Int. Cl.
C09K 11/02 (2006.01)
C09K 11/08 (2006.01)
(Continued)

(52) U.S. Cl.
CPC ........ *G03F 7/0042* (2013.01); *C09K 11/025* (2013.01); *C09K 11/0883* (2013.01);
(Continued)

(58) Field of Classification Search
CPC ... C09K 11/025; C09K 11/0883; C09K 11/58; C09K 11/623; C09K 11/661;
(Continued)

(56) References Cited

U.S. PATENT DOCUMENTS 6,379,635 B2   4/2002   O'Brien et al.
9,346,998 B2   5/2016   Talapin et al.
(Continued)

FOREIGN PATENT DOCUMENTS

WO    WO 2016/102157 A1    6/2016

OTHER PUBLICATIONS

Shukla et al., "Two-Photon Lithography of Sub-Wavelength Metallic Structures in a Polymer Matrix", Advanced Materials, 22, pp. 3695-3699. (Year: 2010).*
(Continued)

*Primary Examiner* — Matthew E. Hoban
*Assistant Examiner* — Lynne Edmondson
(74) *Attorney, Agent, or Firm* — Bell & Manning, LLC

(57) ABSTRACT

Ligand-capped inorganic particles, films composed of the ligand-capped inorganic particles, and methods of patterning the films are provided. Also provided are electronic, photonic, and optoelectronic devices that incorporate the films. The ligands that are bound to the inorganic particles are composed of a cation/anion pair. The anion of the pair is bound to the surface of the particle and at least one of the anion and the cation is photosensitive.

26 Claims, 32 Drawing Sheets

(51) Int. Cl.

| | | |
|---|---|---|
| C09K 11/62 | (2006.01) | |
| C09K 11/66 | (2006.01) | |
| C09K 11/70 | (2006.01) | |
| C09K 11/77 | (2006.01) | |
| C09K 11/88 | (2006.01) | |
| C09K 11/67 | (2006.01) | |
| G03F 7/004 | (2006.01) | |
| C09K 11/58 | (2006.01) | |
| C09K 11/74 | (2006.01) | |
| C09K 11/89 | (2006.01) | |
| G03F 7/20 | (2006.01) | |
| G03F 7/30 | (2006.01) | |
| H01L 21/02 | (2006.01) | |
| H01L 21/027 | (2006.01) | |
| H01L 29/786 | (2006.01) | |
| H01L 31/055 | (2014.01) | |
| H01L 33/50 | (2010.01) | |

(52) U.S. Cl.
CPC ............ *C09K 11/58* (2013.01); *C09K 11/623* (2013.01); *C09K 11/661* (2013.01); *C09K 11/671* (2013.01); *C09K 11/70* (2013.01); *C09K 11/7492* (2013.01); *C09K 11/7716* (2013.01); *C09K 11/7773* (2013.01); *C09K 11/883* (2013.01); *C09K 11/892* (2013.01); *G03F 7/20* (2013.01); *G03F 7/30* (2013.01); *H01L 21/0273* (2013.01); *H01L 21/02565* (2013.01); *H01L 21/02628* (2013.01); *H01L 29/7869* (2013.01); *H01L 31/055* (2013.01); *H01L 33/502* (2013.01)

(58) Field of Classification Search
CPC ... C09K 11/671; C09K 11/70; C09K 11/7492; C09K 11/7716; C09K 11/7773; C09K 11/883; C09K 11/892; C09K 11/565; C09K 11/60; H01L 33/502; H01L 29/7869; H01L 29/0665; H01L 21/02565; H01L 21/02628; C01B 21/082; C01B 19/002; C01B 19/007; C01G 28/00; C01G 15/00; C01G 21/21; C01G 25/02; B82Y 20/00; B82Y 40/00
See application file for complete search history.

(56) References Cited

U.S. PATENT DOCUMENTS

| | | | |
|---|---|---|---|
| 10,551,553 B2 | 2/2020 | Dubrow et al. | |
| 2011/0059264 A1 | 3/2011 | Park et al. | |
| 2014/0346442 A1 | 1/2014 | Nag et al. | |
| 2015/0185616 A1 | 7/2015 | Cooper et al. | |
| 2015/0234272 A1* | 8/2015 | Sarma ................... | G03F 7/0045 430/326 |
| 2018/0009659 A1 | 1/2018 | Naasani | |
| 2018/0011346 A1 | 1/2018 | Naasani | |
| 2018/0370800 A1 | 12/2018 | Smith et al. | |
| 2022/0011664 A1 | 1/2022 | Talapin et al. | |

OTHER PUBLICATIONS

Prabhakaran et al., "Quantum dots (QDs) for photonic applications", Optical Materials Express, vol. 2, No. 5, pp. 578-593. (Year: 2012).*
The extended European Search Report dated Nov. 9, 2020 for EP Patent Application No. 18788500.9; pp. 1-3.
Sean E. Doris et al., "Mechanistic Insight into the Formation of Cationic Naked Nanocrystals Generated under Equilibrium Control," Journal of the American Chemical Society, 2014, vol. 136; pp. 15702-15710.
Evelyn L. Rosen et al., "Exceptionally Mild Reactive Stripping of Native Ligands from Nanocrystal Surfaces by Using Meerwein's Salt**," Angew. Chem. Int. Ed., 2012, vol. 51; pp. 684-689.
Pang, Sin-Yi, et al. "Universal strategy for HF-free facile and rapid synthesis of two-dimensional MXenes as multifunctional energy materials," Journal of the American Chemical Society, vol. 141, No. 24 (2019); pp. 9610-9616.
Dong, Angang, et al., "A generalized ligand-exchange strategy enabling sequential surface functionalization of colloidal nanocrystals," Journal of the American Chemical Society, vol. 133, No. 4, (2011); pp. 998-1006.
Enomoto, Kazuyuki, et al., "Novel electron-beam-induced reaction of a sulfonium salt in the solid state," Journal of Vacuum Science & Technology B: Microelectronics and Nanometer Structures Processing, Measurement, and Phenomena, vol. 24, No. 5, (Sep./Oct. 2006); pp. 2337-2349.
Yuanyuan Wang et al., "Direct optical lithography of functional inorganic nanomaterials," Science, Jul. 28, 2017, vol. 357; pp. 385-388.
Kasahara, Kazuki et al. "Nanoparticle photoresist studies for EUV lithography." In Extreme Ultraviolet (EUV) Lithography VIII, vol. 10143, p. 1014308. International Society for Optics and Photonics, 2017.
Choi, Ji-Hyuk, et al. "Exploiting the colloidal nanocrystal library to construct electronic devices." Science 352, No. 6282 (2016): 205-208. DOI: 10.1126/science.aad0371.
Shirai, Masamitsu. "Non-ionic Photoacid Generators for i-Line: Synthesis, Photochemistry and Application to Photocrosslinking System." 2008 UV & EB Technical Conference Proceedings. https://www.radtech.org/proceedings/2008-toc.htm.
Subramani, Chandramouleeswaran et al. "Direct photopatterning of light-activated gold nanoparticles." Journal of Materials Chemistry 21, No. 37 (2011): 14156-14158. Accepted May 4, 2011. DOI: 10.1039/c1jm11035g.
Kim, Won Jin, et al. "Photothermal-reaction-assisted two-photon lithography of silver nanocrystals capped with thermally cleavable ligands." Applied Physics Letters 98, No. 13 (2011): 133110.
Webber, David H., and Richard L. Brutchey. "Nanocrystal ligand exchange with 1, 2, 3, 4-thiatriazole-5-thiolate and its facile in situ conversion to thiocyanate." Dalton Transactions 41, No. 26 (2012): 7835-7838.
Kim, Won Jin et al. "Robust microstructures using UV photopatternable semiconductor nanocrystals." Nano letters 8, No. 10 (2008): 3262-3265. Includes Supporting Information.
Lu, C. H. et al. "Fabrication and characterization of stable ultrathin film micropatterns containing CdS nanoparticles." Advanced Functional Materials 13, No. 7 (2003): 548-552.
Jun, Shinae et al. "Photopatterned semiconductor nanocrystals and their electroluminescence from hybrid light-emitting devices." Langmuir 22, No. 6 (2006): 2407-2410.
Park, Jong-Jin et al. "Photopatternable quantum dots forming quasi-ordered arrays." Nano letters 10, No. 7 (2010): 2310-2317.
Mentzel, Tamar S. et al. "Nanopatterned Electrically Conductive Films of Semiconductor Nanocrystals." Nano Letters 12, No. 8 (Aug. 8, 2012): 4404-4408.
Chen, Peter E. et al. "Tight binding of carboxylate, phosphonate, and carbamate anions to stoichiometric CdSe nanocrystals." Journal of the American Chemical Society 139, No. 8 (2017): 3227-3236.
The English translation of the Chinese First Office Action dated Feb. 9, 2023 issued for Chinese Patent Application No. 201880033898.9; pp. 1-7.
Korean first Office Action dated May 11, 2023 for Korean patent application No. 2019-7033764; pp. 1-7.
Google Translate—Machine Translation of Prior Art-Based Rejections in Korean Office Action for Korean patent application No. 2019-7033764; pp. 1-5.
Dmitry N. Kirin et al., "Lead Halide Perovskites and Other Metal Halide Complexes As Inorganic Capping Ligands for Colloidal Nanocrystals," *J. Am. Chem. Soc.* 2014, 136; pp. 6550-6553. Dx.doi.org/10.1021/ja5006288.

\* cited by examiner

FIG. 2B
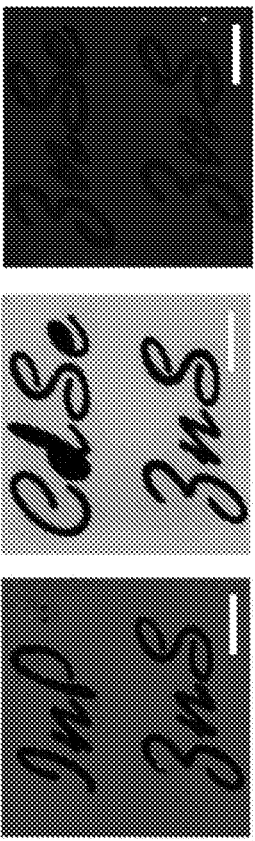
FIG. 2C
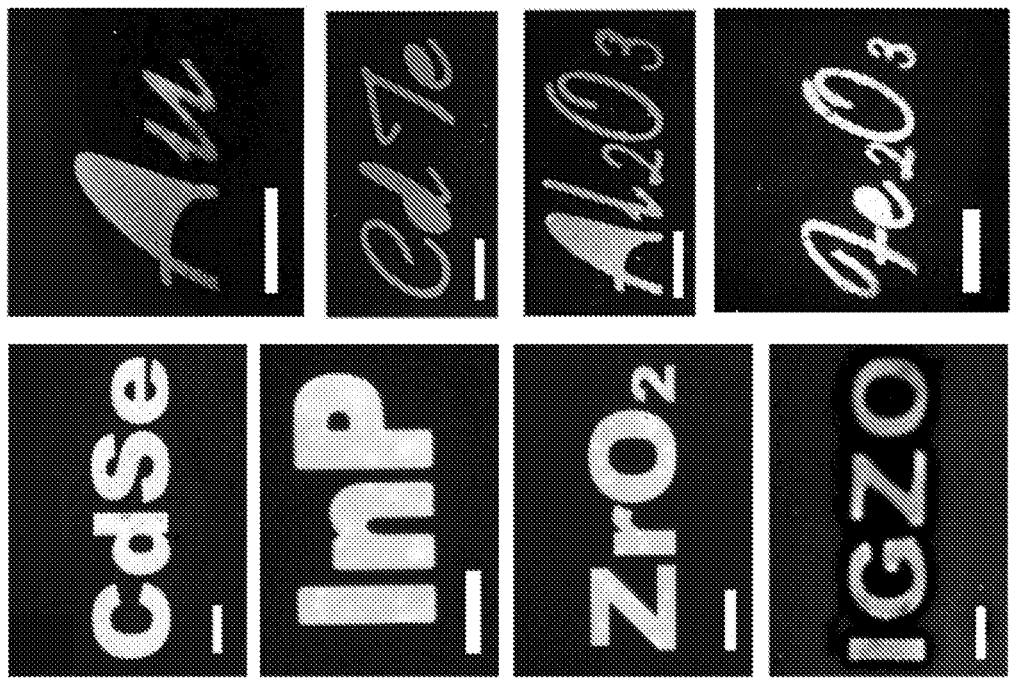
FIG. 2A

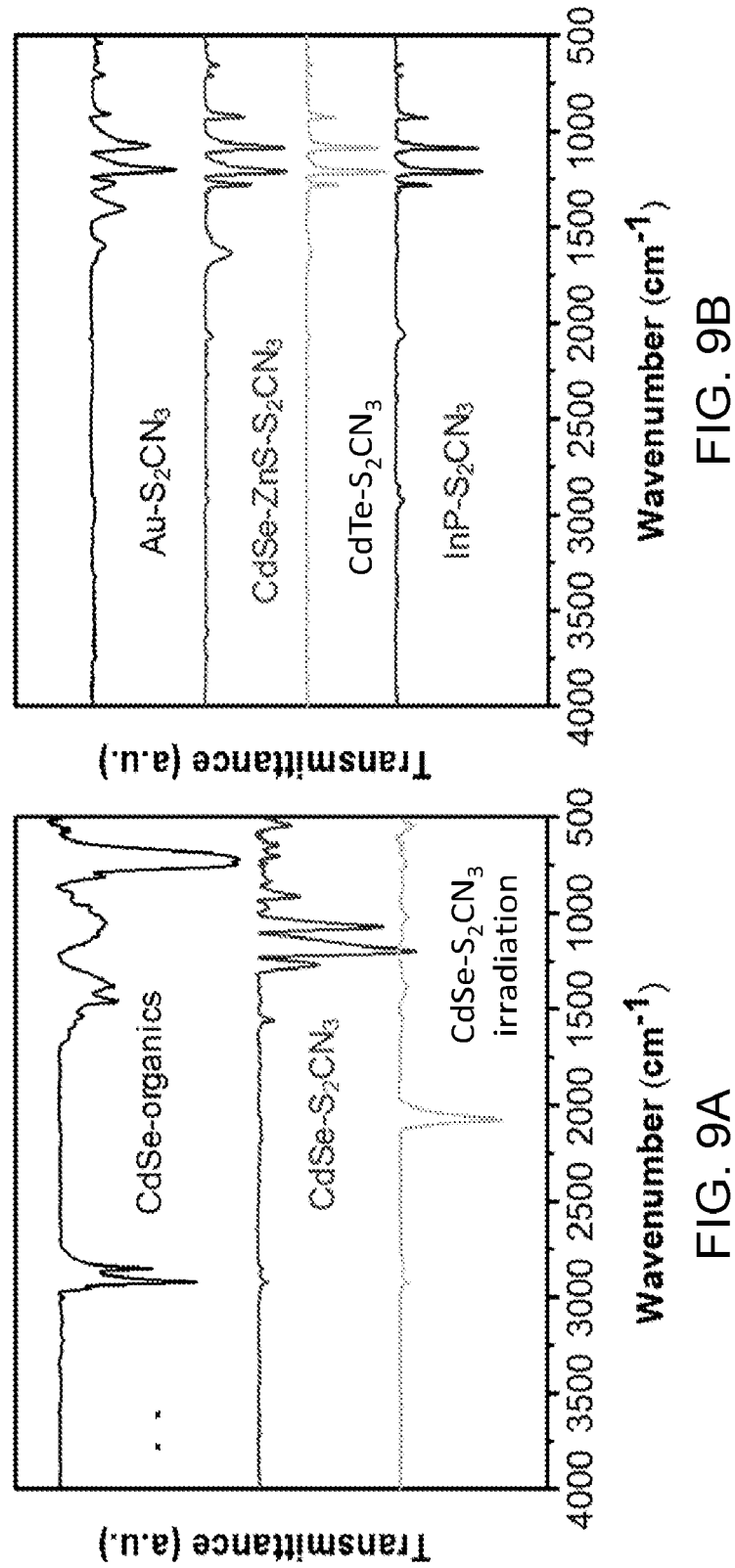

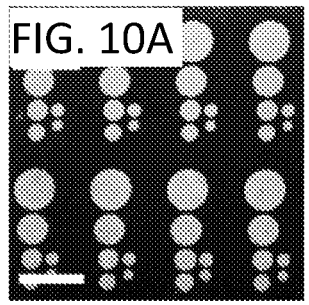
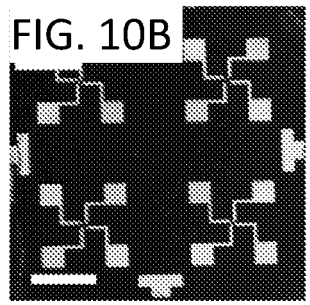
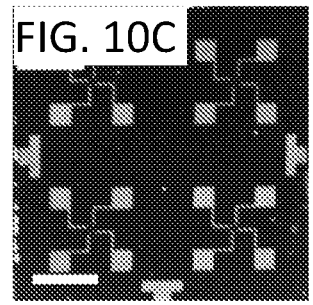
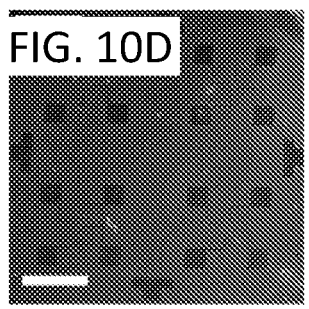
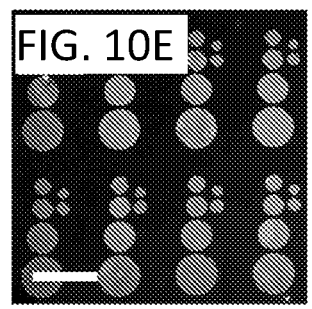
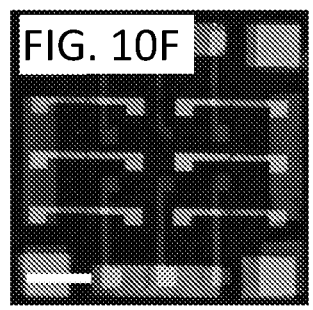
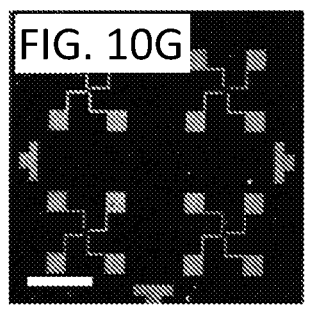
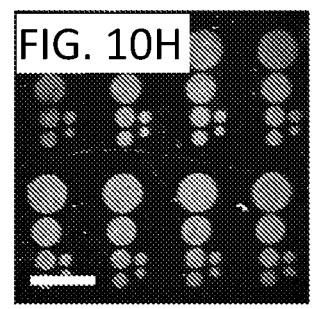
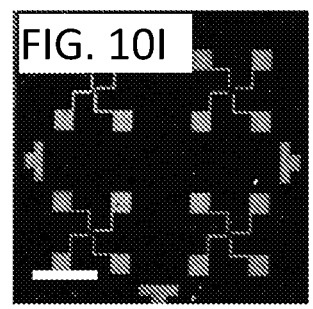
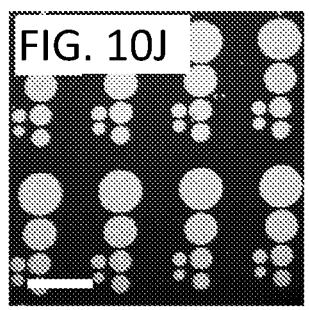
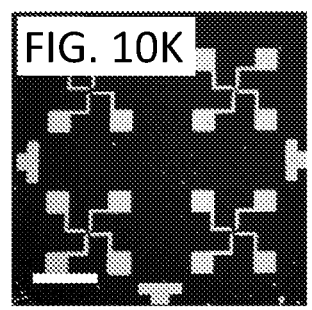
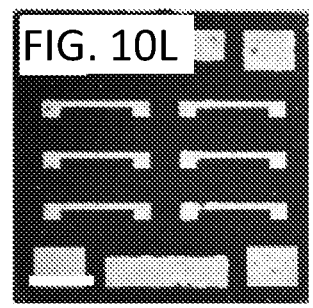
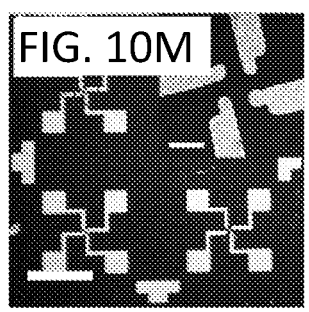
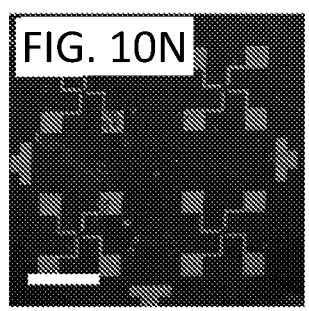
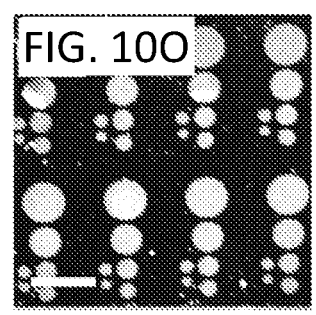

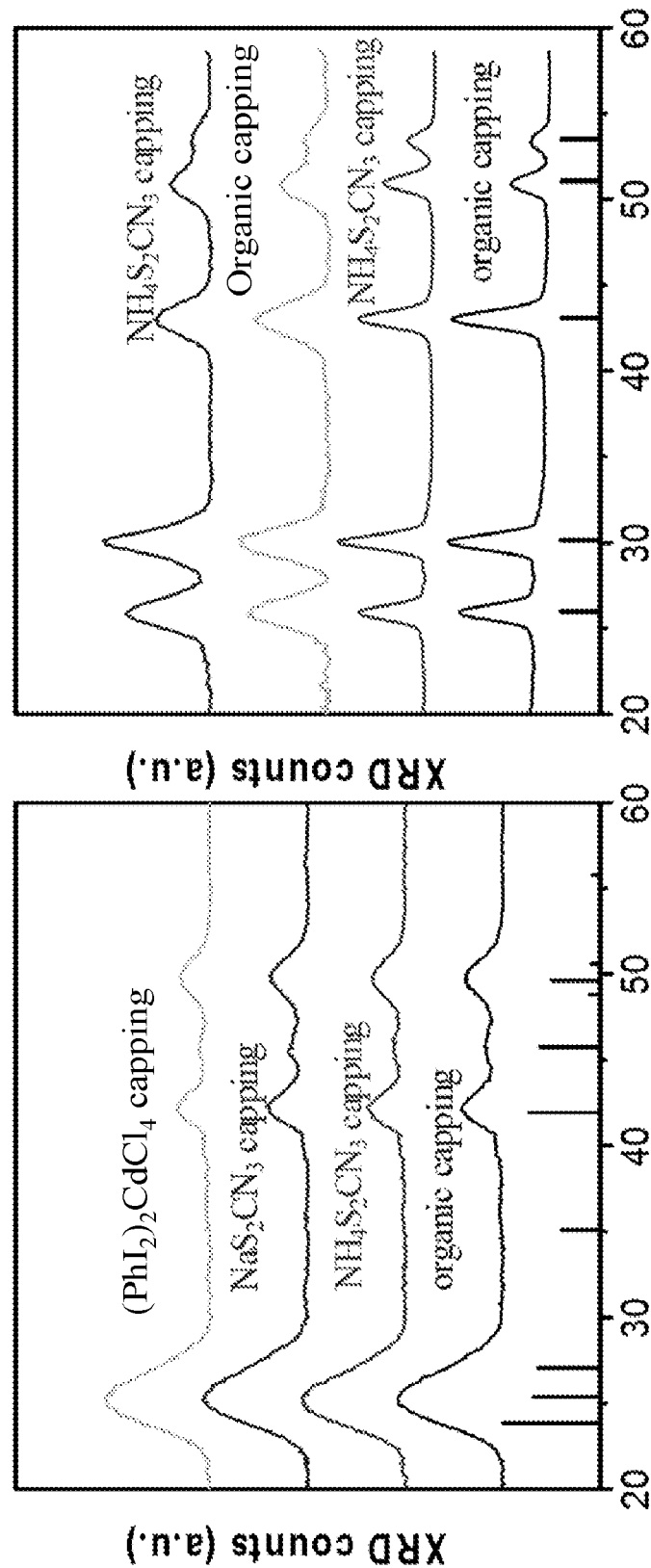

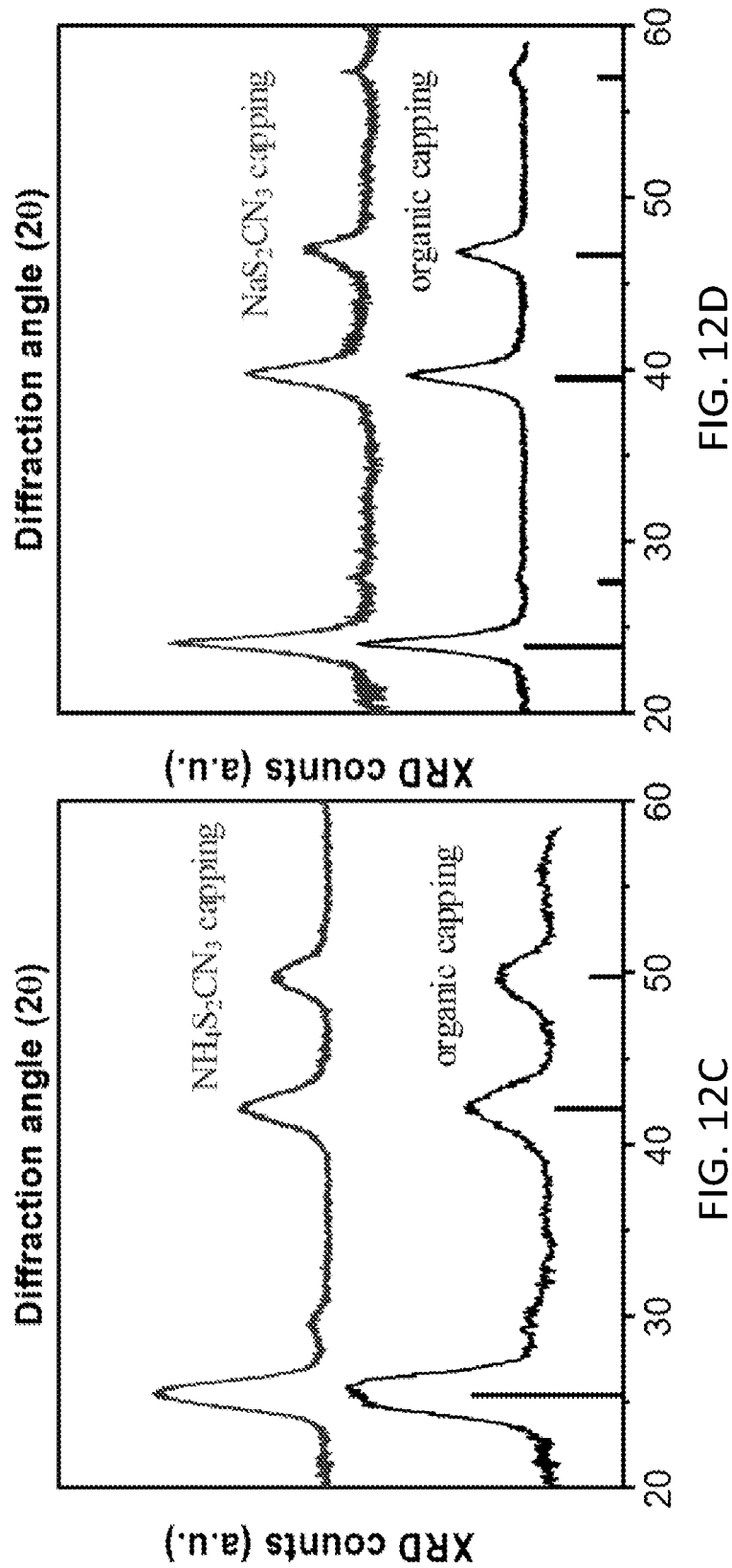

PHOTOACTIVE, INORGANIC LIGAND-CAPPED INORGANIC NANOCRYSTALS

CROSS-REFERENCE TO RELATED APPLICATIONS

This application is a National Stage of International Application No. PCT/US2018/028068, filed Apr. 18, 2018, which claims the benefit of U.S. Patent Application No. 62/486,566, filed Apr. 18, 2017, and to U.S. provisional patent application No. 62/608,839, filed Dec. 21, 2017, the contents of which are herein incorporated by reference.

BACKGROUND

Solution-processed colloidal nanocrystals (NCs) and quantum dots (QDs) provide a versatile platform for building electronic and optoelectronic devices. These materials enable non-epitaxial deposition and low-temperature processing of light-emitting diodes (LEDs), field effect transistors (FETs), near- and mid-infrared photodetectors, solar cells, etc. The transition from individual devices to the level of electronic circuits, sensor arrays, and high-definition QD LED displays requires the development of material-adapted patterning methods. Depending on the resolution, throughput, and defect tolerance, various patterning and deposition techniques can be considered, including photo- and imprint lithography, microcontact and inkjet printing, and laser or electron beam (e-beam) writing. Among these, photolithography evolved as a method of choice for the electronics industry due to the combination of high-resolution and very low cost per patterned element. The latter comes from the parallel nature of the lithographic process—billions of circuit elements can be defined simultaneously, in contrast to serial techniques like inkjet printing and e-beam writing.

BRIEF DESCRIPTION OF THE DRAWINGS

Illustrative embodiments of the invention will hereafter be described with reference to the accompanying drawings, wherein like numerals denote like elements.

FIG. 1A is a schematic representation of a nanocrystal with ion pair surface ligands. FIG. 1B shows two complementary approaches to the design of photosensitive inorganic ligands: either cation (PAG$^+$) or anion (TTT$^-$) of the ion-pair ligand can react under exposure to UV light. FIG. 1C depicts an absorbance spectrum showing a TTT$^-$ group has a strong absorption band in the UV region. This UV band is present in the absorption spectra of CdSe NCs capped with NH$_4$TTT ligands. An exposure to 254 nm light causes a clean transformation of TTT$^-$ to SCN$^-$ as confirmed by changes in the IR absorption spectra shown in the inset. FIG. 1D shows an absorption spectrum of CdSe—Sn$_2$S$_6$ in DMF (lower curve) and CdSe—Sn$_2$S$_6$ NCs recovered from the developing solvent (upper curve). Inset: TEM image of recovered CdSe—Sn$_2$S$_6$ NCs.

FIGS. 2A-2C show examples of optically-patterned inorganic materials. FIG. 2A depicts different nanoparticle materials patterned using PAG$^+$-based ligands (CdTe, ZrO$_2$, Fe$_2$O$_3$ and IGZO) and TTT$^-$ ligands (CdSe, InP, Au, Al$_2$O$_3$). Scale bars are 100 μm for the left column and 5 mm for the right column. FIG. 2B shows CeO$_2$ nanocrystals patterned on a glass substrate using (Ph$_2$I)$_2$MoO$_4$ ligands. FIG. 2C (top row) shows positive patterns of CdSe/ZnS, InP/ZnS and ZnSe/ZnS core-shell QDs patterned with NH$_4$TTT ligands. FIG. 2C (bottom row) shows negative patterns of oleate-capped InP/ZnS, CdSe/ZnS and ZnSe/ZnS core-shell QDs patterned using (p-CH$_3$S—C$_6$H$_4$—)(C$_6$H$_5$—)$_2$S$^+$ OTf$^-$ (OTf=triflate) PAG ligands.

FIG. 3A depicts a pattern formed by two sequentially defined layers of 10 μm wide stripes of CdSe NCs patterned using NH$_4$TTT ligands. The inset shows a magnified view of the same pattern. FIG. 3B is an SEM image of an edge of a photopatterned layer of CdSe NCs capped with NH$_4$TTT ligands. FIG. 3C shows a 1951 USAF target with one-micron resolution made of optically patterned CdSe NCs with NH$_4$TTT ligands. FIG. 3D shows height profiles of CdTe layers optically patterned using the NCs capped with (Ph$_2$I)$_2$CdCl$_4$ ligands. FIG. 3E depicts a height profile of a multilayer stripe pattern created using CdSe NCs with NH$_4$TTT ligands. FIG. 3F depicts optical microscopy images of sintered CdTe—CdCl$_4$-PAG NCs stripes (from top to bottom: 20 nm, 50 nm and 100 nm). FIG. 3G shows profilometry data for patterned 300 nm thick Al$_2$O$_3$ stripes with different widths (50 μm, 15 μm).

FIG. 4A shows a photoluminescence spectrum of pixels composed of red, green and blue-emitting quantum dots patterned using NH$_4$TTT ligands. The emission spectra of corresponding QD solutions are shown as dash lines. The excitation wavelength was 360 nm. FIG. 4B depicts the dielectric constant of an Al$_2$O$_3$ layer patterned using NH$_4$TTT ligands. The measurements were carried out for an Al/Al$_2$O$_3$/Al flat capacitor with a 125 nm-thick Al$_2$O$_3$ layer and an area of 0.64 mm$^2$. The inset shows an I-V characteristic used to measure the resistivity of the Al$_2$O$_3$ layer. FIGS. 4C and 4D show transfer and output characteristics of an FET with a channel made of compositionally-matched CdSe/Cd$_2$Se$_3$$^{2-}$ ligands and CdCl$_2$ treatment. FIGS. 4E and 4F show transfer and output characteristics of an FET with an IGZO channel. The channel length was 30 μm and the channel width was 180 μm.

FIGS. 9A-9D show FTIR spectra of functional inorganic materials. FIG. 9A shows CdSe NCs capped with organic ligands and with S$_2$CN$_3$$^-$ (TTT$^-$) ligands before and after UV exposure. FIG. 9B shows Au, CdSe—ZnS, CdTe, and InP NCs capped with TTT$^-$ ligands. FIG. 9C depicts Al$_2$O$_3$ NCs capped with TTT$^-$ before and after UV exposure. FIG. 9D depicts CdSe NCs capped with organic ligands, the same after ligand exchange with (Ph$_2$I)$_2$CdCl$_4$, and CdSe NCs with (Ph$_2$I)$_2$CdCl$_4$ ligands annealed at 350° C. for 20 s.

FIGS. 10A-10O depict different patterns obtained from all-inorganic materials. FIGS. 10A-10F show TTT$^-$ capped CdSe (FIG. 10A), CdTe (FIG. 10B), InP (FIG. 10C), Al$_2$O$_3$ (FIG. 10D), Au NCs (FIG. 10E), and double-layer patterns of red-emitting CdSe/ZnS QDs with green-emitting InP/ZnS QDs (FIG. 10F). FIGS. 10G-10O show NCs patterned using the PAG ligand (4-methylthiophenyl)methyl phenyl sulfonium triflate (p-CH$_3$S—C$_6$H$_4$—)(C$_6$H$_5$—)$_2$S$^+$OTf$^-$). FIG. 10G shows CdSe—CdCl$_4{}^{2-}$ NCs. FIG. 10H shows CdTe—CdCl$_4{}^{2-}$ NCs. FIG. 10I shows InAs—Cu$_7$S$_4{}^-$ NCs. FIG. 10J depicts CdSe—AsS$_3{}^{3-}$ NCs. FIG. 10K shows CdSe—Sn$_2$S$_6{}^{4-}$ NCs. FIG. 10L shows CdSe—Cd$_2$Se$_3{}^{2-}$ NCs. FIG. 10M shows CdSe—SCN$^-$ NCs. FIG. 10N depicts CeO$_2$—MoO$_4{}^{2-}$ NCs. FIG. 10O shows amorphous IGZO. Scale bar: 100 μm.

FIGS. 12A-12H show powder X-ray diffraction patterns of functional inorganic materials. FIG. 12A depicts CdSe NCs. FIG. 12B shows PbS NCs with two different sizes. FIG. 12C shows HgSe NCs. FIG. 12D shows HgTe NCs. FIG. 12E shows CeO$_2$ NCs. FIG. 12F shows ZrO$_2$ NCs. FIG. 12G shows Au NCs, and FIG. 12H shows amorphous IGZO under different annealing temperatures.

DESCRIPTION

Figure 1A:
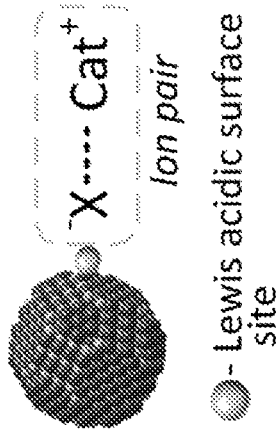
FIGS. 1A-1D show optical patterning of nanoparticles with photosensitive inorganic ligands.

Ligand-capped inorganic particles, films composed of the ligand-capped inorganic particles, and methods of patterning the films are provided. Also provided are electronic, photonic, and optoelectronic devices that incorporate the films.

The ligands that are bound to the inorganic particles are composed of a cation/anion pair. The anion of the pair is bound to the surface of the particle and at least one of the anion and the cation is photosensitive. For the purposes of this disclosure, an ion is photosensitive if irradiating the ion with light of an appropriate wavelength induces a chemical change in the ion. Dispersions of the ligand-capped inorganic particles in organic solvents can be deposited onto substrates and dried into thin films capable of acting as photoresists.

The particles to which the ligands can be bound include nanocrystals, where a nanocrystal is a crystalline particle having at least one nanoscale dimension—typically no greater than 1000 nm, for example, or no greater than 500 nm. Some nanocrystals have no dimension that is greater than 1000 nm. However, larger particles can also be used. The nanocrystals can have a variety of regular and irregular shapes and include substantially round nanocrystals and elongated nanocrystals, such as nanorods or nanowires. The particles, including the nanocrystals, can be composed of electrically conductive materials, semiconducting materials, dielectric materials, magnetic materials, catalytic materials, and/or light up-converting materials. Suitable particles include metal particles, metal alloy particles, metal chalcogenide particles, metalloid particles, Group IV semiconductor particles, Group II-VI semiconductor particles, Group III-V semiconductor particles, metal oxide particles, and metalloid oxide particles. Suitable nanocrystals include core-shell nanocrystals having an inner core material surrounded by an outer shell material. The inorganic nanocrystals can be made, for example, using colloidal synthesis, gas phase synthesis, or ball-milling.

Examples of Group II-VI nanocrystals to which the photosensitive ligands can be bound include CdSe nanocrystals, CdTe nanocrystals, ZnS nanocrystals, ZnSe nanocrystals, HgSe nanocrystals, HgTe nanocrystals, HgS nanocrystals, Hg$_x$Cd$_{1-x}$Te nanocrystals, Hg$_x$Cd$_{1-x}$S nanocrystals, Hg$_x$Cd$_{1-x}$Se nanocrystals, Cd$_x$Zn$_{1-x}$Te nanocrystals, Cd$_x$Zn$_{1-x}$Se nanocrystals, Cd$_x$Zn$_{1-x}$S nanocrystals, CdS nanocrystals, and ZnTe nanocrystals, where 0<x<1. Larger particles of these materials can also be used.

Examples of Group III-V nanocrystals to which the photosensitive ligands can be bound include InP nanocrystals, InAs nanocrystals, InSb nanocrystals, GaAs nanocrystals, GaP nanocrystals, GaN nanocrystals, GaSb nanocrystals, InN nanocrystals, InSb nanocrystals, AlP nanocrystals, AlN nanocrystals, and AlAs nanocrystals. Larger particles of these materials can also be used.

Examples of Group IV nanocrystals to which the photosensitive ligands can be bound include Si nanocrystals, Ge nanocrystals, SiGe nanocrystals, and SiC nanocrystals. Larger particles of these materials can also be used.

Examples of metal oxide nanocrystals to which the photosensitive ligands can be bound include Fe$_2$O$_3$ nanocrystals, Al$_2$O$_3$ nanocrystals, ZrO$_2$ nanocrystals, CeO$_2$ nanocrystals, ZnO nanocrystals, FeO nanocrystals, Fe$_3$O$_4$ nanocrystals, HfO$_2$ nanocrystals, and indium gallium zinc oxide (IGZO) nanocrystals. Larger particles of these materials can also be used.

Examples of metal nanocrystals, including metal chalcogenide nanocrystals, to which the photosensitive ligands can be bound include Au nanocrystals, Ag nanocrystals, Fe nanocrystals, Pt nanocrystals, FePt nanocrystals, Bi nanocrystals, $Bi_2S_3$ nanocrystals, $Bi_2Se_3$ nanocrystals, $Bi_2Te_3$ nanocrystals, Co nanocrystals, CoPt nanocrystals, $CoPt_3$ nanocrystals, Cu nanocrystals, $Cu_2S$ nanocrystals, $Cu_2Se$ nanocrystals, $CuInSe_2$ nanocrystals, $CuIn_{(1-x)}Ga_x(S,Se)_2$ nanocrystals, where 0<x<1, $Cu_2ZnSn(S,Se)_4$ nanocrystals, GaSe nanocrystals, Ni nanocrystals, PbS nanocrystals, PbSe nanocrystals, PbTe nanocrystals, Pd nanocrystals, Ru nanocrystals, Rh nanocrystals, and Sn nanocrystals. Larger particles of these materials can also be used.

Photosensitive cations can be associated with a variety of inorganic anions in a ligand ion pair. In some embodiments of the ligand ion pairs, the anions are metal-containing anions, such as metal anions, metal halide anions, metal chalcogenide anions, and/or metal oxide anions. For example, various embodiments of the anions have the formulas: $MX_n^{m-}$, where M represents a metal atom, X represents a halogen atom, n represents the stoichiometry of the halogen atom (e.g., n=3 or n=4), and m represents the degree of anionic charge (e.g., m=1 or m=2) (examples include $CdCl_3^-$ and $CdCl_4^{2-}$); $MCh_n^{m-}$, where M represents a metal atom, Ch represents a chalcogen atom, n represents the stoichiometry of the chalcogen atom (e.g., n=2, 3, 4, 5, or 6), and m represents the degree of anionic charge (e.g., m=2, 3, or 4) (examples include $CdTe_2^{2-}$, $Sn_2S_6^{4-}$, $AsS_3^{3-}$, and $SnS_4^{4-}$); and $MO_z^{y-}$, where M represents a metal atom, z represents the stoichiometry of the oxygen atom (e.g., z=4), and y represents the degree of anionic charge (e.g., y=2) (examples include $MoO_4^{2-}$). Other examples include metal phosphorus oxides (e.g., $P_2W_{18}O_{62}^{6-}$ and $PM_{O12}O_{40}^{3-}$).

In other embodiments, the photosensitive cations are associated with inorganic metal-free anions, such as chalcogenide anions, halide anions, oxygen anions ($O^{2-}$), and azide anions ($N_3^-$). Metal-free anions include oxides of the non-metals sulfur, phosphorus, nitrogen and carbon, including sulfide anions ($SO_3^{2-}$), phosphate anions ($PO_4^{3-}$), tetrafluoroborate anions ($BF_4^-$) and $OCN^-$ anions. For example, various embodiments of the halide anions have the formula $X_n^{m-}$, where X represents a halogen atom, n represents the number of the halogen atoms (e.g., n=1), and m represents the degree of anionic charge (e.g., m=1) (examples include $Cl^-$). In these embodiments, the surfaces of the nanoparticles are charge-balanced by the metal-free anions, such as a $BF_4^-$ anion, a triflate (OTf-) anion or a nitrate ($NO_3^-$) anion. Such anions can be introduced by stripping away any organic ligands that are initially bound to the inorganic particles using a solution of a stripping agent than includes a salt of the metal-free anion. Examples of such stripping agents include tetrafluoroborate salts (e.g. $NOBF_4$, $Et_3OBF_4$), metal triflate salts (e.g. $Zn(OTf)_2$, $Cd(OTf)_2$), metal nitrate salts (e.g. $Zn(NO_3)_2$, $In(NO_3)_2$), sulfate salts, and phosphate salts.

The photosensitive cations include cations that are photoacid generators (PAGs). PAGs are cationic photoinitiators that break down when they are irradiated with light of an appropriate wavelength to release an acid proton. Suitable PAG cations include sulfonium-based cations and iodonium-based cations, such as cations that comprise a diaryliodonium group, a triarylsulfonium group, or a diarylalkylsulfonium group. Imide-based PAGs can also be used. Examples of PAG cations include those having a diphenylsulfonium group, a diphenyl iodonium group, a methyl phenyl sulfonium group, or a triphenysulfonium group. Specific examples of PAGs include bis(4-tert-butylphenyl)iodonium, boc-methoxyphenyldiphenylsulfonium, (tert-butoxycarbonylmethoxynaphthyl)-diphenylsulfonium, (4-tert-butylphenyl)diphenylsulfonium, diphenyliodonium, (4-fluorophenyl)diphenylsulfonium, N-hydroxynaphthalimide, N-hydroxy-5-norbornene-2,3-dicarboximide, (4-iodophenyl)diphenylsulfonium, (4-methoxyphenyl)diphenylsulfonium, (4-methylphenyl) diphenylsulfonium, (4-methylthiophenyl)methyl phenyl sulfonium, (4-phenoxyphenyl) diphenylsulfonium, (4-phenylthiophenyl) diphenylsulfonium, triphenylsulfonium, and tris(4-tert-butylphenyl)sulfonium.

By way of illustration only, some embodiments of the ligands having a photosensitive cation have the formula $A_2$-$MX_4$, where A represents a PAG cation, M represents a metal atom, such as a metal atom from group 12 or group 13 of the periodic table of the elements, and X represents a halogen atom. In these ligands, $MX_4$ can be, for example $CdCl_4$, $ZnCl_4$, or $InCl_4$. Such ligands may be used as sintering promoters upon annealing.

The photosensitive cations include cations that are photobase generators (PBGs). The working mechanism of PBGs in the inorganic ligand-capped particles is like that of PAGs, except that a base, instead of an acid, is released from PBGs molecules upon irradiation. Such a base will cause the chemical modification of ligand-capped particles. By way of illustration, a composition comprising CdSe nanocrystals having surface-bound, PBG-containing ligands can be prepared by mixing an inorganic ligand comprising a PBG cation and an anion of the type described herein (e.g., metal halides, metal chalcogenides, metal oxides, chalcogenides, a halides, or $O^{2-}$, or a combination of two or more thereof), with organic ligand-capped CdSe nanocrystals, wherein the organic ligands are exchanged with the PBG-containing ligands. PBG cations include, for example, Co(III)-amine and alkyl amine salts, O-acyloximes, benzyloxycarbonyl derivatives, and/or formamides. Upon irradiation, the amines released from the PBGs change the nanocrystals' surfaces from hydrophilic to hydrophobic. A film of PBG-capped nanoparticles can be patterned according to the methods described herein.

Photosensitive anions can be associated with a variety of cations in a ligand ion pair. Suitable cations include ammonium cations ($NH_4^+$) and alkyl ammonium cations, including quaternary ammonium cations, which can be represented by the formula $NR_4^+$, where R represents a hydrogen atom, an alkyl group, an aryl group, or a combination thereof.

The photosensitive anions include 1, 2, 3, 4-thiatriazole-5-thiolate ($S_2CN_3^-$) and iron oxalates, such as $(Fe(C_2O_4)_3)^{2-}$. When the latter anions are irradiated with radiation of the appropriate wavelengths, the Fe(III) turns to Fe(II), which subsequently changes the binding ability between the anion and inorganic particle surface, and further changes the solubility of the ligand-capped particles in organic solvents. Other photosensitive anions include N-alkyl dithiocarbamate anions or N, N-dialkyl dithiocarbamate anions. Specific examples of these include N-methyl dithiocarbamate, N, N-dimethyl dithiocarbamate, N-ethyl dithiocarbamate, and N, N-diethyl dithiocarbamate. Still other photosensitive anions include 1,1-thiooxalate, deprotonated 5-mercapto-1-methyltetrazole, and ethyl xanthate.

The ligand-capped inorganic particles can be made by forming a solution comprising organic ligand-capped inorganic particles and the anion and cation of the ligand ion pair at a temperature and for a time that facilitates the exchange of the organic ligands with the ligand ion pair. The organic ligands initially bound to the surface of the nanocrystals may be native ligands that are present by virtue of the nanocrystal synthesis. Such ligands include, but are not limited to, lipophilic ligands, such as oleate and oleylamine (OAm) ligands.

In other embodiments, non-ionic PAGs are used. In these embodiments, the surfaces of the particles are charged balanced by charge balancing ions, which can be metal-containing anions—including metal-containing anions of the type described herein, metal-free anions—including metal-free anions of the type described herein, or a combination thereof. However, in these embodiments, the non-ionic PAGs are not bound to the nanoparticle surface as part of an ion pair. Instead, the non-ionic PAGs are included in a solution comprising the nanoparticles. Notably, non-ionic PAG ligands are able to stabilize larger particles (e.g., particles having a size of 1 μm or greater) in polar organic solvents. Examples of non-ionic PAGs include, N-hydroxy-5-norbornene-2,3-dicarboximide perfluoro-1-butane-sulfonate, N-hydroxynaphthalimide triflate, 2-(4-methoxystyryl)-4,6-bis(trichloromethyl)-1,3,5-triazine, 4-N,N-dimethylaminophenyl p-toluenesulfonate, methyl trifluoromethane sulfonate, phenyl trifluoromethanesulfonate, 2-naphthyl trifluoromethanesulfonate, and 4-nitrophenyl trifluoromethanesulfonate. In some embodiments, non-ionic PAGs other than N-hydroxynaphthalimide triflate are used.

Photopatternable films containing the ligand-capped inorganic particles can be formed by coating a substrate with a dispersion of the ligand-capped inorganic particles and allowing the coating to dry. Similarly, films containing a mixture of inorganic nanoparticles and non-ionic PAGs can be formed by coating a substrate with a solution containing the non-ionic PAGs and dispersed inorganic nanoparticles and allowing the coating to dry. The resulting films can be patterned to provide patterned inorganic films for use in a wide range of devices. The coatings can be formed using, for example, casting, spinning, spraying, and/or slot-die coating techniques. In the methods, a first portion of a film comprising inorganic particles is irradiated with radiation that includes wavelengths that induce a chemical change in the photosensitive anions or cations of the ligand ion pairs or the photosensitive non-ionic PAG, while a second portion of the film is protected from the radiation. As a result, the exposed portion of the film undergoes a chemical modification. Then, either the first portion of the film of the second portion of the film is selectively removed. Patterns with high resolutions, including resolutions of 1 μm or better and further including resolutions of 20 nm or better, can be formed in thin films, including films with thicknesses in the range from 5 nm to 200 nm. The incident radiation wavelengths will depend on the particular ligands or the particular non-ionic PAG being used. In various embodiments of the methods, radiation having wavelengths in the ultraviolet, including the deep ultraviolet and extreme ultraviolet, the visible, and/or the infrared regions of the electromagnetic spectrum may be used. For example, ultraviolet light with a wavelength of 365 nm can be used. The incident radiation may also be an electron beam. After patterning, the solvents and/or nanocrystals can be recycled.

In some embodiments of the methods, the irradiated portion of the film is rendered insoluble in an organic solvent, or at least less soluble in an organic solvent than the protected portion of the film. In other embodiments, the irradiated portion of the film is rendered soluble in an organic solvent, or at least more soluble in an organic solvent than the protected portion of the film. In these embodiments, the more soluble portion of the film can be selectively removed by contacting the film with an organic solvent that dissolves the more soluble portion of the film, but not the other portion. In some embodiments, the solvent is a polar organic solvent, such as dimethylformamide (DMF) or N-methylformamide (NMF).

If the films include a PAG, either as part of a ligand or as a non-ionic component within the film, the radiation is selected such that it is absorbed by and breaks down the PAG to produce an acid. That acid, in turn, reacts with the film to render the irradiated portion of the film insoluble in an organic solvent, while any unexposed portion of the film remains soluble in that solvent. The soluble portion of the film can then be selectively removed by contacting it with the solvent. Alternatively, the radiation can convert a photoactive anion or cation that is soluble in an organic solvent into an anion or cation that is insoluble in the organic solvent. For example, $S_2CN_3$ anions are soluble in certain polar organic solvents, but are converted into SCN anions, with are insoluble in those polar organic solvents, upon exposure to ultraviolet radiation.

Another method of patterning a film composed of ligand-capped particles, such as ligand-capped nanocrystals, starts with a film comprising inorganic particles capped with lipophilic organic ligands, such as oleate ligands or oleylamine ligands. The film is exposed to a solution that includes PAG cations and anions. A portion of the film is then irradiated, whereby photogenerated protons generated from the PAG attack the lipophilic ligands, which are replaced by the anions from the solution. However, the anions form only a weak bond with the particle surface and, as a result, the irradiated portion of the film can be selectively washed away with an organic solvent.

Another method of patterning a film composed of inorganic particles in a sol-gel starts with a film comprising inorganic molecular precursors. The film is exposed to a solution that includes PAG cations and anions. A portion of the film is irradiated, whereby photogenerated protons generated from the PAG accelerate the hydrolysis process and cause polymerization of precursor molecules. However, the inorganic molecular precursors keep their original state in the unirradiated portion and, as a result, can be selectively washed away with an organic solvent, as described herein. The inorganic particles can be, for example, metal oxide nanocrystals such as $Al_2O_3$, $ZrO_2$, ZnO, $SiO_2$, and/or InGaZnO nanocrystals; and the molecular precursors for each of these can be, for example, aluminum-tri-sec-butoxide $(Al(OC_4H_9)_3)$; zirconium acetylacetonate $(Zr(acac)_2)$; zinc acetate $(Zn(OAc)_2)$; tetraethoxysilane (TOES); or a mixture of indium nitrate $(In(NO_3)_3)$, gallium nitrate $(Ga(NO_3)_3)$, and zinc acetate $(Zn(OAc)_2)$, respectively.

The patterned films can be incorporated as electrically conducting materials, semiconducting materials, magnetic materials, dielectric materials, catalytic materials, and/or light up-converting materials in a variety of devices, including transistors, light-emitting diodes, photovoltaic cells, thermoelectric devices, capacitors, and photodetectors. These devices will generally include the additional components common to such devices, including, for example, an anode and a cathode in electrical communication with the films.

EXAMPLES

Example 1

This example illustrates a method of Direct Optical Lithography of Functional Inorganic Nanomaterials (DOLFIN).

This method combines multiple benefits of traditional photolithography and is tailored toward efficient patterning of inorganic nanomaterials and sol-gel chemicals without diluting or contaminating them with organic photoresists and other byproducts. The method is versatile, since almost any inorganic functional material can be prepared in the form of NCs using a variety of available solution- and gas-phase techniques. The inorganic ligand molecules are constructed as ion pairs, $Cat^+X^-$, where $X^-$ is an electron-rich nucleophilic group that binds to the electron-deficient (Lewis acidic) surface sites, typically metal ions. The negative charge on the $X^-$ is balanced by a cation, $Cat^+$, as shown in FIG. 1A. In polar solvents, cations dissociate from the surface and form an ionic cloud responsible for colloidal stabilization, while in nonpolar environments or in films the ion pairs stay tightly bound. To implement DOLFIN, photochemically active $X^-$ and $Cat^+$ groups have been designed to enable direct optical patterning of all-inorganic NCs.

Figure 1B:
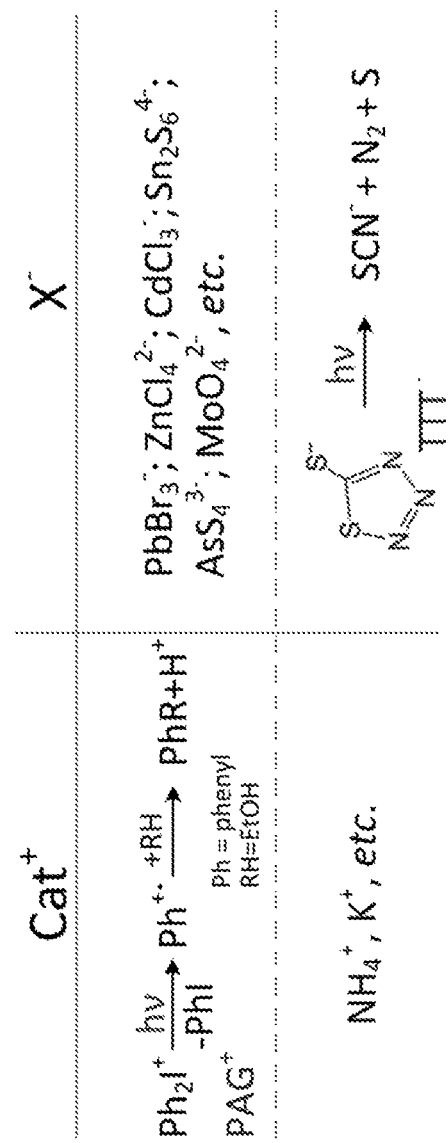
Figure 1C:
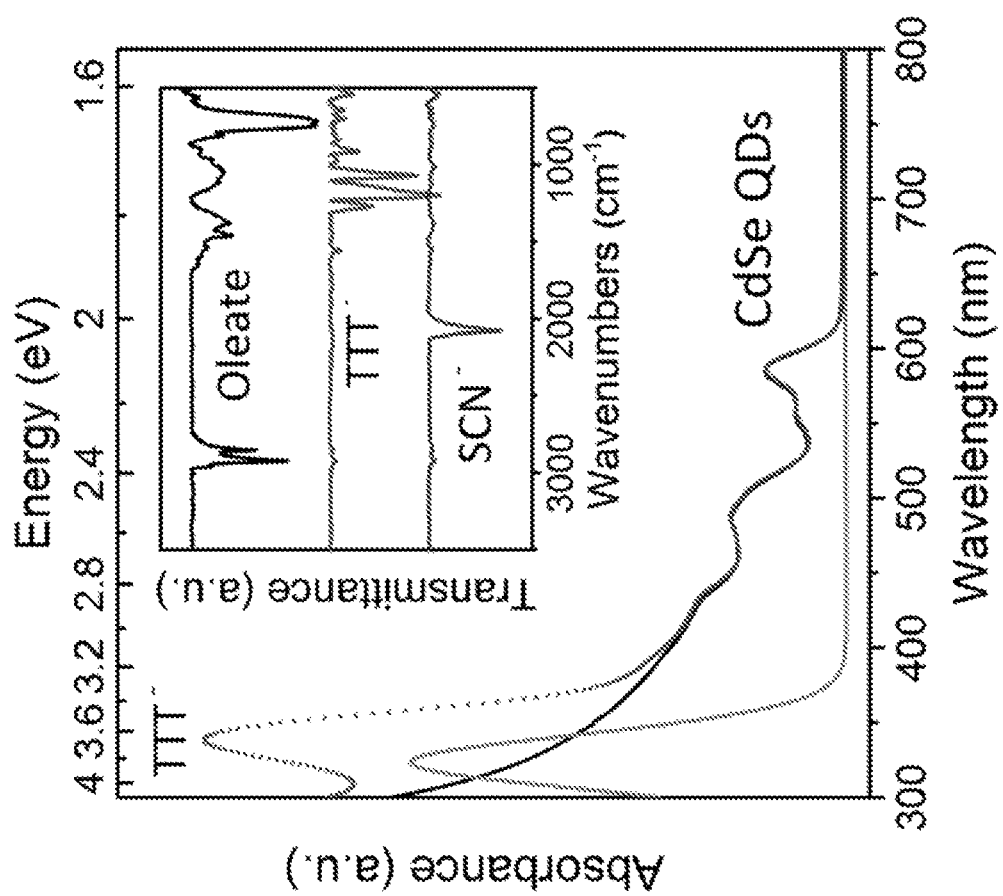

In one experiment, diphenyliodonium ($Ph_2I^+$) or triphenylsulfonium ($Ph_3S^+$) cations, also known as photoacid generators (PAGs), were combined with surface binding inorganic anions, such as $Sn_2S_6^{4-}$, $CdCl_3^-$, or $MoO_4^{2-}$ (FIG. 1B). Such ligands provide colloidal stability to metals, semiconductors, and many other types of NCs. Upon photon absorption, the PAG molecules decomposed, releasing acidic protons, as shown in FIG. 1B. These protons can react with the $X^-$ group or with the NC surface in several different ways that alter NC solubility in polar and nonpolar solvents, as discussed herein. In another experiment, the $X^-$ group itself was made photosensitive by using ammonium 1,2,3,4-thiatriazole-5-thiolate ($NH_4S_2CN_3$ or $NH_4TTT$). The $S_2CN_3^-$ group photochemically decomposed to surface-bound $SCN^-$ ions, $N_2$, and sulfur, as shown in FIGS. 1B and 1C. The ligands with $PAG^+$ or $TTT^-$ fragments nicely complemented each other: PAG-based ligands are extremely flexible and versatile, while TTT ligands can be used with pH-sensitive materials.

Figure 1D:
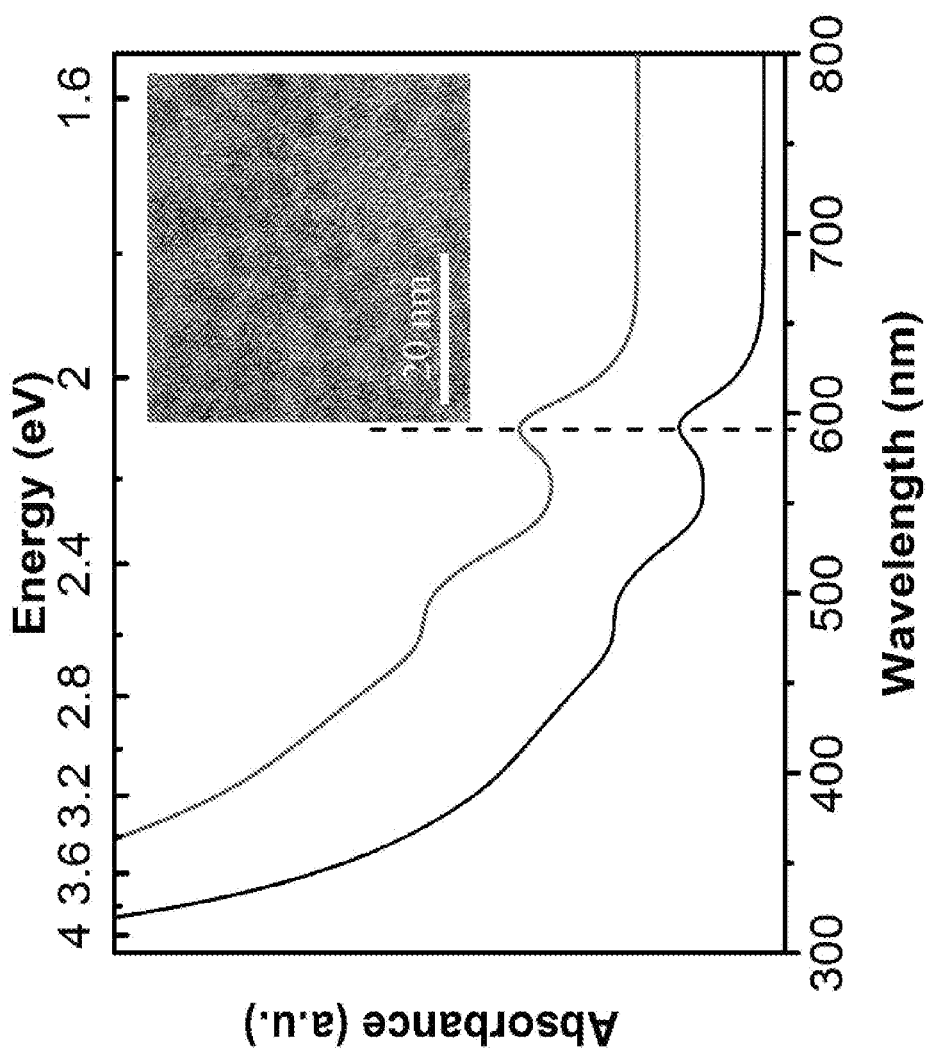
Figure 11:
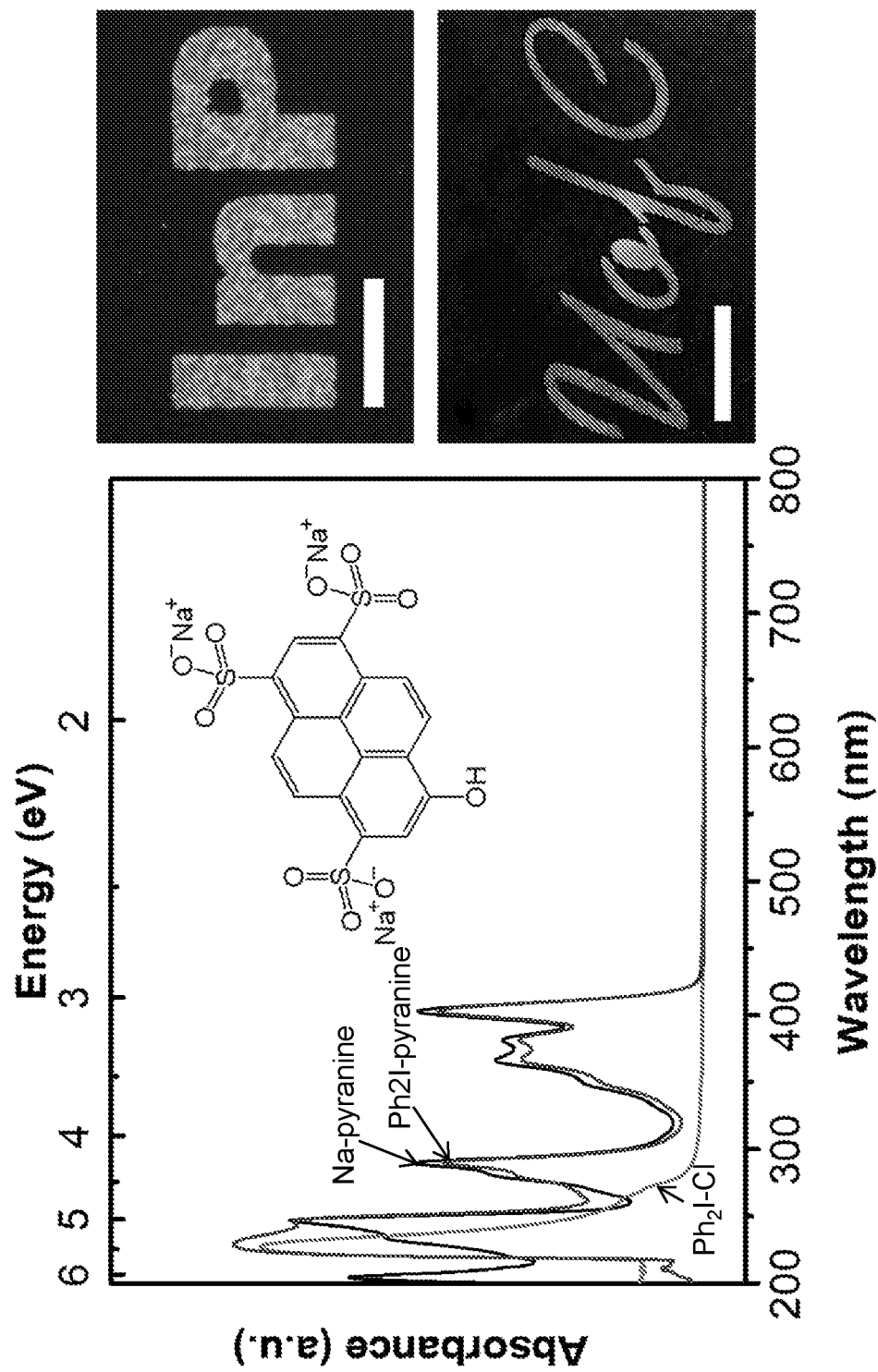
FIG. 11 depicts absorption spectra of Na-pyranine, Ph$_2$I—Cl, and Ph$_2$I-pyranine in MeOH (left panel); images of patterned InP (top right) and CdSe—In$_2$Se$_4$ (bottom right) using a Ph$_2$I-pyranine PAG. Scale bars are 100 μm (top) and 5 mm (bottom).
Figures 12E, 12F:
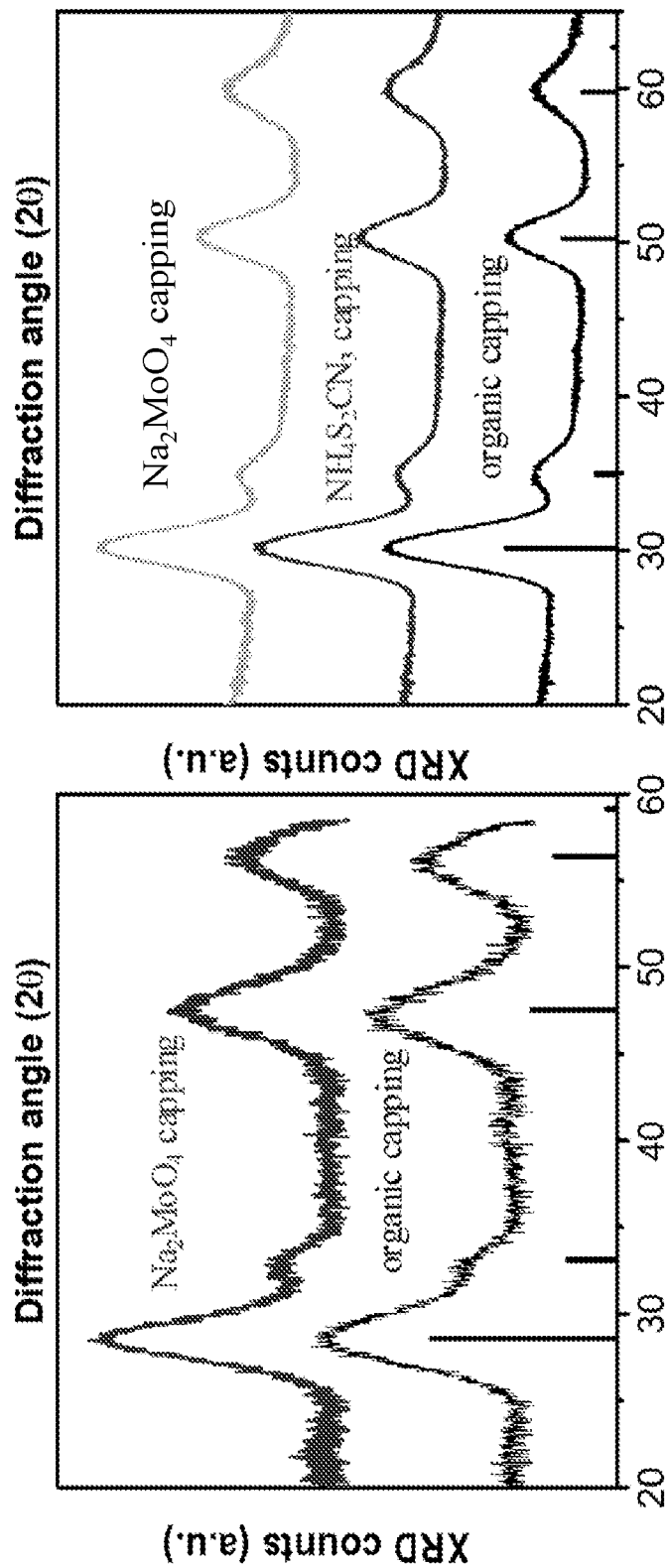
Figures 12G, 12H:
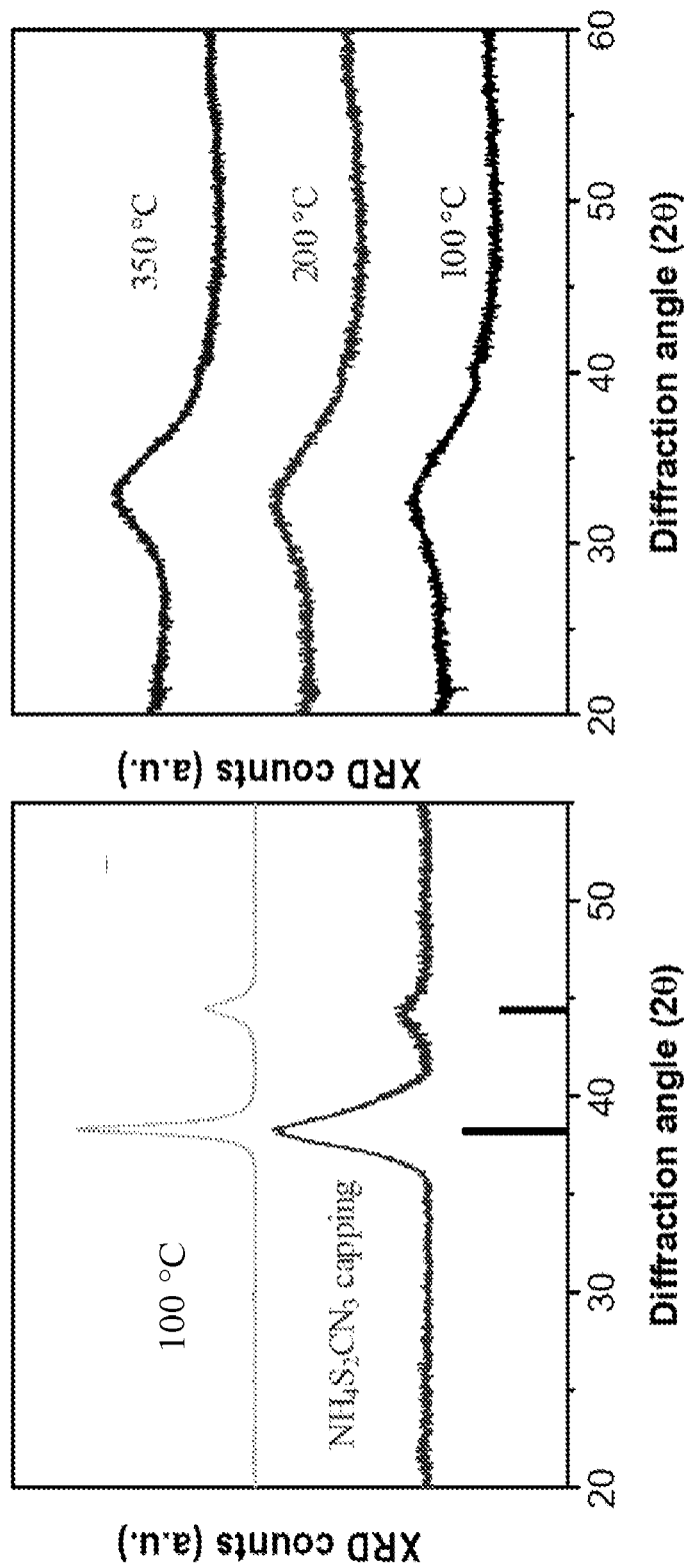

The photoactive anionic or cationic ligand components showed strong UV absorption bands that can appear on top of the absorption spectra of corresponding NCs, as in the case of CdSe QDs with TTT ligands (FIG. 1C) or CdSe QDs with $Sn_2Sn_6^{4-}$ ligands (FIG. 1D). These ligands provided excellent colloidal stability in dimethylformamide (DMF), dimethylsulfoxide (DMSO) and other conventional solvents. However, irradiation with UV light ($\lambda$<360 nm) triggered decomposition of TTT ligands, making the NCs insoluble in DMF. The photochemical transformation of $TTT^-$ to $SCN^-$ could be traced using the characteristic IR absorption features of the $TTT^-$ and $SCN^-$ groups shown in FIG. 1C, inset, and FIGS. 9A, 9B, 9C and 9D. Various patterns could be generated by illuminating NC films through a mask and then washing off the unexposed NCs with DMF. A clear loss of colloidal stability was observed after exposing the NC films to 254 nm, 6.3 mW/cm² light for 20 s, which corresponds to an exposure dose of 120 mJ cm$^{-2}$. For reference, conventional organic photoresists (e.g., Shipley S1800 series, Dow Chemicals) require a comparable 80-150 mJ cm$^{-2}$ exposure dose. (See, e.g., Y. Sun et al., Photolithographic Route to the Fabrication of Micro/Nanowires of III-V Semiconductors. *Adv. Funct. Mater.* 15, 30 (2005).) Similarly, NCs with PAG-based ligands were patterned using a 40-70 mJ cm$^{-2}$ exposure dose (FIGS. 10A-10F). Moreover, PAGs could be engineered to operate in different spectral regions, ranging from the deep UV to the visible (FIG. 11). The decomposition of surface ligands did not cause changes in the size or shape of NCs, as demonstrated by the unaltered absorption spectra (FIG. 1C) and X-ray diffraction patterns (FIGS. 12A-12H). After the first layer was patterned, the process was repeated to create multilayer patterns, e.g., patterns of red- (R), green- (G), and blue-emitting (B) QDs. Complex patterns, composed of ~0.8 million RGB subpixels, were also generated in three DOLFIN steps by parallel patterning of many elements.

Both the PAG and TTT ligands could be applied to a broad range of materials and substrates. FIGS. 2A-2C and FIGS. 10A-10O show different patterns of NCs capped with $NH_4TTT$ and $PAG^+X^-$ photoactive ligands. DOLFIN worked well for NCs of metals, oxides, semiconductors, magnetic, and light upconverting (e.g., $NaYF_4$:Yb, Er@CaF$_2$) materials, as illustrated elsewhere herein. $PAG^+X^-$ could be also used as an additive to sol-gel precursors, as illustrated elsewhere herein. For example, by adding of 5%, by weight, (4-methylthiophenyl)methyl phenyl sulfonium triflate (p-$CH_3S$—$C_6H_4$—)($C_6H_5$—)$_2S^+OTf^-$) to a mixture of $In(NO_3)_3$, $Ga(NO_3)_3$, and $Zn(CH_3COO)_2$ in 2-methoxyethanol, indium-gallium-zinc-oxide (IGZO) layers were patterned for transparent transistors.

In the above experiments, positive patterns were patterned by making the areas exposed to light insoluble and removing materials from the unexposed regions with a developer solution (e.g., DMF). The negative patterns could be created by using NCs capped with lyophilic ligands, such as oleate and oleylamine, mixed with (p-$CH_3S$—$C_6H_4$—)($C_6H_5$—)$_2S^+OTf^-$ (OTf=triflate) PAG, as illustrated elsewhere herein. After UV exposure, photogenerated protons efficiently attacked lyophilic ligands and replaced them with $OTf^-$ groups. As a very weak nucleophile, triflate formed an ion pair rather than a covalent bond with metal sites at the NC surface. As a result, exposed areas became soluble in polar solvents and could be washed away with N-methylformamide (NMF) to form a negative pattern (FIG. 2C). The unexposed NCs retained their lyophilic surface coats and did not dissolve in NMF. At the same time, the high solubility of PAG in NMF allowed the washing of any unreacted PAG from unexposed areas. The patterned layers of organically coated NCs showed bright luminescence and could be subjected to various on-film ligand exchange procedures to optimize charge transport and other properties.

Figures 3B, 3C:
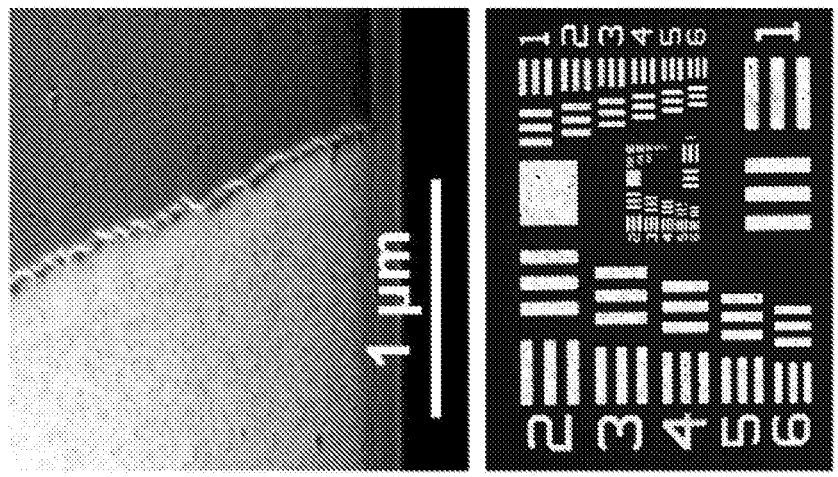
FIGS. 3A-3G show typical pattern characteristics.
Figure 3A:
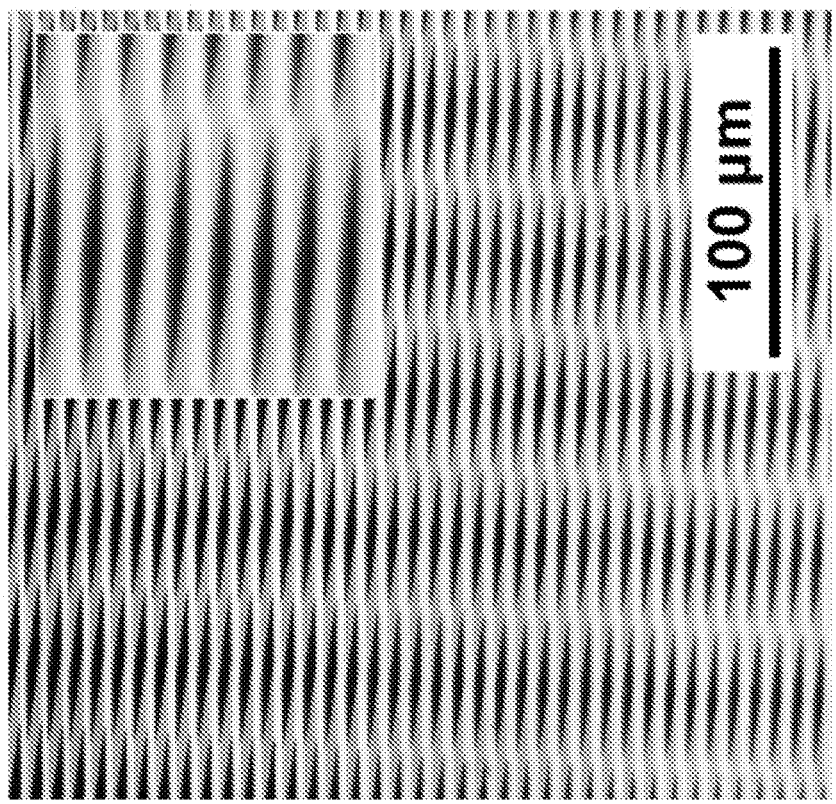
Figure 3D:
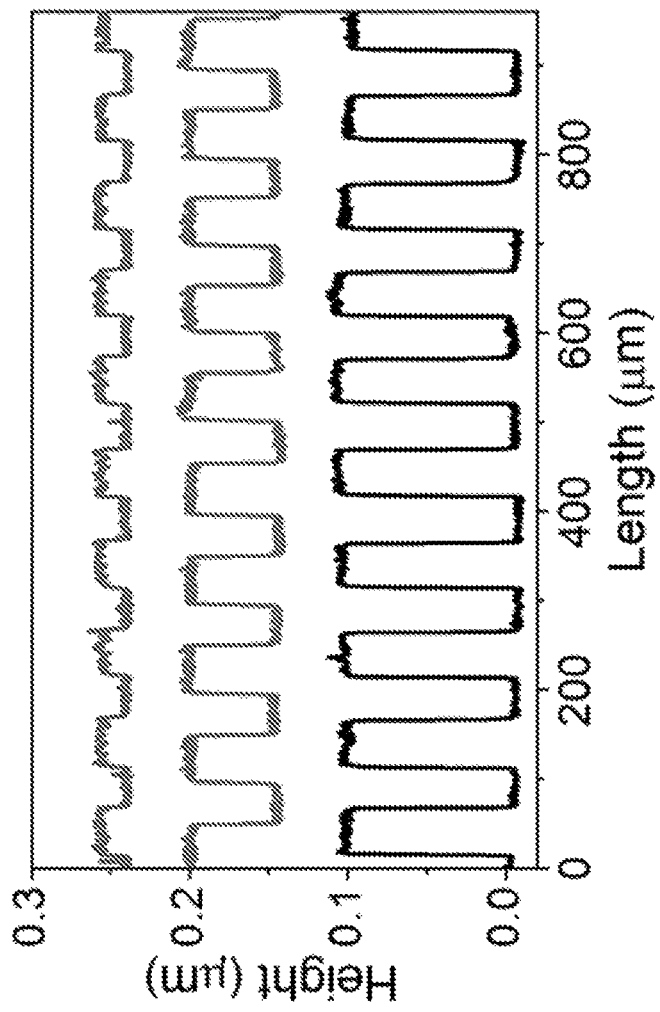
Figure 3E:
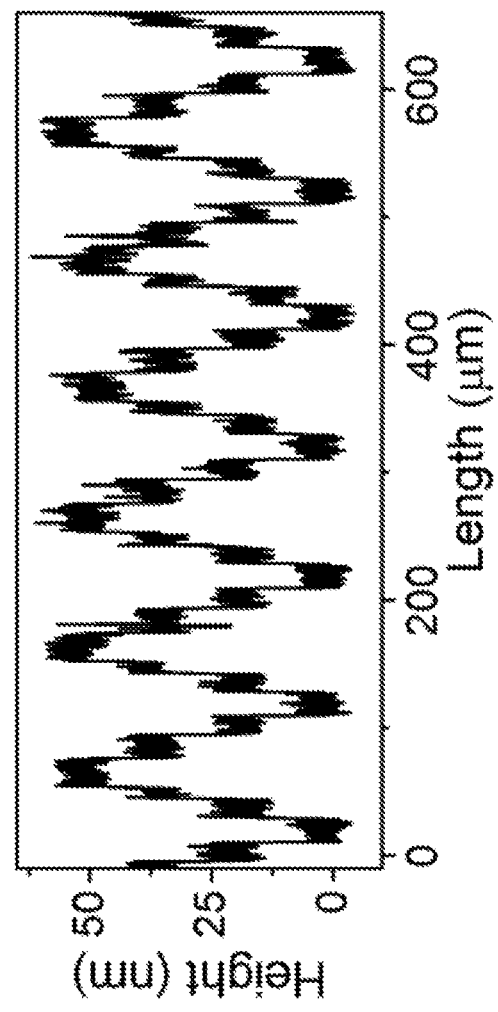
Figure 3G:
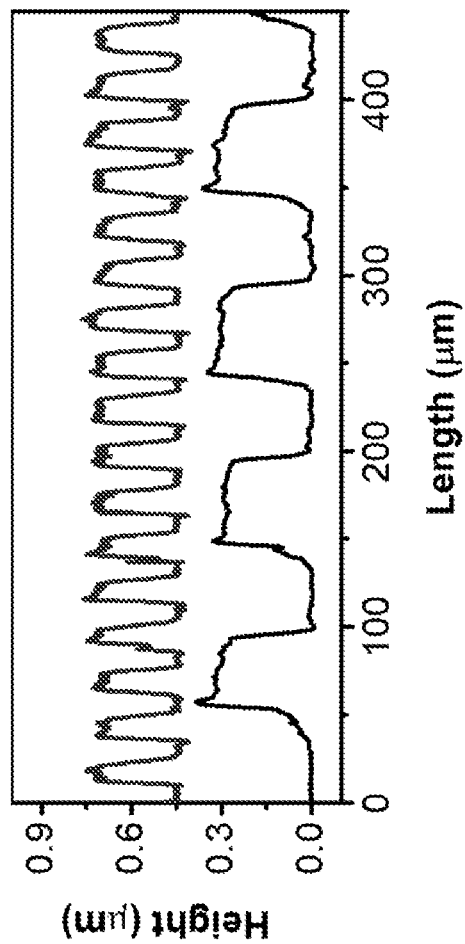
Figure 3F:
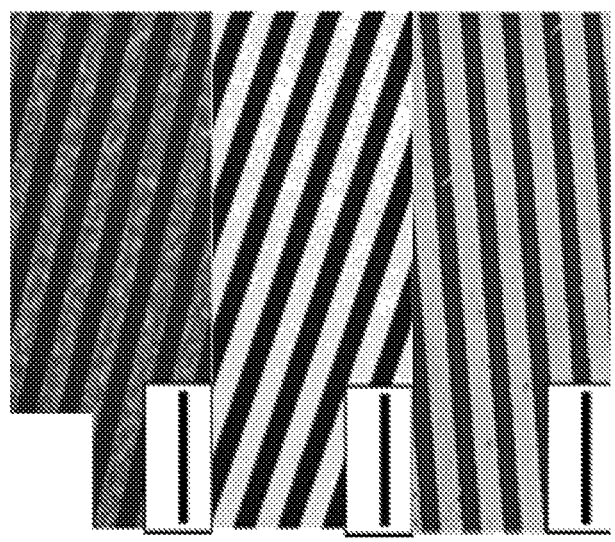
Figure 13:
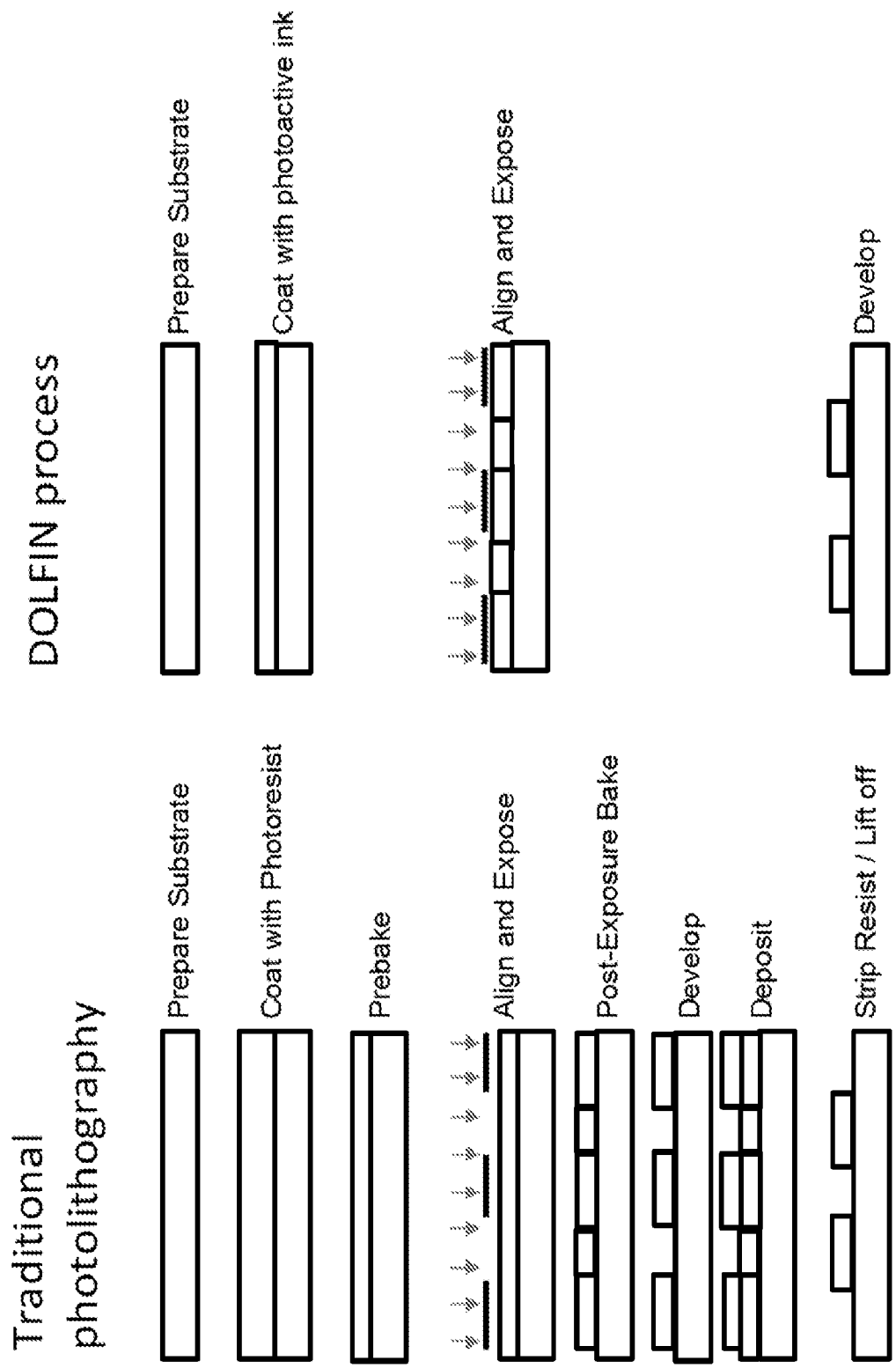
FIG. 13 shows a comparison of a typical sequence of lithographic processing steps for a positive resist, adapted from C. A. Mack, Fundamental Principles of Optical Lithography (Wiley, 2007); and the processing steps for the positive tone Direct Optical Lithography for Inorganic Nanomaterials (DOLFIN). In the case of patterning multilayered patterns, substrate preparation applies only to the first patterned layer.
Figures 14A, 14B:
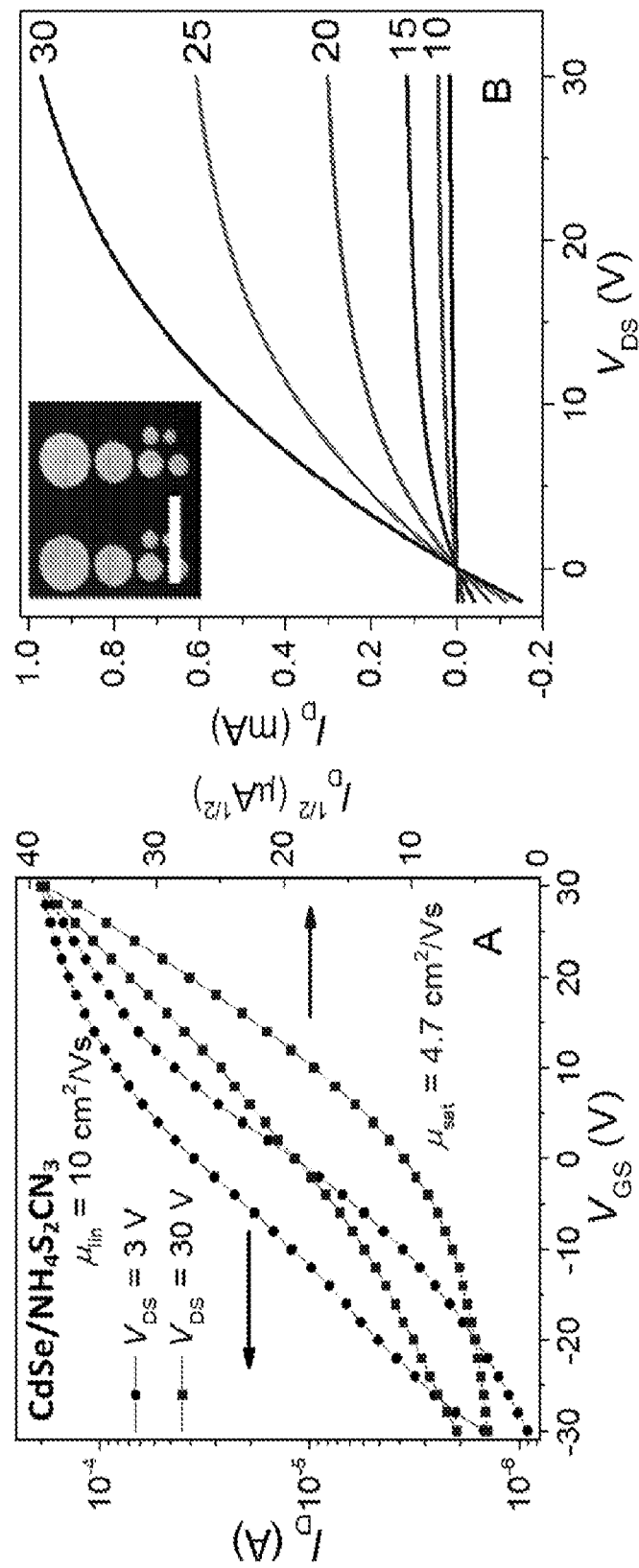
FIG. 14A depicts transfer characteristics of an FET made of photopatterned and partially sintered CdSe/NH$_4$S$_2$CN$_3$ NCs.
FIG. 14B shows output characteristics of the FET of photopatterned and partially sintered CdSe/NH$_4$S$_2$CN$_3$ NCs. Inset: An example of patterns from CdSe/NH$_4$TTT. Scale bar: 200 μm.
Figure 14D:
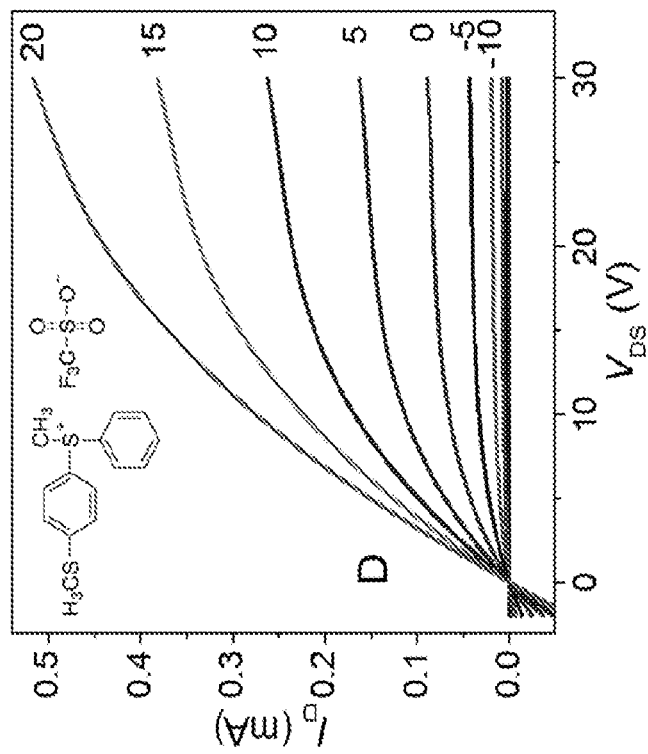
FIG. 14D depicts output characteristics of the FET of CdSe/NH$_4$CdCl$_3$ NCs photopatterned with the PAG formula which is shown in the inset.
Figure 14C:
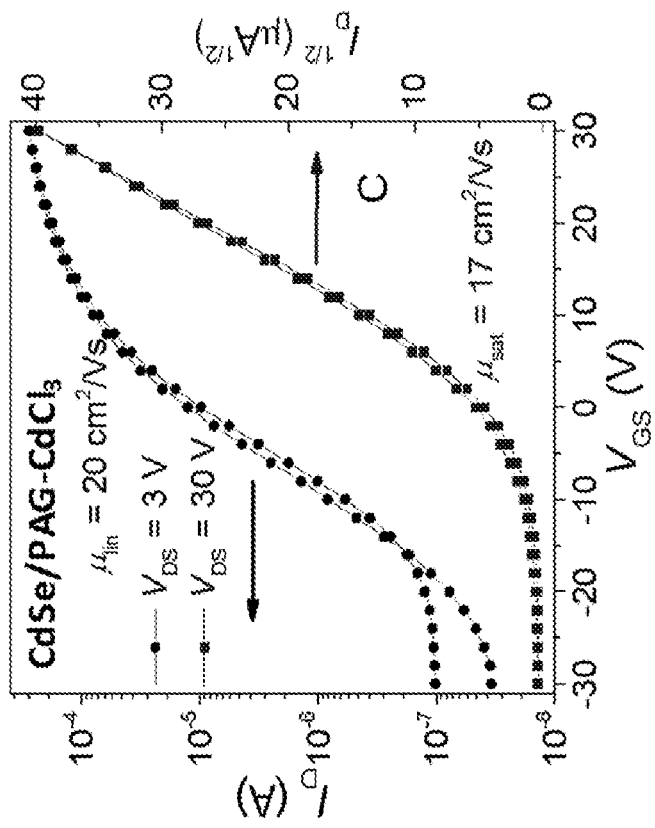
FIG. 14C depicts transfer characteristics of the FET of CdSe/NH$_4$CdCl$_3$ NCs photopatterned with the PAG formula which is shown in the inset.
Figures 14E, 14F:
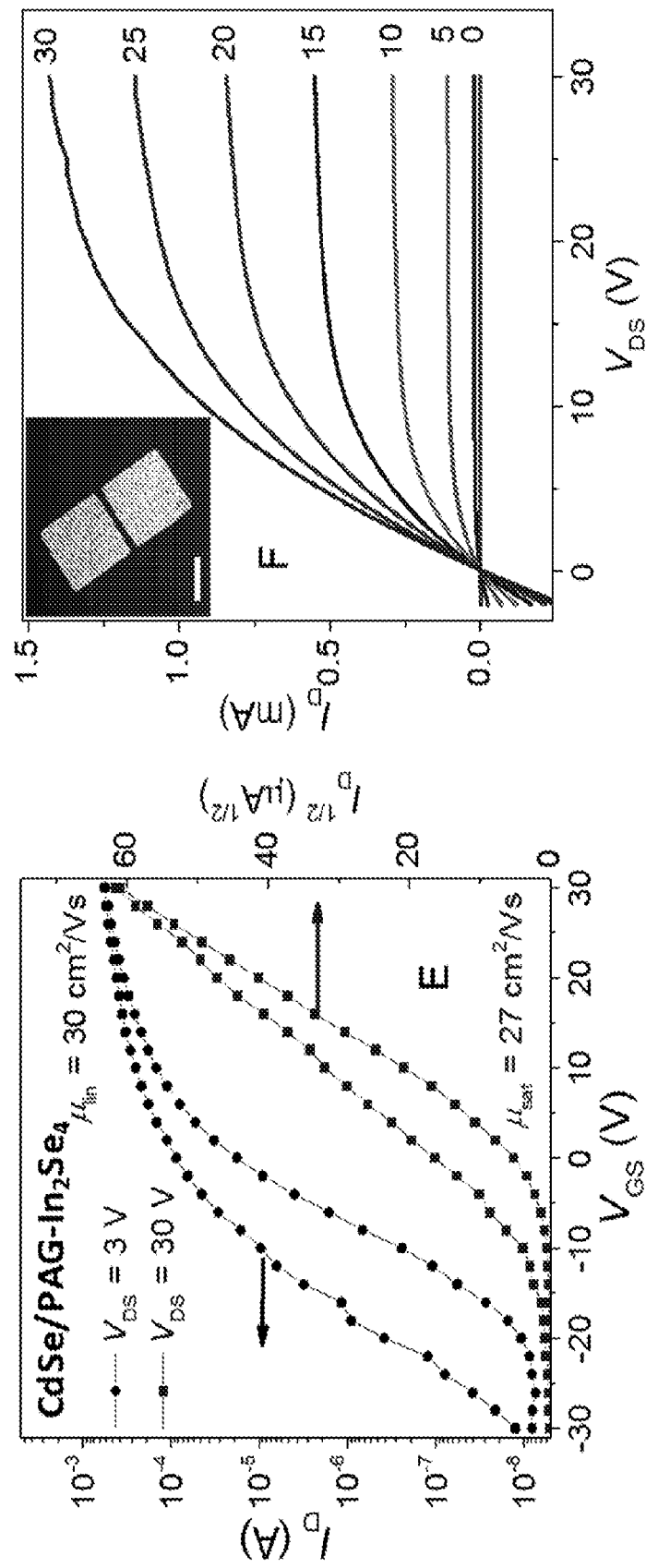
FIG. 14E depicts transfer characteristics of FET of photopatterned and partially sintered CdSe NCs with In$_2$Se$_4{}^{2-}$ surface-binding groups and (4-methylthiophenyl)(methyl)(phenyl)sulfonium triflate PAG.
FIG. 14F shows output characteristics of the FET of photopatterned and partially sintered CdSe NCs with In$_2$Se$_4{}^{2-}$ surface-binding groups and (4-methylthiophenyl)(methyl) (phenyl)sulfonium triflate PAG. Inset: An example of a pattern from CdSe/(N$_2$H$_5$)$_2$In$_2$Se$_4$. Scale bar: 200 μm.
Figure 15A:
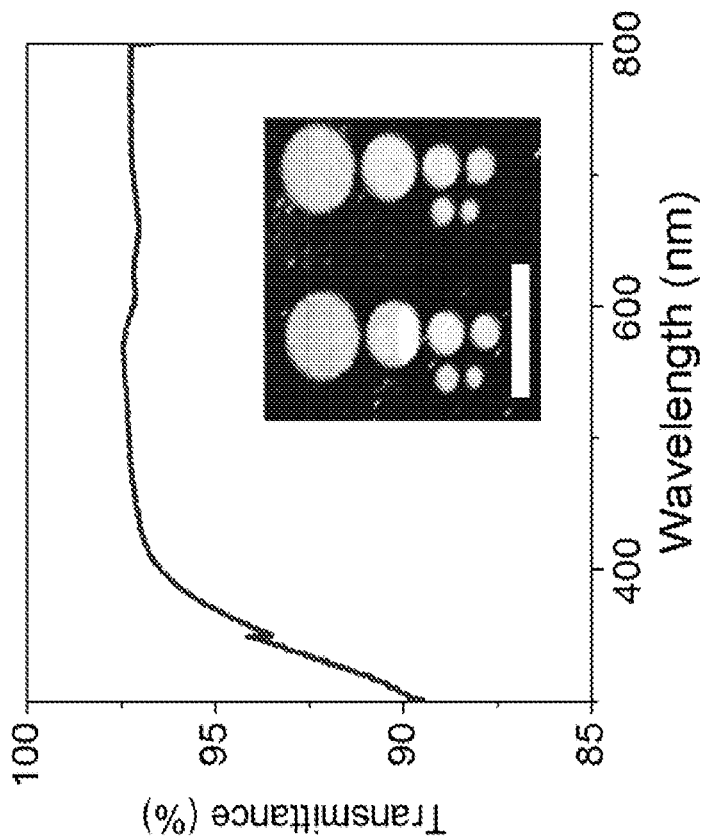
FIG. 15A depicts transfer characteristic of an FET made of near-optimally doped photopatterned IGZO film, which is the same as the one shown in FIGS. 4E and 4F.
Figure 15B:
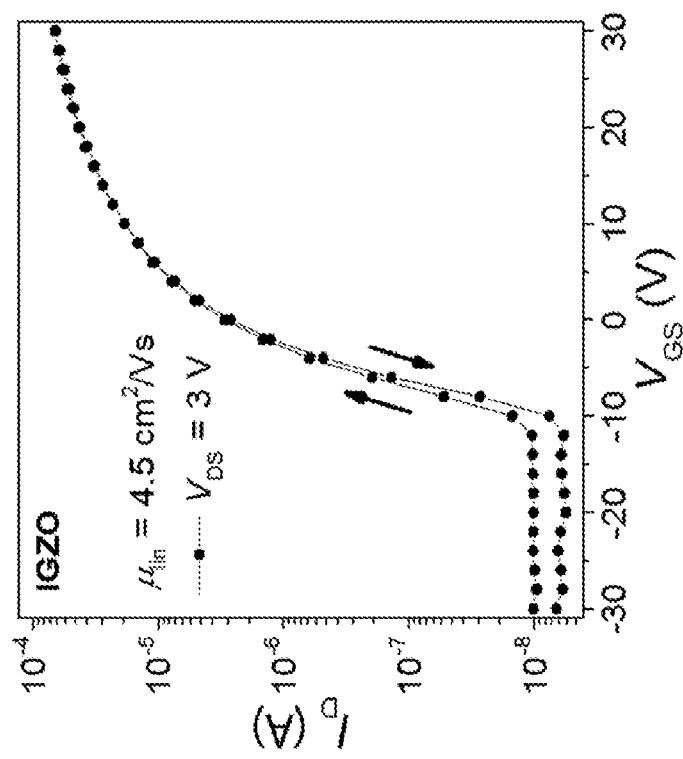
FIG. 15B shows an optical transmission spectrum of spin-coated IGZO film. Inset: An example of photopatterned IGZO film. Scale bar: 200 μm.
Figure 15D:
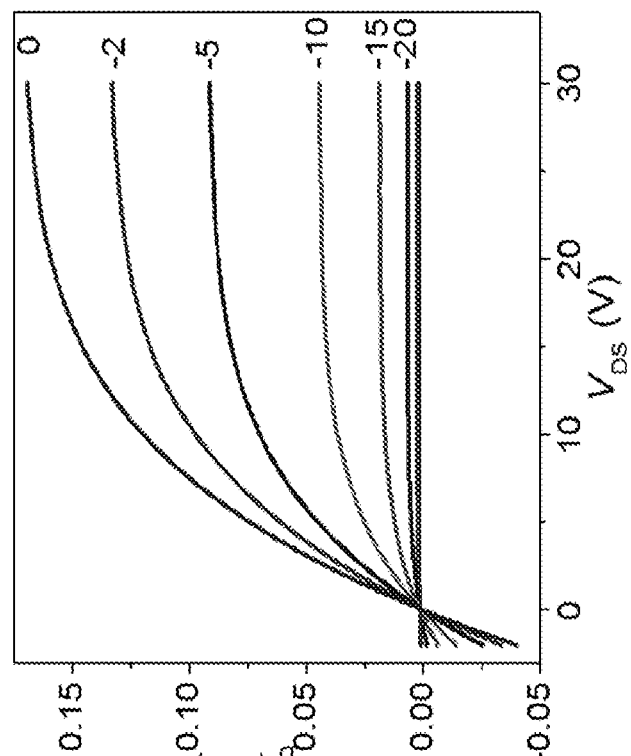
FIG. 15D shows output characteristics of FET made of photopatterned, slightly over-doped IGZO film. An IGZO sol-gel precursor was dissolved in 2-Me, and mixed with PAG (10% wt %, EtOH). After patterning, the film was annealed at 350° C. before measurement. The channel width and length are 180 μm and 30 μm, respectively.
Figure 15C:
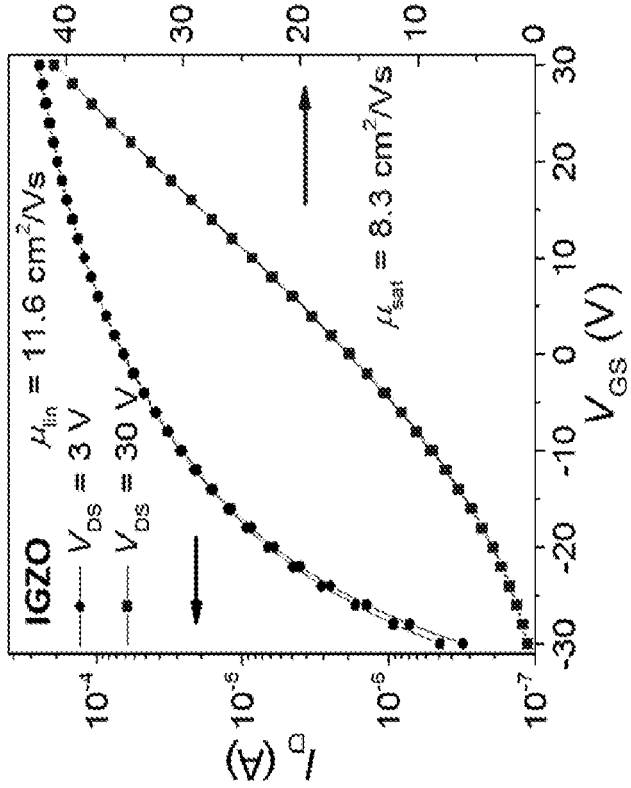
FIG. 15C depicts transfer characteristics of FET made of photopatterned, slightly over-doped IGZO film.

Even with little effort dedicated to optimizing each process condition, the quality of the patterns was comparable to that achieved with commercial photopolymer resists. FIG. 3A demonstrates good fidelity for the patterns of 10-μm-wide CdSe stripes consecutively patterned on top of each other using $NH_4TTT$ ligands. The edges of patterned regions were sharp and clean, as shown in FIG. 3B. The resolution, estimated using a 1951 USAF target, was limited by the one-micron mask resolution (FIG. 3C). The thicknesses of patterned layers were determined by the penetration of UV light into a material. For II-VI and III-V semiconductors, linear absorption coefficients in the UV region level off at ~$10^6$ cm$^{-1}$. (See, e.g., *Numerical Data and Functional Relationships in Science and Technology, Landolt-Börnstein* (Springer, New York, 1982).) In agreement with this estimate, CdTe NC layers could be efficiently patterned with thicknesses between ~10 and 100 nm (FIG. 3D and FIG. 3F). Thicker layers could be patterned for materials with low UV absorbance, such as $Al_2O_3$ and other oxides (FIG. 3G). Multiple layers of the same or different materials could be photopatterned sequentially with three processing steps per layer: ink coating, exposure, and development. Such layer-by-layer patterning permits designing 3D inorganic layers with ~10 nm accuracy along the vertical direction (FIG. 3E). For comparison, layer-by-layer patterning using traditional organic photoresists is much less practical for building 3D materials due to the large number of processing steps—typically seven—for patterning each layer (FIG. 13).

Figure 4A:
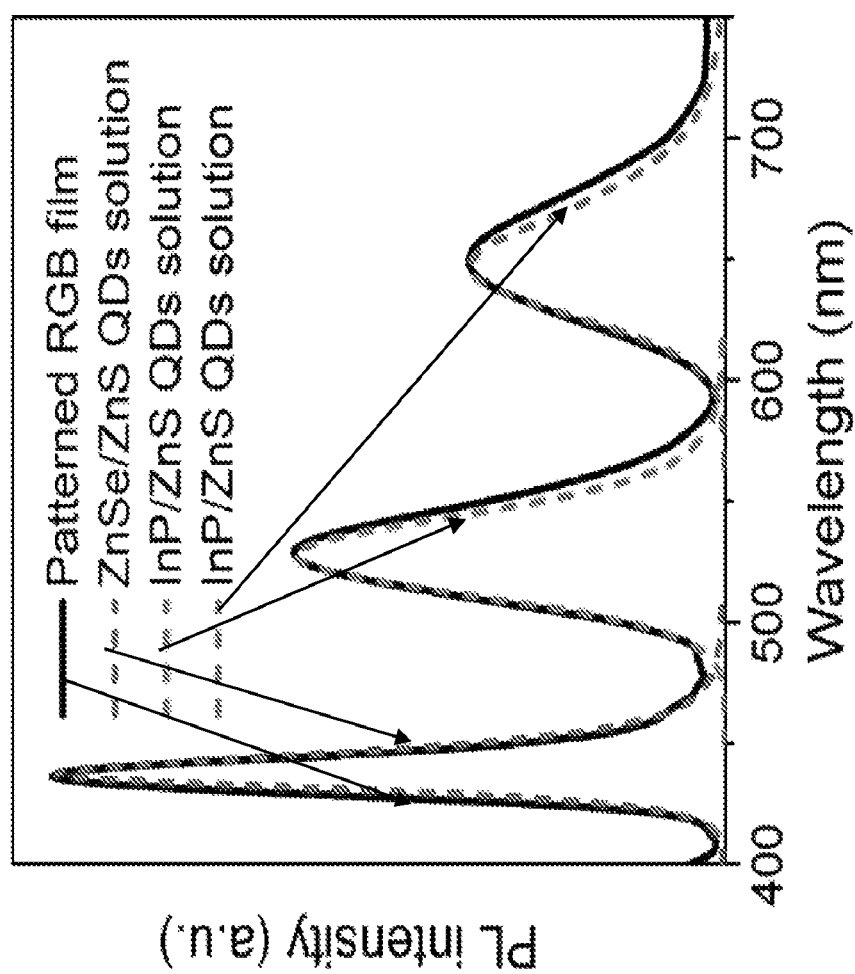
FIGS. 4A-4F depict properties of directly optically patterned semiconductors, metals, and dielectrics.
Figure 5:
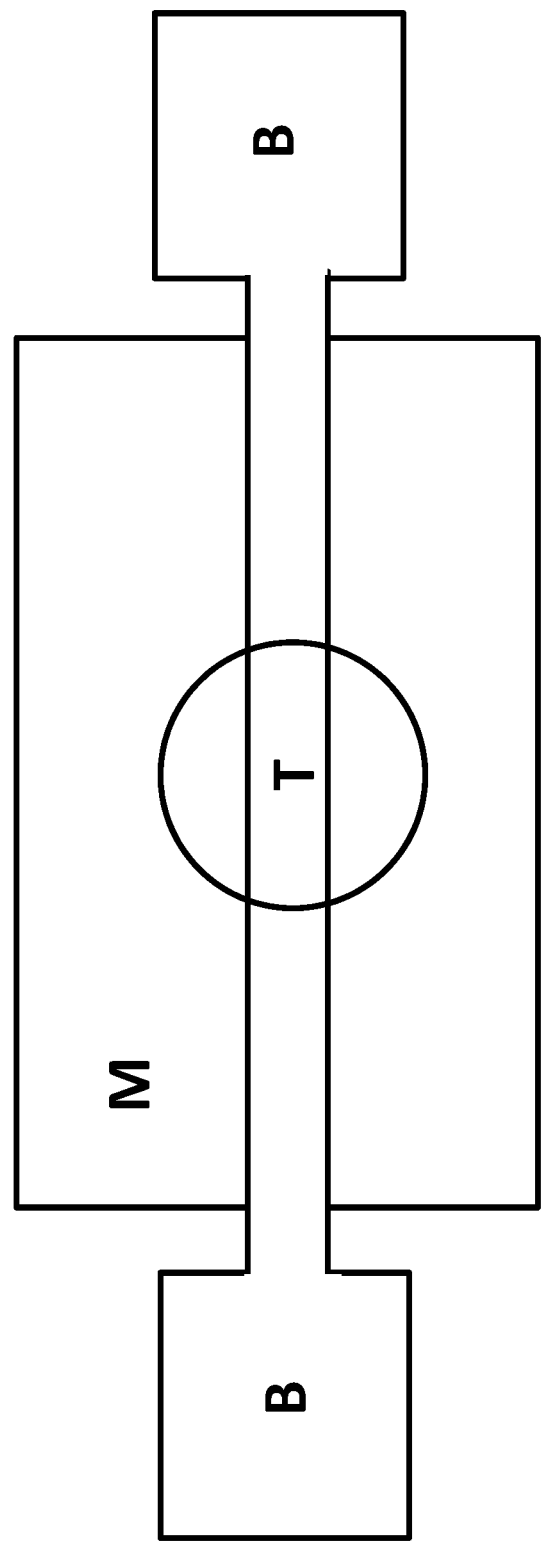
FIG. 5 depicts the set-up used to measure the resistivity of photo-patterned alumina layers. (B) indicates the bottom aluminum electrode, (M) indicates the middle layer of alumina, and (T) indicates the top aluminum electrode.

To evaluate the practical utility of DOLFIN, the properties of several representative metals, dielectrics, and semiconductors patterned using photosensitive inorganic ligands were characterized. FIG. 4A shows an emission spectrum from red-, green-, and blue-emitting core-shell QDs patterned as an array of square "pixels" shown in FIG. 1E. The spectrum shows sharp peaks of band-edge emission from the original QDs without apparent signs of core etching or trap emission. This indicates that it is straightforward to use DOLFIN for patterning QD emitters in color filters and pixels of LCD and LED displays. Gold NCs were patterned using photoactive NH$_4$TTT ligands and then annealed at 150° C. for 20 min. The resistivity ($\rho$) of a 60-nm-thick film measured by the van der Pauw method was $5.2\times10^{-8}$ $\Omega$m at 300 K (FIG. 5). This value shows that the approach described herein is suitable for direct patterning of metallic electrodes and interconnects. SCN$^-$ ions, formed after UV-exposure of TTT$^-$ ligands, did not impede charge transport.

Figure 4B:
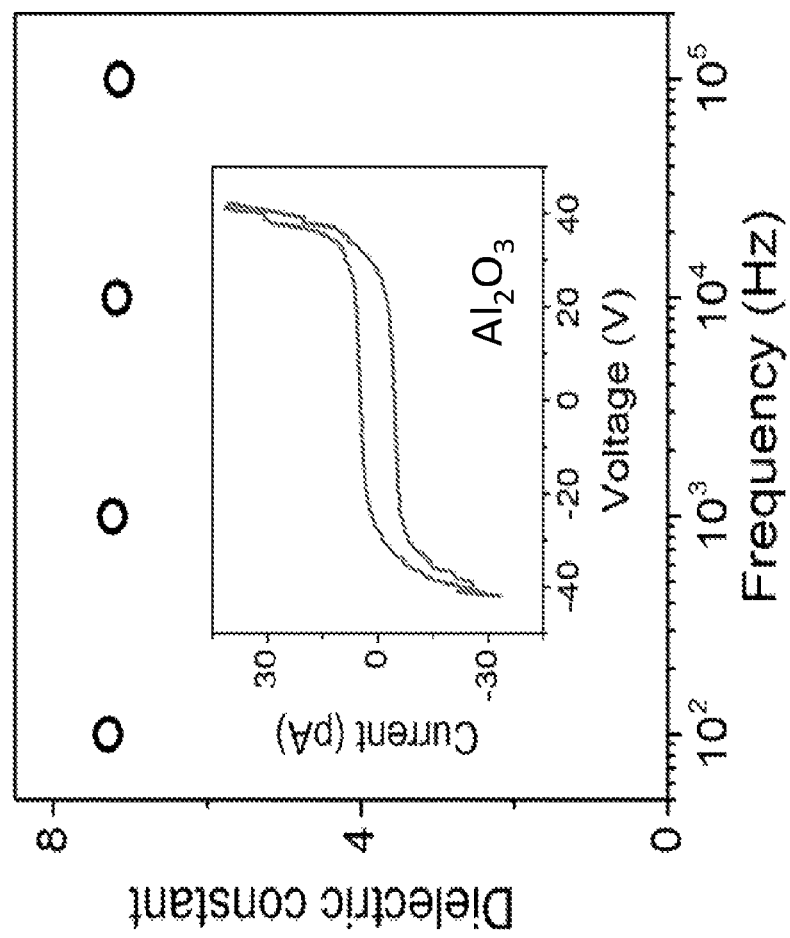

Oxide NCs were used for dielectric layers in electronic circuits and various coatings. The dielectric properties of Al$_2$O$_3$ NC layers patterned using NH$_4$TTT ligands were measured. In a flat capacitor configuration, a 125-nm-thick Al$_2$O$_3$ film showed a dielectric constant $\varepsilon=6.9\pm0.3$ across a $10^2$-$10^5$ Hz frequency range, with a low leakage current corresponding to $\rho>10^{14}$ $\Omega$cm (FIG. 4B, inset). These $\varepsilon$ values agreed with predictions from the Bruggeman effective medium theory for a film composed of nanoscale Al$_2$O$_3$ grains and were slightly lower than $\varepsilon$ for dense Al$_2$O$_3$ films deposited by atomic layer deposition (ALD, $\varepsilon=7.7\pm0.4$). (See, e.g., M. D. Groner, et al. Low-Temperature Al$_2$O$_3$ Atomic Layer Deposition. *Chem. Mater.* 16, 639-645 (2004).) The refractive index (n) of patterned Al$_2$O$_3$ films, measured with ellipsometry at 632.8 nm, was 1.40 and could be compared to n=1.5-1.6 for ALD grown dense Al$_2$O$_3$ films. Higher n values were observed for ZrO$_2$, ZnO, and CeO$_2$ NC layers (n=1.62, 1.67, and 1.82, respectively) patterned using PAG ligands, as described elsewhere herein. Very similar refractive indices were measured for NC films prepared without photoactive ligands.

Figures 4C, 4D:
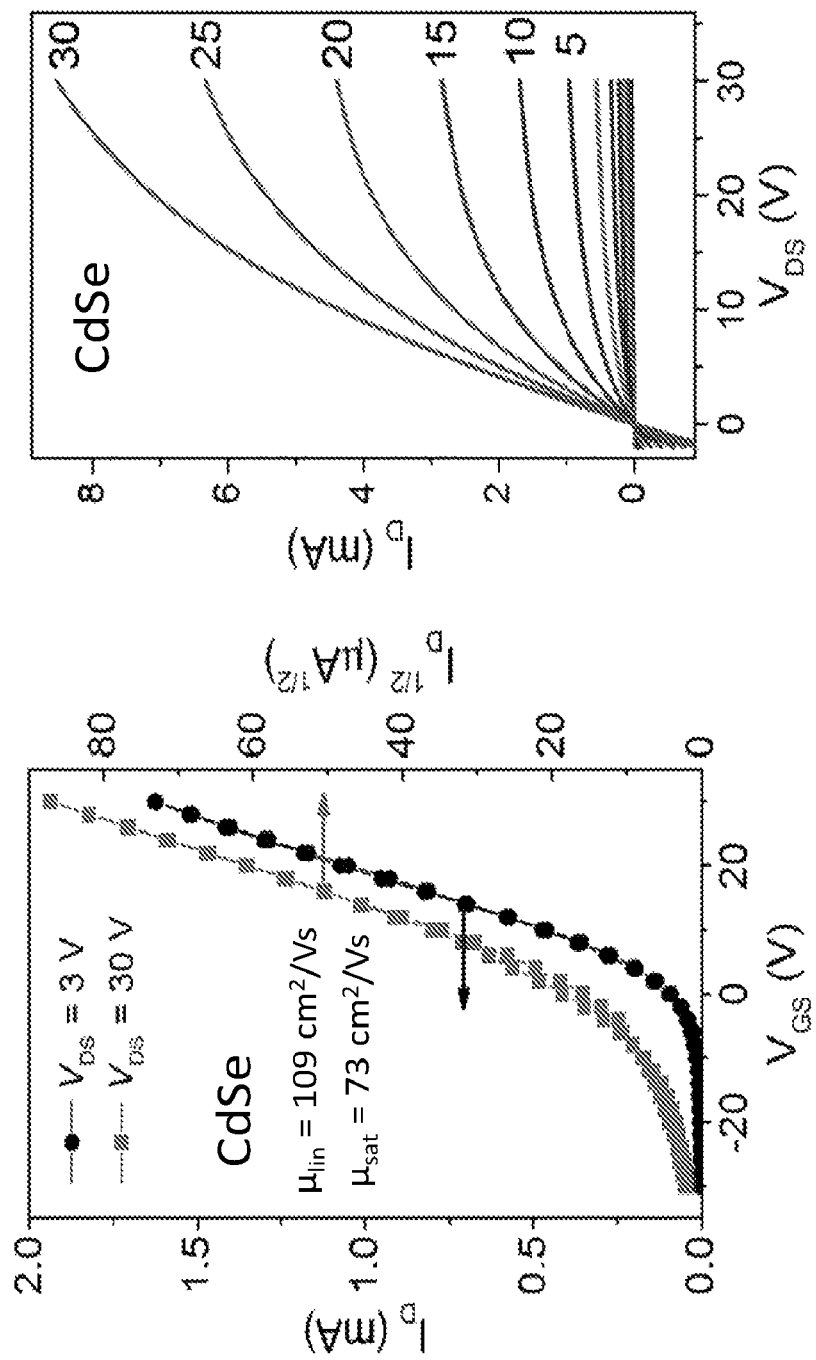
Figures 4E, 4F:
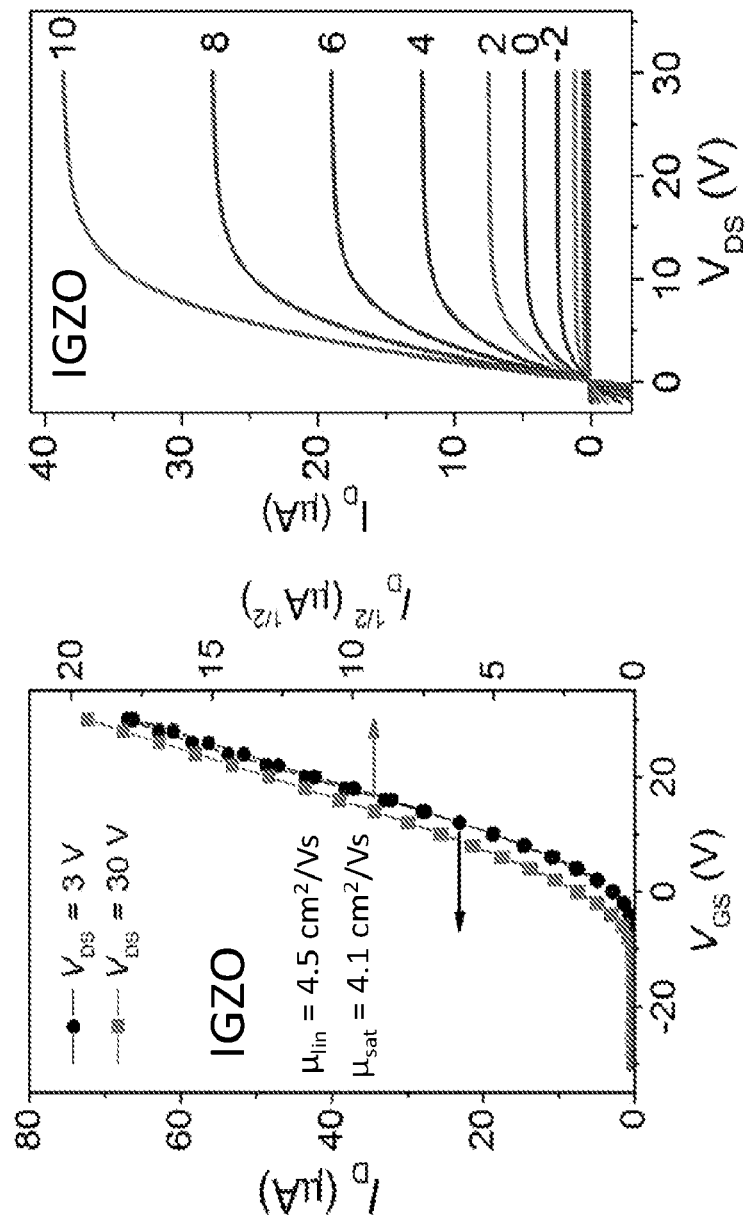

To assess the quality of semiconductor layers patterned by DOLFIN, prototype FETs were made, as described below. Their transfer and output characteristics are shown in FIGS. 4C-4F, FIGS. 14A-14F, and FIGS. 15A-15D. Both TTT and PAG-based photosensitive ligands demonstrated good FET performance. For example, a 30-nm-thick film of CdSe NCs photopatterned with (Ph$_2$I)$_2$CdCl$_4$ ligands showed electron mobility ($\mu_e$) of 20 cm$^2$/V s. CdSe NCs with compositionally matched Cd$_2$Se$_3^{2-}$ semiconductor solders, patterned using (p-CH$_3$S—C$_6$H$_4$—)(C$_6$H$_5$—)$_2$S$^+$OTf$^-$ PAG, enabled FETs with $\mu_e>100$ cm$^2$/V s (FIGS. 4C and 4D). (See, e.g., D. S. Dolzhnikov et al., Composition-matched molecular "solders" for semiconductors. *Science* 347, 425-428 (2015).) Transparent IGZO films, patterned using the same PAG, demonstrated robust FETs with $\mu_e=4$-10 cm$^2$/V s, current modulation>$10^4$, and negligible hysteresis (FIGS. 4E and 4F, and FIGS. 15A-15D).

This example shows that TTT$^-$ and PAG-based ligands enabled direct optical patterning of numerous inorganic materials with resolution comparable to that of traditional photolithography without compromising the electronic and optical characteristics of patterned materials. This approach enables broad technological adoption of solution-processed metals, dielectrics, and semiconductors. Its compatibility with a broad range of substrates, including silicon, glass, and polymers, provides an avenue for the manufacture of various hybrid devices. DOLFIN is also applicable for 3D stereolithography of inorganic materials.

Materials and Methods

Chemicals

Cadmium oxide (CdO, 99.5%, Aldrich), cadmium chloride (CdCl$_2$, 99.99%, Aldrich), oleic acid (OA, 90%, Aldrich), selenium powder (Se, 100 mesh, 99.99% metal basis, Aldrich), trioctylphosphine oxide (TOPO, 90%, Aldrich), 1-octadecene (ODE, 90%, Aldrich), oleylamine (OAm, 70%, Aldrich), tellurium shot (Te, 99.999%, Aldrich), tributylphosphine (TBP, 97% with isomers, Aldrich), indium (III) chloride (InCl$_3$, anhydrous, 99.999%, Aldrich), tris(trimethylsilyl)phosphine ((TMS)$_3$P, 98%, Strem), lead acetate trihydrate (Pb(OAc)$_2$ 3H$_2$O, 99.999%, Aldrich), bis(trimethylsilylmethyl) sulfide ((TMS)$_2$S, >98%, Aldrich), trioctylphosphine (TOP, 98%, Strem), gold(III) chloride hydrate (HAuCl$_4$.xH$_2$O, 99.999% trace metals basis, Aldrich), zirconium(IV) isopropoxide propanol complex (Zr[OCH(CH$_3$)$_2$]$_4$.(CH$_3$)$_2$CHOH, 99.9%, Aldrich), zirconium(IV) chloride (ZrCl$_4$, 99.9%, Aldrich), 1,2,3,4-tetrahydronaphthalene (>97%, Aldrich), borane tert-butylamine complex (TBAB, 97%, Aldrich), Te (99.999%, pellets, Aldrich), HgCl$_2$ (ACS reagent grade, >99.5%, Aldrich), selenourea (98%, Aldrich), aluminum oxide nanoparticles (Al$_2$O$_3$ NPs, 20 wt % in isopropanol, Aldrich), indium(III) nitrate hydrate (In(NO$_3$)$_3$ xH$_2$O, 99.99%, Aesar), gallium (III) nitrate hydrate (Ga(NO$_3$)$_3$ xH$_2$O, 99.9%, Aesar), zinc acetate dehydrate (Zn(OAc)$_2$ 2H$_2$O, 99.999%, Aldrich), sodium trifluoroacetate (CF$_3$COONa, 98%, Aldrich), Calcium carbonate (CaCO$_3$, BioXtra, ≥99.0%, Aldrich), Yttrium(III) carbonate hydrate (Y$_2$(CO$_3$)$_3$.xH$_2$O, 99.9% trace metals basis, Aldrich), Ytterbium(III) carbonate hydrate (Yb$_2$(CO$_3$)$_3$.xH$_2$O, 99.9%, Aesar), Erbium(III) carbonate hydrate (Er$_2$(CO$_3$)$_3$.xH$_2$O, 99.99%, Aesar), trifluoroacetic acid (ReagentPlus®, 99%, Aldrich), sodium azide (NaN$_3$, Aldrich), carbon disulfide (CS$_2$, >99%, Aldrich), ammonium hexafluorosilicate ((NH$_4$)$_2$SiF$_6$, 98%, Aldrich), diphenyliodonium chloride (DPI-Cl, >98%, Aldrich), triphenylsulfonium chloride (TPS-Cl, 94%, Aesar), (4-Methylthiophenyl) methyl phenyl sulfonium triflate (Aldrich), potassium sulfide (K$_2$S, 95%, Strem), dimethylformamide (DMF, 99.8%, anhydrous, Aldrich), dimethylsulfoxide (DMSO, 99.8%, anhydrous, Aldrich), propylene carbonate (PC, 99.7%, anhydrous, Aldrich), tetrachloroethylene (TCE, Chromasolv for HPLC, 99.9%, Aldrich), dimethoxymethane (DMM, 99%, Aldrich), 2-methoxyethanol (2-Me, >99.9%, Aldrich) were used as received. N-methylformamide (NMF, 99%, Aesar) was dried before being used in the glovebox.

Synthesis of Colloidal Inorganic Materials

CdSe nanocrystals. A cadmium oleate (Cd(OA)$_2$) stock solution was obtained by mixing CdO (0.643 g, 5 mmol) with oleic acid (OA, 10 mL) in a 25 mL three-neck flask at room temperature and putting the solution under vacuum at 150° C. for 1 h. After it was refilled with N$_2$, the reddish mixture was heated up to 250° C., during which the suspension turned into a colorless solution indicating a completed reaction and the formation of Cd(OA)$_2$. Subsequently, the flask was cooled and dried under vacuum at 150° C. to scavenge the trace water generated during the reaction. The obtained Cd(OA)$_2$ was then stocked as a white waxy solid for further usage. TOP-Se stock solution (1 M) was prepared by dissolving Se powder (1.97 g, 25 mmol) in 25 mL of TOP and stocked in the glovebox. Wurtzite-phase CdSe NCs were synthesized following a modified procedure from B. Mahler, et al., Ligand-Controlled Polytypism of Thick-Shell CdSe/CdS Nanocrystals. *J. Am. Chem. Soc.* 132, 953-959 (2009). Briefly, Cd(OA)$_2$ (2.25 mL), TOPO (1.2 g), and ODE (12 mL) were loaded into a three-neck flask and dried at 100° C. for 1 h under vacuum, after which the colorless solution was heated up to 300° C. under $N_2$. At this point, a mixture of 4 mL of TOP-Se and 3 mL of OAm was quickly injected into the hot solution and the reaction temperature was dropped to 260° C. The reaction stopped after 8 min and cooled down to room temperature. CdSe NCs were purified five times by precipitation with ethanol and redissolution in toluene. The produced NCs were dissolved in hexane (40 mg/mL) and stored in the glovebox.

CdTe nanocrystals. CdTe NCs capped with oleate were synthesized using a method similar to a modified method published in M. G. Panthani et al., High Efficiency Solution Processed Sintered CdTe Nanocrystal Solar Cells: The Role of Interfaces. *Nano Lett.* 14, 670-675 (2014); and H. Zhang, et al., Solution-Processed, Ultrathin Solar Cells from $CdCl_3^-$-Capped CdTe Nanocrystals: The Multiple Roles of $CdCl_3^-$ Ligands. *J. Am. Chem. Soc.* 138, 7464-7467 (2016). In a typical preparation, CdO (480 mg, 3.7 mmol), OA (4.2 g, recrystallized, 14.8 mmol), and ODE (4 g, recrystallized) were loaded in a 50 mL three-neck flask and vacuum-dried overnight to remove trace oxygen. The flask was then heated to 220° C. under $N_2$ until the solution turned clear. The flask was cooled and dried under vacuum at 150° C. to remove water generated by the reaction, upon which the flask was heated to 270° C. under $N_2$, followed by the quick injection of 2.4 mL of 10 wt % solution of Te in TBP. Immediately after the injection, the heating mantle was removed, and the flask was quickly cooled to room temperature. The resulting CdTe NCs were purified using anhydrous ethanol and toluene for several precipitation-redispersion cycles. The purified NCs were dissolved in hexane at a concentration of ~80 mg/mL.

InP nanocrystals. InP NCs were synthesized following a procedure described in A. A. Guzelian et al., Synthesis of Size-Selected, Surface-Passivated InP Nanocrystals. *J. Phys. Chem.* 100, 7212-7219 (1996). $InCl_3$ (1.03 g, 4.66 mmol) and TOPO (10.7 g) were loaded into a three-necked flask and degassed at 80° C. for 1 h. After refilling with $N_2$, $(TMS)_3P$ (0.75 g, 3.00 mmol) was rapidly injected and the mixture was heated to 270° C. and kept at this temperature for one day. Afterwards, the dark solution was allowed to cool to room temperature. InP NCs were collected as toluene solution in the glovebox after they were purified by three precipitation-redispersion cycles using toluene and ethanol as the solvent and non-solvent, respectively.

InAs nanocrystals. InAs NCs were prepared following a procedure described by Srivastava et al. (See, e.g., V. Srivastava, et al., Facile, Economic and Size-Tunable Synthesis of Metal Arsenide Nanocrystals. *Chem. Mater.* 28 6797-6802 (2016).) $InCl_3$ (44.3 mg, 0.2 mmol) and OAm (5 mL) were placed under vacuum at 130° C. in a 100 mL three-necked flask for 1 h. The mixture was then heated to 250° C. The As stock solution (0.2 mmol of $As(NMe_2)_3$ with 0.5 mL of dry OAm) was quickly injected into the flask followed by the injection of 1.2 mL of 1 M DIBAL-H in toluene. After achieving the target NC sizes, the reaction was cooled to room temperature. InAs NCs were precipitated out with ethanol and redispersed in toluene or TCE.

Au nanocrystals. Au NCs were obtained using a modified recipe originally described in S. Peng et al., A facile synthesis of monodisperse Au nanoparticles and their catalysis of CO oxidation. *Nano Res.* 1, 229-234 (2008). In a typical procedure, 0.1 g (0.25 mmol) $HAuCl_4 \cdot xH_2O$ was dissolved in 10 mL OAm and 10 mL 1,2,3,4-tetrahydronaphthalene under $N_2$ at room temperature by forming a light red solution. 0.0435 g TBAB (0.13 mmol) was added with a syringe while the solution was stirred. The mixture was allowed to react for 1 h, after which toluene/ethanol was added to precipitate Au NCs. The toluene/ethanol dissolution/precipitation procedure was repeated three times, and the final Au NCs were dissolved in toluene with a concentration of 40 mg/mL.

Zirconia ($ZrO_2$) nanocrystals. $ZrO_2$ NCs were prepared through a nonhydrolytic sol-gel reaction described in J. Joo et al., Multigram Scale Synthesis and Characterization of Monodisperse Tetragonal Zirconia Nanocrystals. *J. Am. Chem. Soc.* 125, 6553-6557 (2003). In general, 390 mg (1 mmol) of $Zr[OCH(CH_3)_2]_4 \cdot (CH_3)_2CHOH$ and 292 mg (1.25 mmol) of $ZrCl_4$ were mixed with 5 g of TOPO and degassed at 70° C. for 30 min. The temperature of the reaction mixture was then increased to 340° C. under $N_2$ and held at this temperature for 2 h while being vigorously stirred, after which the reaction mixture was cooled to 60° C., and 50 mL of dried and degassed acetone was added to precipitate zirconia nanoparticles. The purified NCs were redispersed in toluene with a concentration of 30 mg/mL.

Lead sulfide (PbS) nanocrystals. PbS NCs were obtained using modified methods from A. H. Ip et al., Infrared Colloidal Quantum Dot Photovoltaics via Coupling Enhancement and Agglomeration Suppression. *ACS Nano* 9, 8833-8842 (2015). $Pb(OAc)_2 \cdot 3H_2O$ (0.75 g, 2 mmol) was dissolved and degassed in a mixture of 6.0 mL of oleic acid and 27.0 mL of 1-octadecene. The mixture was heated to 100° C. to form lead oleate and then heated to 140° C. under argon. It was then swiftly injected with 0.210 mL of $(TMS)_2S$ and 8.0 mL of ODE. After synthesis, the PbS dots were purified and extracted two times with 50 mL of distilled acetone and redispersed in toluene.

Mercury selenide (HgSe) and mercury telluride (HgTe) nanocrystals. As described in Z. Deng, et al., Colloidal Quantum Dots Intraband Photodetectors. *ACS Nano* 8, 11707-11714 (2014), 27.2 mg of $HgCl_2$ (0.1 mmol) was added to 4 mL of OAm, and the mixture was heated at 110° C. for about 30 min. Then the selenourea/oleylamine solution was quickly injected into the mixture. The final particle size was controlled by varying the reaction time. A "quench solution" (8 mL), made of 5% TOP and 85% TCE, was added to the reaction mixture to stop the reaction. The quenched mixture was precipitated with methanol, centrifuged, and the precipitate was redispersed in TCE.

HgTe NCs were synthesized following a similar method to that described in S. Keuleyan, et al., Synthesis of Colloidal HgTe Quantum Dots for Narrow Mid-IR Emission and Detection. *J. Am. Chem. Soc.* 133, 16422-16424 (2011). The mercury precursor was obtained by mixing 27 mg (0.1 mmol) of $HgCl_2$ with 4 mL of OAm, and the mixture was placed under vacuum and heated to 100° C. for 1 h, forming a clear, colorless, or pale yellow solution. The solution was then placed under $N_2$, cooled to 80° C., and quickly injected with 0.1 mL of TOPTe. After stirring for a minute, methanol was added and the precipitate was collected upon centrifugation. The purified HgTe NCs were redispersed into TCE for further usage.

$NaYF_4$:Yb,Er@$CaF_2$ upconverting nanocrystals (UCNPs). $Ca(CF_3COO)_2$ precursor was obtained by mixing 4 mmol of $CaCO_3$ with 10 mL trifluoroacetic acid and 10 mL $H_2O$. The mixture was kept refluxing to form a clear solution, which was then dried in an oven at 80° C. for 24 h to obtain $Ca(CF_3COO)_2$ powders. (See, e.g., J. E. Roberts, Lanthanum and Neodymium Salts of Trifluoroacetic Acid. *J. Am. Chem. Soc.* 83, 1087-1088 (1961).) The same procedure was used to prepare $Ln(CF_3COO)_3$, except $Y_2(CO_3)_3$, $Yb_2(CO_3)_3$ and $Er_2(CO_3)_3$ were used instead of $CaCO_3$. The UCNPs synthesis was modified from a previous literature report. (See, e.g., A. Punjabi et al., Amplifying the Red-Emission of Upconverting Nanoparticles for Biocompatible Clinically Used Prodrug-Induced Photodynamic Therapy. *ACS Nano* 8, 10621-10630 (2014).) Briefly, $CF_3COONa$ (68 mg, 0.5 mmol) and $Ln(CF_3COO)_3$ (Ln=Y, Yb, Er, 0.5 mmol in total) with OA (5 mmol) and ODE (5 mmol) were injected into a degassed mixture of OA (8 mmol) and ODE (8 mmol) at 310° C. at a rate of 1 mL/min. The reaction mixture was kept at 310° C. for 1 h under $N_2$, after which a degassed mixture of OA (5 mmol) and ODE (5 mmol) with $Ca(CF_3COO)_2$ (532.2 mg, 2 mmol) was injected at the same rate. The reaction was continued for another 1 h at 310° C. The UCNPs were precipitated by adding ethanol, and purified by hexane/ethanol. The resulting UCNPs were redispersed into toluene for further usage.

Sol-gel synthesis of indium gallium zinc oxide (IGZO). The IGZO sol-gel precursor solution was prepared using a modified recipe from Y. S. Rim et al., Boost Up Mobility of Solution-Processed Metal Oxide Thin-Film Transistors via Confining Structure on Electron Pathways. *Adv. Mater.* 26, 4273-4278 (2014). $In(NO_3)_3 \cdot xH_2O$ (7.5 mg, 0.025 mmol), $Ga(NO_3)_3 \cdot xH_2O$ (6.4 mg, 0.025 mmol), and $Zn(OAc)_2 \cdot 2H_2O$ (11 mg, 0.05 mmol) were dissolved in 2-methoxyethanol (1 mL) and stirred at 70° C. for 1 h. Afterwards, the solution was filtered through a 0.2 µm membrane filter and stored in the dark for further usage.

Core-shell quantum dots (CdSe/CdS, CdSe/CdZnS, InP/ZnS, ZnSe/ZnS) used in this study have been synthesized by established recipes (See, e.g., B. O. Dabbousi et al., (CdSe)ZnS Core-Shell Quantum Dots: Synthesis and Optical and Structural Characterization of a Size Series of Highly Luminescent Materials. *J. Phys. Chem. B* 101, 9463-9475 (1997); X. Peng, et al., Epitaxial Growth of Highly Luminescent CdSe/CdS Core/Shell Nanocrystals with Photostability and Electronic Accessibility. *J. Am. Chem. Soc.* 119, 7019-7029; D. V. Talapin et al., CdSe/CdS/ZnS and CdSe/ZnSe/ZnS Core-Shell-Shell Nanocrystals. *J. Phys. Chem. B* 108, 18826-18831 (2004); and R. Xie, et al., Colloidal InP Nanocrystals as Efficient Emitters Covering Blue to Near-Infrared. *J. Am. Chem. Soc.* 129, 15432-15433 (2007).)

Aluminum oxide ($Al_2O_3$) nanoparticles were purchased from Aldrich as 20 wt % in isopropanol.

Synthesis of Photochemically Active Inorganic Ligands $NaS_2CN_3$ and $NH_4S_2CN_3$. $NaS_2CN_3$ was synthesized by following the procedure reported in D. H. Webber, et al., Nanocrystal ligand exchange with 1,2,3,4-thiatriazole-5-thiolate and its facile in situ conversion to thiocyanate. *Dalton Trans* 41, 7835-7838 (2012). $NaN_3$ (250 mg, mmol) was dissolved in DI water (1 mL) and $CS_2$ (0.25 mL) was diluted in n-propanol (1 mL). The $CS_2$ solution was then added to an $NaN_3$ solution at room temperature and stirred in the dark for 1 h to produce a homogenous pale green solution. The $NaS_2CN_3$ solid was obtained after the solution was vacuum-dried in the dark overnight. The residue was dissolved in anhydrous DMF (12 mL) or n-propanol (12 mL) and stored in the freezer (0-5° C.) in the dark. $NH_4S_2CN_3$ was obtained through the cation exchange. Briefly, a $(NH_4)_2SiF_6$ (348 mg, 1.95 mmol) water solution (0.78 M) was added dropwise into a $NaS_2CN_3$ raw solution, upon which a white precipitate ($Na_2SiF_6$) was formed and discarded after centrifugation. The transparent supernatant was collected, filtered (0.2 µm), and dried overnight under vacuum. The white solid was redissolved in anhydrous DMF (12 mL) or 1-PrOH (12 mL) and stored in the cold and dark in a glovebox.

$[Ph_2I]_2[CdCl_4]$ was obtained by mixing $CdCl_2$ (18.3 mg, 0.1 mmol) with $Ph_2I$—Cl (31.7 mg, 0.1 mmol) in 1 mL of MeOH. Sonicating the mixture for 5 s generated a white amorphous precipitate, which was collected by centrifugation. The precipitate was rinsed with small amounts of MeOH (0.5 mL) three times to remove unreacted precursors. The final product was obtained by centrifugation and then redissolved into polar solvents. The $[Ph_2I]_2[CdCl_4]$ solution was colorless and stored in the dark for further usage. The reaction product was characterized by single crystal X-ray diffraction. Crystals were grown from highly concentrated solutions of $[Ph_2I]_2[CdCl_4]$ in MeOH. The same structure was also obtained from DMF. When saturated solutions were prepared, an $N_2$ slow flow was introduced above the solution layer via a needle to increase the evaporation rate of the solvents. After a while (10-20 min for MeOH, 1 h for water, and 2 h for DMF or NMF), the colorless crystals grew from the interface of liquid and air.

Figures 7A, 7B:
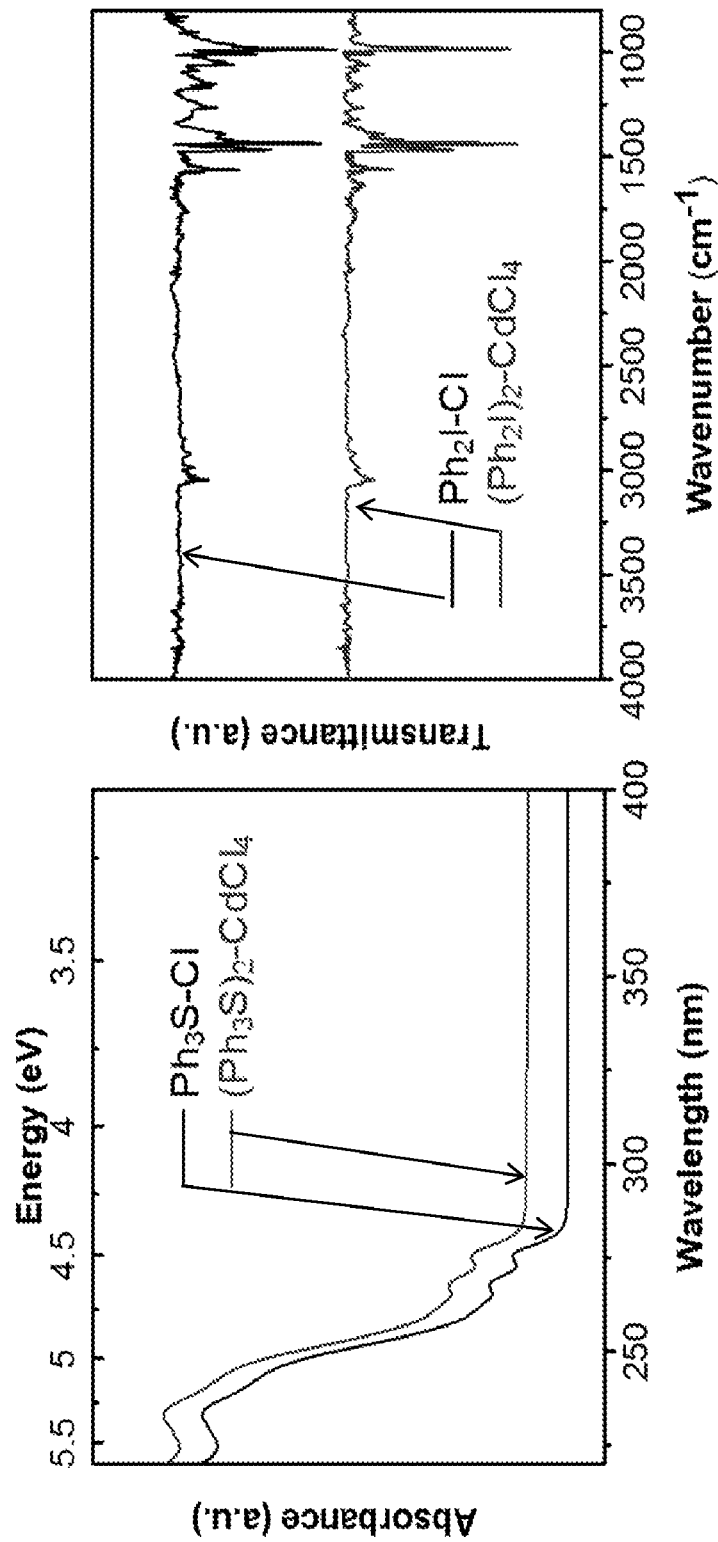
FIG. 7A depicts the absorption spectra of Ph$_3$S—Cl and (Ph$_3$S)$_2$—CdCl$_4$ in methanol.
FIG. 7B shows FTIR spectra of Ph$_2$I—Cl and (Ph$_2$I)$_2$—CdCl$_4$.
Figure 7C:
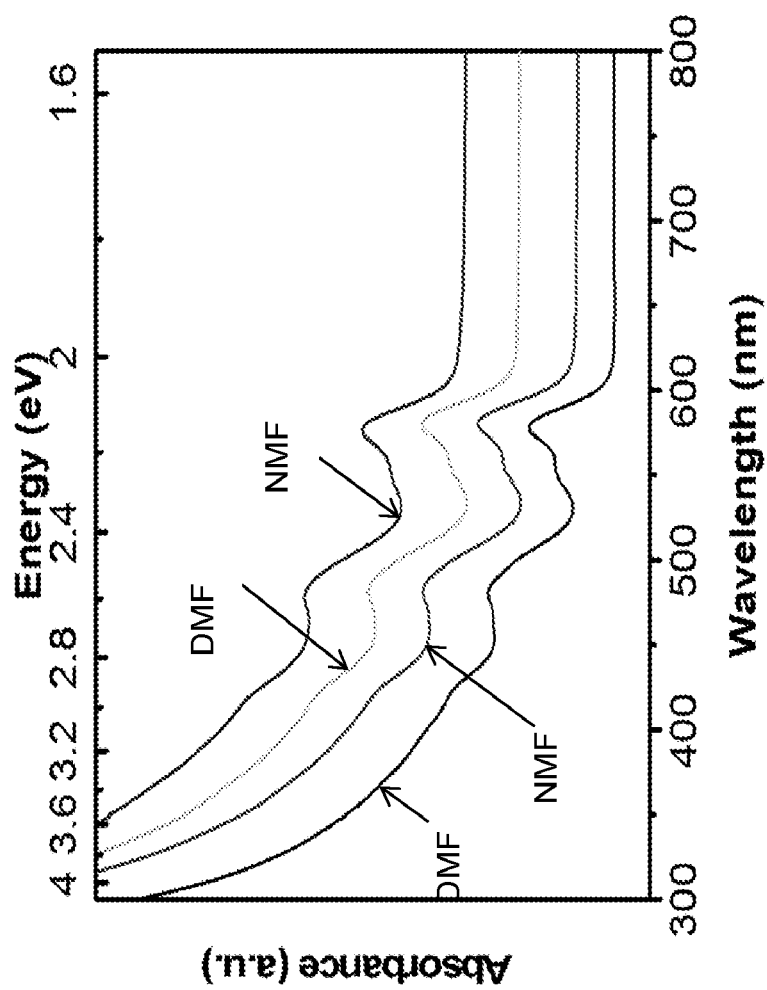
FIG. 7C shows absorption spectra of CdSe—CdCl$_4$-(Ph$_2$I)$_2$ in DMF and NMF; and CdSe—CdCl$_4$-(Ph$_3$S)$_2$ in DMF and NMF.
Figure 7D:
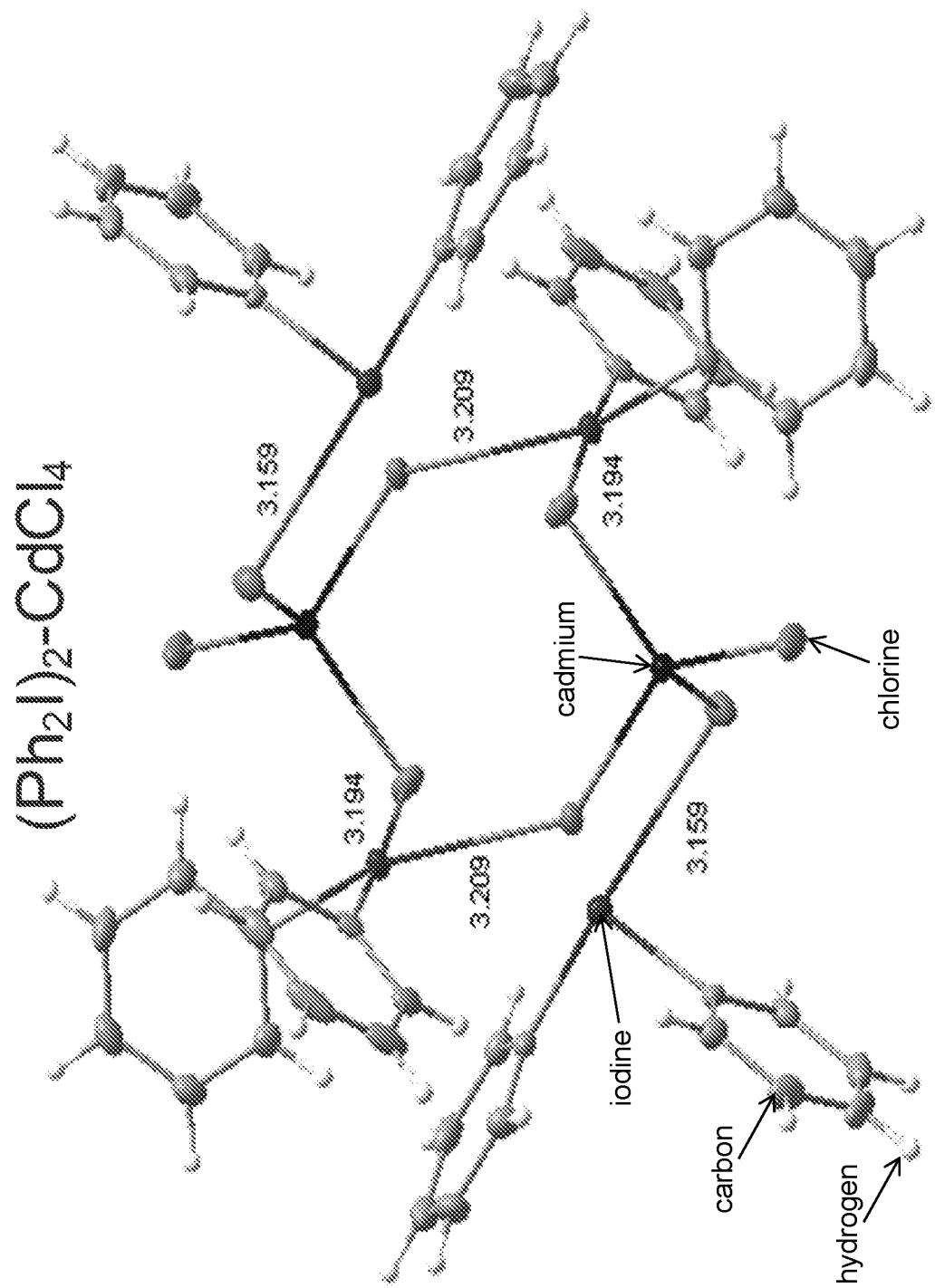
FIG. 7D shows the crystal structure of (Ph$_2$I)$_2$—CdCl$_4$.
Figure 7E:
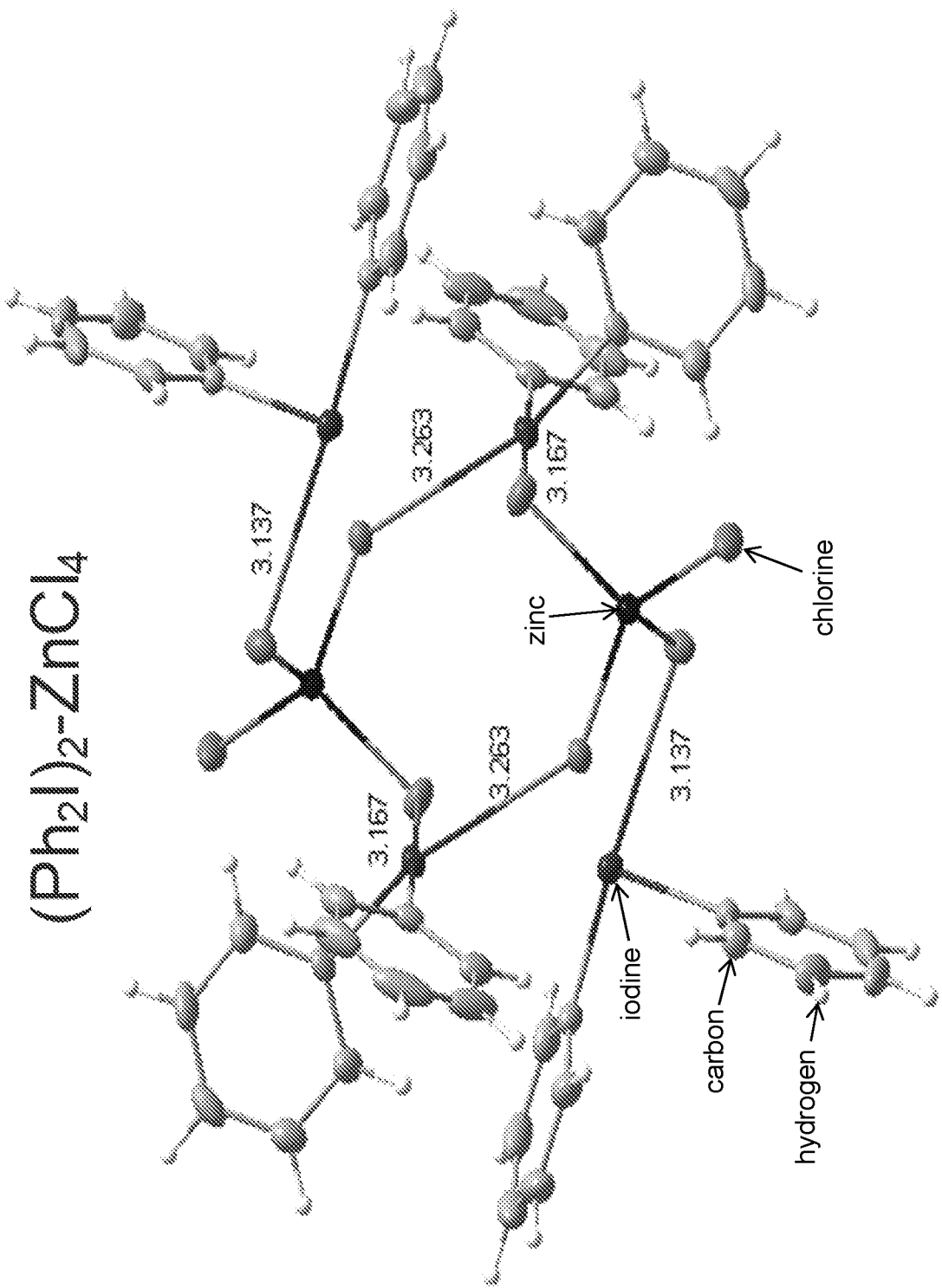
FIG. 7E shows the crystal structure of (Ph$_2$I)$_2$—ZnCl$_4$.

FIG. 7A depicts absorption spectra of $Ph_3S$—Cl and $(Ph_3S)_2$—$CdCl_4$ in methanol. FIG. 7B shows FTIR spectra of $Ph_2I$—Cl And $(Ph_2I)_2$—$CdCl_4$. FIG. 7C shows absorption spectra of $CdSe$—$CdCl_4$-$(Ph_2I)_2$ in DMF and NMF; and $CdSe$—$CdCl_4$-$(Ph_3S)_2$ in DMF and NMF. FIG. 7D shows the crystal structure of $(Ph_2I)_2$—$CdCl_4$. FIG. 7E shows the crystal structure of $(Ph_2I)_2$—$ZnCl_4$.

$[Ph_2I]_2[ZnCl_4]$ was synthesized using a similar procedure to that described above to synthesize $[Ph_2I]_2[CdCl_4]$, except $ZnCl_2$ was used as the metal chloride precursor instead of $CdCl_2$. $[Ph_2I]_2[ZnCl_4]$ showed higher solubility in MeOH than $[Ph_2I]_2[CdCl_4]$. Thus, no precipitate was observed when $ZnCl_2$ was mixed with $Ph_2I$—Cl in MeOH. White precipitate was obtained after the product was concentrated under vacuum and rinsed with a small amount of MeOH or acetonitrile to remove the unreacted precursors. The final product was obtained by centrifugation and then redissolved in polar solvents. The $[Ph_2I]_2[ZnCl_4]$ solution was colorless and stored in the dark for further use. Crystals were grown from highly concentrated solutions of $[Ph_2I]_2[ZnCl_4]$ in MeOH. The same structure was also obtained from DMF.

$Ph_2I$-Pyranine was synthesized following the procedure reported in N. Tarumoto, et al., Diphenyliodonium Salts with Pyranine Conk as an Environment-friendly Photo-acid Generator and Their Applications to Chemically Amplified Resists. *Polymer Journal* 37, 545-549 (2005). Pyranine (262 mg, 0.5 mmol) and $Ph_2I$—Cl (474.8 mg, 1.5 mmol) were mixed in D.I. water and stirred at 40° C. for 2 h, during which the mixture turned cloudy. The precipitate was collected and a small amount of D.I. water was used to scavenge side product and unreacted precursors. The purified product was dissolved into EtOH and stored in the dark.

Functionalization of Inorganic Materials with Photosensitive Surface Ligands

All surface treatment experiments were carried out in a glovebox equipped with a yellow filter typically used for clean room lighting. Such filters can be purchased from various clean room suppliers. A filter purchased from Pro Lighting Group, Inc. was used for these experiments. Anhydrous solvents and exchanged NC surface ligands were typically used, using either a one-phase or a two-phase ligand-exchange strategy. (See, e.g., A. Dong et al., A Generalized Ligand-Exchange Strategy Enabling Sequential Surface Functionalization of Colloidal Nanocrystals. *J. Am. Chem. Soc.* 133, 998-1006 (2011); and D. S. Dolzhnikov et al., Composition-matched molecular "solders" for semiconductors. *Science* 347, 425-428 (2015).) In the one-phase approach, the solvent for NC dispersion had a similar polarity to that of the solvent used for inorganic ligands, such as toluene/DMF or toluene/NMF. Therefore, the two solutions were miscible with each other upon mixing, and the surface treatment was achieved in one phase. However, if the polarity of the solvents of the NCs dispersion and inorganic ligands were different, such as toluene/$N_2H_4$, hexane/DMF, then the ligand-exchange reaction involved a phase transfer process. In other words, the NC dispersion was loaded on top of the inorganic ligand solution to form a two-phase mixture, and the surface treatment was achieved when the NCs were transferred from the upper layer to the bottom layer.

To describe NCs capped with various surface ligands, Green's classification of molecular species chemically bound to NC surfaces was used. (See, e.g., M. A. Boles, et al., The surface science of nanocrystals. *Nat. Mater.* 15, 141-153 (2016); and P. E. Chen, et al., Tight Binding of Carboxylate, Phosphonate, and Carbamate Anions to Stoichiometric CdSe Nanocrystals. *J. Am. Chem. Soc.* 139, 3227-3236 (2017).) Using CdSe as an example, as-synthesized NCs can be described as $(CdSe)_m(CdX_2)_nL_q$, where m reflects the number of formula units in the NC core, X and L describe the X-type (e.g., X=$RCOO^-$, $RPO(OH)O^-$) and L-type (e.g., L=pyridine, $RNH_2$, etc.) ligands, and 2n and q describe the numbers of corresponding X- and L-type ligands bound to the NC surface.

Positive Tone Photoactive Inorganic Inks

Nanocrystals with $S_2CN_3^-$ (TTT) ligands. $TTT^-$ is an X-type ligand that binds to Cd-surface sites. In non-polar solvents or in a dried form it exists as an ion pair with a cation, e.g., $Na^+$ or $NH_4^+$. In polar solvents, the requirement of electroneutrality on an NC surface does not apply, and negatively charged $TTT^-$ ligands overcharge the NC surface, creating a cloud of counter ions responsible for colloidal stabilization. The coordinating solvents like DMF or NMF may act as weakly bound L-type ligands (L'):

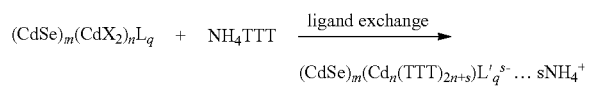

$(CdSe)_m(CdX_2)_nL_q$ + $NH_4TTT$ $\xrightarrow{\text{ligand exchange}}$ $(CdSe)_m(Cd_n(TTT)_{2n+s})L'^{s-}_q \ldots sNH_4^+$ A one-phase strategy was used for surface treatment. In a typical procedure for CdSe—$S_2CN_3$ NCs, 100 µL of a stock solution of wurtzite phase CdSe NCs in hexane (~4.0 nm, 40 mg/mL) was diluted in 1 mL toluene. Adding a certain amount of $NaS_2CN_3$ or $NH_4S_2CN_3$ in DMF (200 µL) resulted in fast flocculation of the NCs after vortex, indicating a dramatic change in NC solubility caused by the surface modification. The ligand-exchanged CdSe—$S_2CN_3$ NCs were precipitated out from the suspension by centrifugation and rinsed three times with toluene to scavenge the last traces of original organic ligands. After purification, the CdSe—$S_2CN_3$ NCs were redissolved in DMF as a colloidal solution and kept stable for months while stored in the cold and dark in a glovebox.

Nanocrystals with PAG ligands. A typical exchange of lyophilic organic ligands (X=$RCOO^-$ and L=$R'NH_2$) for PAG ligands with an inorganic binding group can be expressed by the following scheme using CdSe NC as an example:

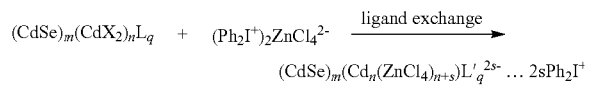

$(CdSe)_m(CdX_2)_nL_q$ + $(Ph_2I^+)_2ZnCl_4^{2-}$ $\xrightarrow{\text{ligand exchange}}$ $(CdSe)_m(Cd_n(ZnCl_4)_{n+s})L'^{2s-}_q \ldots 2sPh_2I^+$ $[Ph_2I]_2[MCl_4]$ (M=Cd or Zn). The ligand exchange was carried out via a phase transfer method. In a typical procedure for CdSe—$CdCl_4$-$[Ph_2I]_2$ NCs, 100 µL of oleate-capped CdSe NCs (40 mg/mL in hexane) were diluted in 1 mL of hexane and combined with $(Ph_2I)_2$-$CdCl_4$ NMF solution to form a two-phase mixture. When vigorously stirred, the NCs gradually transferred from the hexane layer into the NMF layer, resulting in a colorless top phase. The NMF layer was then rinsed with fresh hexane five times. The post-treated NCs were collected by centrifugation after a minimal amount of acetonitrile was added. The NCs were then redispersed in DMF to form a stable colloidal solution with concentrations about 30 mg/mL.

Other PAG ligands. For a number of inorganic ligands like $SCN^-$, $Sn_2S_6^{4-}$ $AsS_3^{4-}$, $In_2Se_4^{2-}$, $CdCl_3^-$, $MoO_4^{4-}$, and $Cd_2Se_3^{2-}$, a modified procedure was used to prepare photosensitive inorganic inks. First, surface treatment of NCs with the above inorganic ligands was carried out using previously published procedures. (See, e.g., H. Zhang, et al., Solution-Processed, Ultrathin Solar Cells from $CdCl_3^-$-Capped CdTe Nanocrystals: The Multiple Roles of $CdCl_3^-$ Ligands. *J. Am. Chem. Soc.* 138, 7464-7467 (2016); D. S. Dolzhnikov et al., Composition-matched molecular "solders" for semiconductors. *Science* 347, 425-428 (2015); A. T. Fafarman et al., Thiocyanate-Capped Nanocrystal Colloids: Vibrational Reporter of Surface Chemistry and Solution-Based Route to Enhanced Coupling in Nanocrystal Solids. *J. Am. Chem. Soc.* 133, 15753-15761 (2011); J. Huang et al., Surface Functionalization of Semiconductor and Oxide Nanocrystals with Small Inorganic Oxoanions ($PO_4^{3-}$, $MoO_4^{2-}$) and Polyoxometalate Ligands. *ACS Nano* 8, 9388-9402 (2014); M. V. Kovalenko, et al. Expanding the Chemical Versatility of Colloidal Nanocrystals Capped with Molecular Metal Chalcogenide Ligands. *J. Am. Chem. Soc.* 132, 10085-10092 (2010); M. V. Kovalenko, et al., Inorganically Functionalized PbS—CdS Colloidal Nanocrystals: Integration into Amorphous Chalcogenide Glass and Luminescent Properties. *J. Am. Chem. Soc.* 134, 2457-2460 (2012); and W. Liu, et al., III-V Nanocrystals Capped with Molecular Metal Chalcogenide Ligands: High Electron Mobility and Ambipolar Photoresponse. *J. Am. Chem. Soc.* 135, 1349-1357 (2013).) In a typical procedure, inorganic ligands (Table 1) were dissolved in 1 mL of polar solvents like NMF or $N_2H_4$, above which 100 µL of as-synthesized CdSe NCs dispersed into 1 mL hexane were loaded. After stirring, the hexane layer turned from dark red to colorless, while the NMF layer turned red, indicating the NCs were completely transferred to the polar phase after ligand exchange. The NCs were then washed with hexane at least five times, precipitated from NMF with a non-solvent such as acetonitrile, centrifuged, and finally redissolved in DMF to form a red solution with a concentration of 20-30 mg/mL. The amount of inorganic ligand used for the ligand exchange depended on the NC size and surface chemistry; it was optimized for each NC-ligand pair. To ensure a complete exchange, an excess of inorganic ligands was typically used during NC phase transfer, and then unreacted ligands were washed during the precipitation of ligand-exchanged NCs from the polar solvent.

Next, 0.2 mg (4-Methylthiophenyl) methyl phenyl sulfonium triflate, which is a typical PAG, was dissolved in 10 µL of an anhydrous protic solvent like ethanol, mixed with 100 µL of treated CdSe NCs in DMF to form a colloidally stable photosensitive inorganic solution, and stored in the dark for further usage.

TABLE 1

Ion-pair inorganic ligands forming stable colloidal solutions of CdSe NCs.

| Anion | Cation | Solvents combination |
|---|---|---|
| $SCN^-$ | $NH_4^+$ | NMF/Hexane |
| $Sn_2S_6^{4-}$ | $Na^+$ | NMF/Hexane |
| $AsS_3^{4-}$ | $Na^+$ | NMF/Hexane |
| $In_2Se_4^{2-}$ | $Na^+$ | NMF/Hexane |
| $CdCl_3^-$ | $NH_4^+$ | NMF/Hexane |
| $MoO_4^{4-}$ | $Na^+$ | NMF/Hexane |
| $Cd_2Se_3^{2-}$ | $Na^+$ | $N_2H_4$/toluene |

Sol-gel precursors. The stock solution of molecular photosensitive precursors for IGZO was prepared from the fresh IGZO sol-gel precursors (100 μL of 2-methoxyethanol solution described above) mixed with 10 μL of the PAG solution (10% wt. % (p-$CH_3S$—$C_6H_4$—)($C_6H_5$—$)_2S^+OTf^-$ in EtOH).

Negative tone photoactive inorganic inks. As-synthesized NCs capped with lyophilic organic ligands were thoroughly purified from the growth solution in the glovebox and redispersed in nonpolar solvents, such as toluene or chlorobenzene. They formed a colloidal stable solution with a concentration of 20-30 mg/mL. PAGs, such as (4-Methylthiophenyl) methyl phenyl sulfonium triflate or diphenyliodium triflate, were dissolved into EtOH and mixed with the NC solution (5-10%, by weight). This photochemically active inorganic ink was passed through a 0.2 μm filter and stored in the dark for further usage.

Direct Optical Patterning of Inorganic Materials: DOLFIN Process

Exposure systems and masks. The optical patterning was carried out in a clean room with an EVG semi-automatic double-sided mask aligner system. The UV light source was either a home-built exposure system equipped with a low-pressure mercury vapor grid lamp (254 nm, 6.3 mW/cm²) obtained from Jelight Company, Inc., or a dual wavelength UV lamp (254 nm, 2.0 mW/cm²; 365 nm, 2.2 mW/cm²) purchased from Spectronics Co. The masks with a quartz substrate and chrome coating were obtained from Benchmark Technologies.

Patterning protocols. The experiments were performed under yellow light, and photoactive inorganic inks were passed through a 0.2 μm filter before spin-coating to eliminate particulate contaminations.

$S_2CN_3^-$ ($TTT^-$) based inks. The photosensitive inorganic materials solutions were prepared in DMF (as described above) with a concentration of about 30 mg/mL and spin-coated (spread: 400 rpm, 3 s; spin: 2000 rpm, 30 s) on various substrates (Si/SiO$_2$, Si, quartz, glass). The NC layers were then dried under vacuum for 15 min to evaporate the solvent and irradiated with a 254 nm DUV lamp with a dosage of 100-250 mJ/cm², which was dependent on the materials used. Neat DMF was used as the developer for unexposed ink. These unexposed inks dispersed well in the developer solvent (DMF) and could be collected and reused. For the multiple-layer patterning, the second layer was directly spin-coated on top of the first patterned layer without any additional surface treatments.

PAG based positive tone inks. NCs of various materials were ligand-exchanged in NMF first and then redissolved in DMF to form 20-30 mg/mL of a stable colloidal solution. The spin-coated NCs films were exposed under a 254 nm DUV lamp with a 40-70 mJ/cm² dose and developed in NMF. For the IGZO sol-gel system, ethanol was introduced as the developer solvent to dissolve unexposed ink. For the multiple-layer patterning, the second layer was directly spin-coated on top of the first patterned layer without any additional surface treatments.

PAG based negative tone inks. The negative tone inks were spin-coated from chlorobenzene or toluene solutions and exposed under a 254 nm DUV lamp with a 180-240 mJ/cm² dose. To form a negative pattern, NMF was used as the developer to selectively remove the exposed regions. Alternatively, the same inks could be used to generate positive patterns if toluene was applied as the developer.

Recovery of nanocrystals from the developer solvents. Since the developer solution was the same as the carrier solvent for the original photoactive ink, the materials from unexposed regions could be collected and reused, thus enabling significant cost savings. For example, the NCs dissolved in the developer solvents (DMF or NMF) could be collected by adding non-solvents like toluene. The precipitate was separated and dispersed into the corresponding fresh solvent. The absorption spectra and TEM images indicated that the NCs preserved their original properties and could be reused as photopatternable inorganic materials.

Chemical Transformations Responsible for the Pattern Formation $S_2CN_3^-$ (TTT) ligands. During the exposure to UV-light, $TTT^-$ ions decomposed as shown in FIG. 1B, and the resulting thiocyanate-capped NCs became insoluble in polar solvents like DMF. Without wishing to be bound by theory, the loss of solubility of NCs in the polar solvents could be due to the reduction of surface charge caused by partial desorption of $SCN^-$ groups from the NC surface:

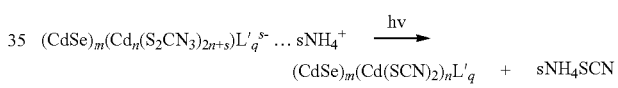

PAG ligands. Under UV exposure, the PAG molecules underwent the following chemical transformations:

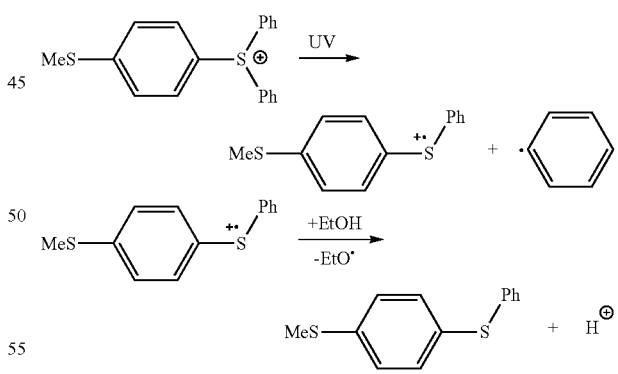

This reaction sequence generated strong acid, e.g., triflic acid (HOTf) if the anionic part of the PAG salt is triflate ($CF_3SO_3^-$). The strong acid can interact with the NC surface in several ways, depending on the chemical nature of the NC core and the nature of its surface-binding ligands. Without wishing to be bound by theory, several typical reaction pathways are described below.

Photogenerated protons attack the anionic part on the ion pair ligand ($X^-$ group in FIG. 1A). This reaction is typical for the ligands where anion is a strong Brønsted base. For example, most chalcogenidometalate ligands can be easily protonated. Upon exposure to UV light, the photogenerated acid attacks chalcogenidometalate ligands:

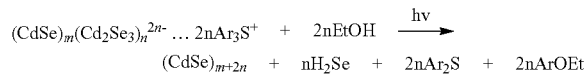

Here, for simplicity, (p-MeS—$C_6H_4$—) ($C_6H_5$—)$_2$ S$^+$ is denoted as $Ar_3S^+$.

The elimination of NC surface charge causes the loss of colloidal stability in polar solvents. Protonated ligand converts into CdSe and $H_2Se$, and thus fails to stabilize the NCs electrostatically.

Photogenerated protons bind to basic surface sites at NC surface. These types of surface reactions should be common for NCs with ligands behaving as a weak Brønsted base (e.g., halometalate ligands). It is common for NCs to expose unpassivated surface sites with pronounced Brønsted basicity. These sites will be engaged in chemical bonding with photogenerated protons as shown in the example of chlorocadmate-capped CdSe NCs:

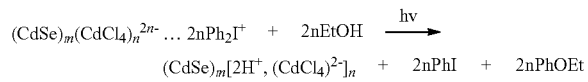

The formation of dative bonds between $Se^{2-}$ surface sites and H$^+$ ions is expected. This interaction reduces total charge at the NC surface and ultimately makes the NC surface neutral. The NCs become insoluble in polar solvents.

Photogenerated acid protonates lyophilic organic ligands at NC surface. This chemistry is responsible for the formation of the negative patterns. Upon exposure to UV-light, the photogenerated acid protonates and cleaves the lyophilic L- and X-type ligands off the surface of as-synthesized NCs:

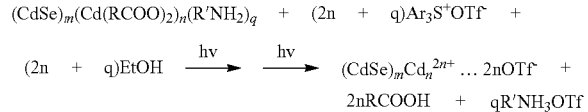

Upon UV-exposure, the acid released from PAG acts as the ligand-stripping agent and turns the hydrophobic NC hydrophilic. As a result, NCs lose solubility in non-polar solvents but become soluble in polar solvents. Either toluene or NMF can be used as a developer solvent to generate negative or positive patterns, respectively. Specifically, negative patterns are obtained when toluene is applied, while positive patterns are observed when NMF is used for the pattern development.

Characterization Techniques

Figure 8:
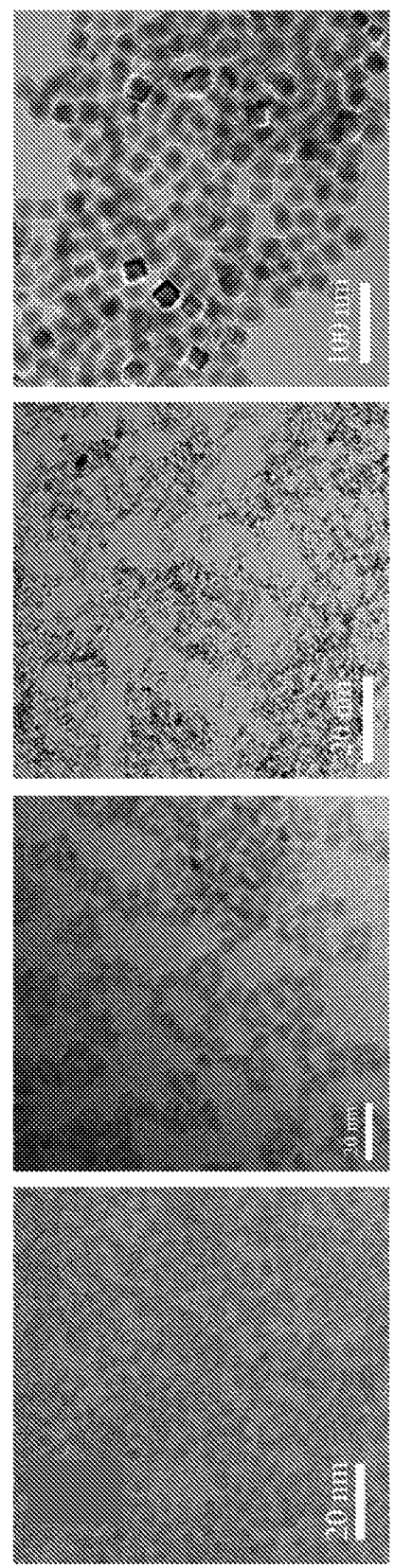
FIG. 8 shows transmission electron microscopy images of photoactive colloidal NCs with TTT$^-$ ligands, from left to right: CdSe, core-shell CdSe/ZnS, Al$_2$O$_3$ NCs, NaYF$_4$:Yb, Er@CaF$_2$ upconverting nanoparticles (UCNPs).
Figures 9C, 9D:
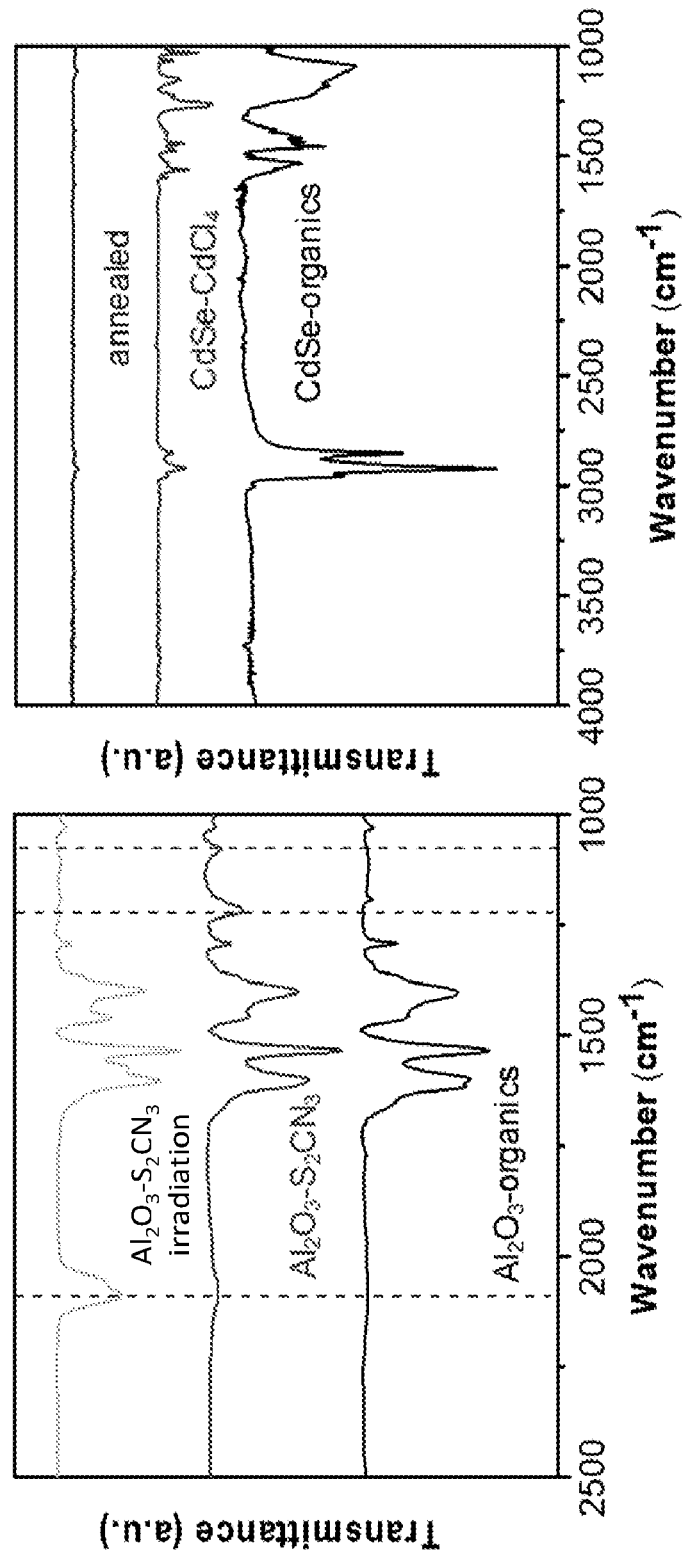

Transmission electron microscopy (TEM). TEM images were obtained using a 300 kV FEI Tecnai F30 microscope. FIG. 8 shows transmission electron microscopy images of photoactive colloidal NCs with TTT$^-$ ligands, from left to right: CdSe, core-shell CdSe/ZnS, $Al_2O_3$ NCs, $NaYF_4$:Yb, Er@CaF$_2$ upconverting nanoparticles (UCNPs).

Scanning electron microscopy (SEM). SEM analysis was carried out on an FEI Nova NanoSEM 230 operating at 10 kV.

Wide angle powder X-ray diffraction (XRD). XRD patterns were collected using a Bruker D8 diffractometer with a Cu Kα X-ray source operating at 40 kV and 40 mA.

Optical absorption measurements. UV-vis absorption spectra were collected from a Cary 5000 UV-Vis-NIR spectrophotometer.

Fourier transform infrared (FTIR). FTIR spectra were acquired in transmission mode using a Nicolet Nexus-670 FTIR spectrometer. Concentrated NC dispersions were drop-cast on KBr or CaF$_2$ crystal substrates (International Crystal Laboratories), and then dried at 100° C. (for $N_2H_4$ solutions) and 200° C. (for DMF, NMF, and PC solutions). IR absorbance was normalized to the weight of the NCs deposited per unit area of the substrate.

Thermogravimetric analysis (TGA). TGA measurements were performed by using a TA Instruments SDT Q600 thermal analyzer flow in the temperature range of 30-500° C., with a heating rate of 3° C./min and a cooling rate of 10° C. under nitrogen.

Dynamic light scattering (DLS) and ζ-potential measurements. DLS and ζ-potential data were collected using a Zetasizer Nano-ZS (Malvern Instruments, UK). Colloidal solutions were filled into a quartz cuvette, and a dip-cell electrode assembly with Pd electrodes was used to apply an electric field to the solution.

Profilometry measurements were carried out in a clean room using a Bruker Dektak XT-S profilometer. Films were prepared by spin-coating NC solution onto Si/SiO$_2$ in the glovebox equipped with the yellow filter.

Ellipsometry measurements were performed by using a Gaertner Waferskan automated ellipsometer to map the thicknesses and reflective indexes of patterned oxide layers on top of Si/SiO$_2$ or Si substrates.

Electrical measurements. All electrical measurements were performed in a nitrogen-filled glovebox. FET and Van der Pauw measurements were performed using a semiconductor parametric analyzer Keysight B1500A. Capacitance measurements were run with an LCR meter SR 720.

Van der Pauw (VdP) measurements. Au NC films with photoactive inorganic ligands were deposited on 1.5 cm×1.5 cm glass substrates, irradiated, developed, and annealed at 150° C. The films were contacted at four corners, and a standard VdP measurement was run using a B1500A parametric analyzer. Sheet resistivity was calculated using Van der Pauw's theorem as $$R_s = \frac{\pi}{\ln 2} R,$$

R being the slope of the V-I curve. The thickness of the film was h=60 nm, determined using the profilometry. The resistivity of the film was then ρ=$R_s$h=5.22·10$^{-8}$ Ωm.

Dielectric measurements. A layer of solution-processed alumina NCs with TTT ligands was patterned onto Si wafers (heavily n-doped, ρ<0.005 Ωcm) with 100 nm thermally grown SiO$_2$. The sandwich-type devices were fabricated by depositing 100 nm thick Al electrodes (various sized dots with diameters of 0.50, 0.65, 0.80, 1.0 mm, and 2.0 mm) directly on top of the photopatterned and annealed NC layer. The measurements were performed using an LCR meter SR 720 with frequencies ranging from 100 Hz to 100 kHz. The equivalent circuit with an R+C in series was used; capacitance values at different frequencies were extracted; and the dielectric constant was calculated modeling the system as two capacitors in series: $d_1$=100 nm of silica ($\varepsilon_1$=3.7) and $d_2$=160 nm of alumina (by ellipsometry). The dielectric constant of alumina was obtained from the equivalent capacitance:

$$C = \varepsilon_0 A \bigg/ \left(\frac{d_1}{\varepsilon_1} + \frac{d_2}{\varepsilon_2}\right)$$

where A is the area of electrodes of a flat capacitor.

Bruggeman effective-medium model for capacitance of a granular dielectric layer. The values for the dielectric constant of alumina are smaller than the bulk value (~10) due to the film porosity. This effect of porosity can be estimated using effective medium theories. Here we used the Bruggeman effective-medium theory, which expresses the dielectric constant of a composite system (∈) built of a material with the dielectric constant $\in_1$ and the volume fraction $\eta_1$, and a matrix with the dielectric constant $\in_2$ and the volume fraction $\eta_2$=1−$\eta_1$ for the two-component case considered here. (See, e.g., D. D. W. Grinolds, et al., Quantum-Dot Size and Thin-Film Dielectric Constant: Precision Measurement and Disparity with Simple Models. *Nano Lett.* 15, 21-26 (2015).) The theory uses the characteristic equation:

$$\eta_1\left(\frac{\varepsilon_1 - \varepsilon}{\varepsilon_1 + 2\varepsilon}\right) + \eta_2\left(\frac{\varepsilon_2 - \varepsilon}{\varepsilon_2 + 2\varepsilon}\right) = 0,$$

which gives ∈=6.7 for $\in_1$=1 (air), $\in_2$=10 ($Al_2O_3$), $\eta_1$=0.2 (an estimate for voids in a partially sintered powder) and $\eta_2$=0.8. A reasonable agreement with the experimentally measured dielectric constant of the patterned layer can be seen.

Field-Effect Transistors (FETs)-A Model System for Semiconductor Characterization.

Fabrication of FETs. Si wafers (heavily n-doped, ρ<0.005 Ωcm, QL) with 100 nm $SiO_2$ dielectric were used as the bottom gate and as a substrate for FET fabrication. The substrates, 1 cm×1 cm in size, were immersed in piranha (conc. $H_2SO_4$ and 30% aqueous $H_2O_2$, 5:3 by volume) and heated for 10 min until the oxygen stopped bubbling. Once the substrates cooled down, they were rinsed with water multiple times. Colloidal solutions of inorganic materials with photosensitive ligands were spin-coated out of $N_2H_4$, NMF, or DMF (spread: 600 rpm, 6 s; spin: 2000 rpm, 40 s) onto freshly cleaned substrates to produce 30-100 nm thick NC films. The NC films were irradiated under DUV in the glovebox and developed in corresponding solvents. After drying at 100° C. for 30 min to evaporate the solvent, the film was then annealed at 350° C. for 30 min to decompose the ligand and to promote NC grain growth. A 70 nm thick Al source and drain electrodes were deposited through a shadow mask using a thermal evaporator to complete a top-contact, bottom-gate FET structure (channel width and length were 180 μm and 30 μm, respectively). In this example, thermally grown $SiO_2$ was used as the gate dielectric.

FET characterization. The source electrode was grounded, and the source-gate voltage, $V_{GS}$, and the source-drain voltage, $V_{DS}$, were controlled. All electron mobility values were extracted from the forward-gate voltage sweep ($V_{GS}$ from −30 V to 30 V), which provides a conservative estimate for electron mobility.

Calculation of field-effect mobility. In the gradual channel approximation, the current in the FET channel can be analytically described for two different regimes of operation. At $V_{DS}$<<$V_{GS}$−$V_t$, the channel current, $I_D$, increases linearly with the gate voltage.

$$I_D = \frac{W}{L}C\mu_{lin}\left(V_{GS} - V_t - \frac{V_{DS}}{2}\right)V_{DS}$$

Here, C is the capacitance per unit area of the insulating layer (30 $nF/cm^2$), $V_t$ is the threshold (turn-on) voltage, and $\mu_{lin}$ is the linear field-effect mobility. $\mu_{lin}$ is calculated from the transconductance (the slope of the transfer curve in the region with $V_{GS}$−$V_t$>>$V_{DS}$):

$$\frac{\partial I_D}{\partial V_{GS}}\bigg|_{V_{DS}} = \frac{W}{L}CV_{DS} \cdot \mu_{lin}$$

For $V_{DS}$>>$V_{GS}$−$V_t$, $I_D$ tends to saturate due to pinch-off of the accumulation layer (saturation regime). This case is approximately described by:

$$I_D = \frac{1}{2}\frac{W}{L}C\mu_{sat}(V_{GS} - V_t)^2$$

The saturation mobility can be calculated from the slope of $\sqrt{I_D}$ as a function of $V_{GS}$:

$$\frac{\partial \sqrt{I_D}}{\partial V_{GS}}\bigg|_{V_{DS}} = \sqrt{\frac{1}{2}\frac{W}{L}CV_{DS} \cdot \mu_{sat}}$$

X-ray structure solution and refinement. The space group was determined as P 1 21/n 1, based on systematic absences and intensity statistics. Final refinement was anisotropic for all atoms. No anomalous bond lengths or thermal parameters were noted.

TABLE 2

Crystal structure for $[(C_6H_5)_2I]_2 \cdot CdCl_4$.

| | |
|---|---|
| Empirical formula | $[(C_6H_5)_2I]_2 \cdot CdCl_4$. |
| Formula weight | 816.4 |
| Crystal system | Monoclinic |
| Space Group | P 1 21/n 1 (14) |
| Unit cell dimensions | a = 9.9476 (8) Å |
| | b = 15.1645 (13) Å   β = 93.798 (3)° |
| | c = 17.9659 (17) Å |
| Volume | 2704.21 (40) Å$^3$ |
| Z | 4 |
| Density (calculated) | 2.005 Mg/m$^3$ |

TABLE 3

Crystal structure for $[(C_6H_5)_2I]_2 \cdot ZnCl_4$.

| | |
|---|---|
| Empirical formula | $[(C_6H_5)_2I]_2 \cdot ZnCl_4$ |
| Formula weight | 766.37 |
| Crystal system | Monoclinic |
| Space Group | P 1 21/n 1 (14) |

TABLE 3-continued

Crystal structure for $[(C_6H_5)_2I]_2 \cdot ZnCl_4$.

| Unit cell dimensions | a = 9.8777 (13) Å |  |
|---|---|---|
|  | b = 15.085 (2) Å | β = 112.158 (9)° |
|  | c = 17.821 (2) Å |  |
| Volume | 2650.86 (60) Å³ |  |
| Z | 4 |  |
| Density (calculated) | 1.928 Mg/m³ |  |

The positive tone inorganic ink was prepared with procedures similar to those of other PAG systems described elsewhere herein. Briefly, NCs exchanged with traditional inorganic ligands were dissolved in DMF with a concentration of 20-30 mg/mL. 0.7 mg of $Ph_2I$-pyranine PAG dissolved in 10 μL of an anhydrous protic solvent like ethanol was mixed with 100 μL of NCs in DMF to form a colloidally stable, photosensitive, inorganic solution. The spin-coated NC films were exposed under a 356 nm DUV lamp at 132 mJ/cm² and developed in NMF. The $Ph_2I$-pyranine PAG had a broad absorption in the wavelength region of 320-420 nm from the anion, and a strong absorption peak at 227 nm from the $Ph_2I^+$ cation. The intramolecular electron transfer from anion to cation took place during irradiation, and the PAG reaction was triggered.

TABLE 4

Summary of FET performance of photopatterned solution-processed semiconductors.

| System | Highest $\mu_{lin}$, cm²/Vs | On/off ratio for this device | $\mu_{sat}$ for this device, cm²/Vs | Highest on/off ratio |
|---|---|---|---|---|
| IGZO-PAG | 11.6 | $10^3$ | 8.3 | $10^5$ |
| CdSe/$NH_4$TTT | 16.7 | 10 | 6.6 | $10^2$ |
| CdSe/$(N_2H_5)_2In_2Se_4$/NMF | 30 | $5 \times 10^4$ | 27 | $5 \times 10^4$ |
| CdSe/$Na_2Cd_2Se_3$/$N_2H_4$ | 84 | $10^7$ | 33 | $10^7$ |
| CdSe/$Na_2Cd_2Se_3$ + $CdCl_2$ | 109 | 300 | 73 | $10^7$ |
| CdSe/$NH_4CdCl_3$/py-PAG | 20 | $10^3$ | 17 | $10^5$ |

Example 2

This example illustrates a method of patterning films of ligand-capped inorganic particles using electron beam (E-beam) lithography. E-beam lithography is typically conducted as a serial patterning technique. An exemplary ink for use in E-beam lithography is prepared by dissolving $S_2CN_3^-$ (TTT) treated nanocrystals in a DMF solution. Suitable nanocrystals include group II-VI, group III-V, metal oxide, metal, and core-shell nanocyrstals. An inorganic film can be patterned in a method comprising: forming a film of the ligand-capped inorganic nanocrystals; irradiating a first portion of the film with an E-beam, wherein the interaction between the radiation and the photosensitive anion results in the chemical modification of the film, while preventing a second portion of the film from being irradiated by the radiation; and contacting the film with an organic solvent that dissolves the second portion of the film, but not the first portion of the film.

Figure 6:
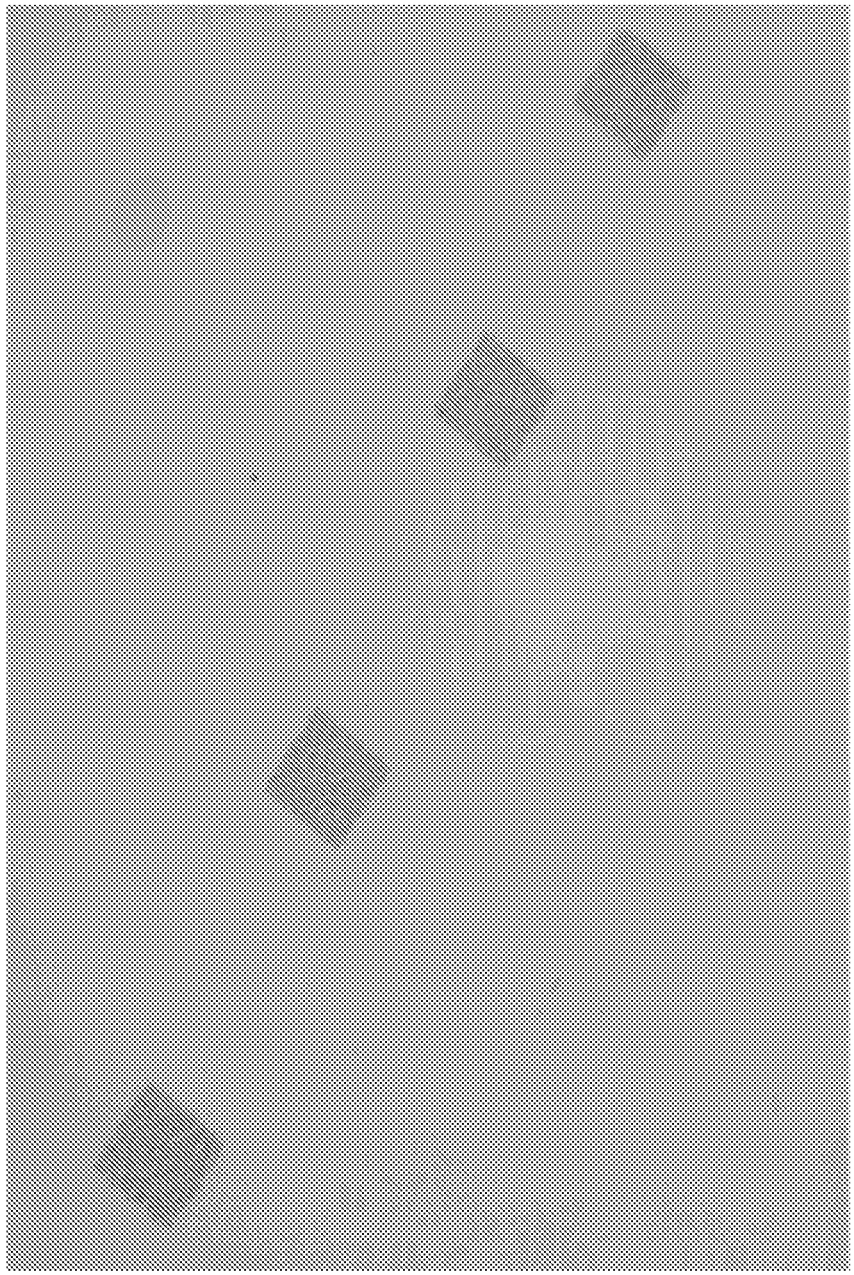
FIG. 6 is a microscopic image of an Au—S$_2$CN$_3$ NCs pattern, the size of each square is 50 μm×50 μm.

In this example, gold nanocrystals capped with $S_2CN_3$—$NH_4$ ligands (Au—$S_2CN_3$—$NH_4$ NCs) were used as an illustrative example. The Au nanocrystals, which are initially capped with organic ligands, were first treated by $NH_4S_2CN_3$ ($NH_4$TTT) for ligand exchange, and redissolved in DMF, forming a stable colloidal solution. After spin-coating the solution onto an Si wafer, the Au-TTT film was exposed to an E-beam (Using a Hitachi S-2700 scanning electron microscope equipped with an NPGS 8.0 Nanopatterning system), and square patterns with dimensions of 50 μm×50 μm were obtained upon developing in DMF (FIG. 6). The energy effect was studied as well. According to the patterns from right to left, corresponding to dose ranges from 1 to 4 mC/cm², the patterns exposed to higher E-beam doses had brighter contrast than those exposed to comparatively lower doses.

Examples of FET transfer and output curves are shown in FIGS. 14A-14F and FIGS. 15A-15D.

Example 3

This illustrates a method making a photopatternable film comprising $CeO_2$ nanocrystals and the non-ionic PAG hydroxynaphthalimide triflate and patterning the film using Direct Optical Lithography of Functional Inorganic Nanomaterials and electron beam lithography.

Ink preparation: Organic ligand-capped $CeO_2$ nanocrystals were diluted with toluene to form a stable solution with the concentration of 80 mg/mL. $NOBF_4$, which was used as a stripping agent, was first dissolved in DMF (20 mg/mL) and then introduced into the $CeO_2$ solution at a ratio of 2:1 (NCs:$NOBF_4$) by weight. The precipitate was isolated by centrifugation and washed by toluene at least three times. The resulting $CeO_2$ nanocrystals were purified using toluene and DMF for several precipitation-redispersion cycles. The purified NCs were then dissolved in DMF at a concentration of ~40 mg/mL. A photosensitive ink was then prepared by mixing the $CeO_2$ nanocrystals with the PAG (2.5% by weight for DOLFIN and 15% for electron beam lithography) in DMF and MeOH co-solvent system (v/v: 10:1).

Patterning method: The nanocrystal-containing films were formed by spin-coating the nanocrystal solutions on a substrate and allowing the coatings to dry. The resulting films were then exposed under UV light (365 nm) using commercial Mask Aligner instrument at a 600 mJ/cm² dose and developed in DMF.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photopatternable film comprising:
   inorganic crystals, each inorganic crystal having a surface;
   inorganic anions bound to the surfaces of the inorganic crystals; and either:
   photosensitive photoacid generator cations associated with the inorganic anions, whereby the inorganic anions and the photosensitive photoacid generator cations form a cation/anion pair; or
   non-ionic photoacid generators mixed with the inorganic crystals.

2. The film of claim 1, wherein the inorganic anions comprise metal halides, metal chalcogenides, metal oxides, chalcogenides, halides, $O^{2-}$, pseudohalides selected from $CN^-$, $N_3^-$, $SCN^-$, and $OCN^-$, or a combination of two or more thereof.

3. The film of claim 1, wherein the film comprises the photosensitive photoacid generator cations.

4. The film of claim 3, wherein the photoacid generator cations comprise diaryliodonium, triarylsulfonium, diarylalkylsulfonium, or a combination thereof.

5. The film of claim 4, wherein the inorganic anions and photoacid generator cations form ligands having the formula $A_2MX_4$, $A\text{-}MX_3$, or $A_n\text{-}MX_6$ wherein A represents the diaryliodonium, triarylsulfonium, diarylalkylsulfonium, or the combination thereof, M represents a metal atom, X represents a halogen atom, and where n=2, 3, or 4.

6. The film of claim 3, wherein the photoacid generator cations comprise bis(4-tert-butylphenyl)iodonium, boc-methoxyphenyldiphenylsulfonium, (tert-butoxycarbonyl-methoxynaphthyl)-diphenylsulfonium, (4 tert butylphenyl) diphenylsulfonium, diphenyliodonium, (4 fluorophenyl) diphenylsulfonium, (4 iodophenyl)diphenylsulfonium, (4-methoxyphenyl)diphenylsulfonium, (4 methylthiophenyl)methyl phenyl sulfonium, (4-phenoxyphenyl)diphenylsulfonium, (4 phenylthiophenyl)diphenylsulfonium, triarylsulfonium, triphenylsulfonium, tris(4-tert-butylphenyl) sulfonium, (4-methylphenyl) diphenylsulfonium or a combination of two or more thereof.

7. The film of claim 1, wherein the inorganic crystals comprise metal crystals, semiconductor crystals, oxide crystals, magnetic crystals, dielectric crystals, light up-converting crystals, or a combination of two or more thereof.

8. The film of claim 1, wherein the inorganic crystals comprise Group II-VI crystals.

9. The film of claim 8, wherein the Group II-VI crystals comprise CdSe crystals, CdTe crystals, ZnS crystals, ZnSe crystals, ZnO crystals, HgSe crystals, HgTe crystals, HgS crystals, $Hg_xCd_{1-x}Te$ crystals, $Hg_xCd_{1-x}S$ crystals, $Hg_xCd_{1-x}Se$ crystals, $Cd_xZn_{1-x}Te$ crystals, $Cd_xZn_{1-x}Se$ crystals, $Cd_xZn_{1-x}S$ crystals, CdS crystals, ZnTe crystals, or mixtures of two or more thereof, where 0<x<1.

10. The film of claim 1, wherein the inorganic crystals comprise Group III-V crystals.

11. The film of claim 10, wherein the Group III-V crystals comprise InP crystals, InAs crystals, InN crystals, InSb crystals, GaAs crystals, GaP crystals, GaN crystals, $In_{(1-x)}Ga_xAs$ crystals, where 0<x<1, $In_{1-x}Ga_xP$ crystals, where 0<x<1, or a mixture of two or more thereof.

12. The film of claim 1, wherein the inorganic crystals comprise metal oxide crystals.

13. The film of claim 12, wherein the metal oxide crystals comprise $Fe_2O_3$, $Al_2O_3$, $ZrO_2$, $CeO_2$, ZnO, FeO, $Fe_3O_4$, $HfO_2$, indium gallium zinc oxide (IGZO), $Ga_2O_3$, indium-tin oxide (ITO), $TiO_2$, $WO_3$, $VO_2$, or a mixture of two or more thereof.

14. The film of claim 1, wherein the inorganic crystals comprise metal crystals.

15. The film of claim 1, wherein the crystals comprise Au, Ag, Fe, Pt, FePt, AlN, AlP, AlAs, Bi, $Bi_2S_3$, $Bi_2Se_3$, $Bi_2Te_3$, Co, CoPt, $CoPt_3$, Cu, $Cu_2S$, $Cu_2Se$, $CuInSe_2$, $CuIn_{(1-x)}Ga_x(S,Se)_2$, $Cu_2ZnSn(S,Se)_4$, GaN, GaP, GaAs, GaSb, GaSe, Ge, InN, InSb, Ni, PbS, PbSe, PbTe, Pd, Ru, Rh, Si, Sn, $In_{(1-x)}Ga_xAs$, where 0<x<1, $In_{1-x}Ga_xP$, where 0<x<1, or a mixture of two or more thereof.

16. The film of claim 1, wherein the inorganic crystals are core-shell crystals.

17. The film of claim 16, wherein the core-shell crystals comprise a central core and an outer shell, and further wherein the core, the shell, or both, comprise Ag, Au, CdS, CdSe, CdTe, Fe, FeO, $Fe_2O_3$, $Fe_3O_4$, FePt, InP, InAs, PbS, PbSe, PbTe, Pt, ZnS, ZnSe, $In_{(1-x)}Ga_xAs$, where 0<x<1, In1-xGaxP, where 0<x<1, or a mixture of two of more thereof.

18. The film of claim 1, wherein the inorganic anions comprise a metal is selected from group 12 or group 13 of the periodic table.

19. The film of claim 5, wherein $MX_4$ is $CdCl_4$, $ZnCl_4$, or $InCl_4$, or wherein $MX_3$ is $PbCl_3$, $PbBr_3$, or $PbI_3$.

20. A method of patterning an inorganic film comprising:
    inorganic crystals, each inorganic crystal having a surface;
    inorganic anions bound to the surfaces of the inorganic crystals; and either:
    photosensitive photoacid generator cations associated with the inorganic anions, whereby the inorganic anions and the photosensitive photoacid generator cations form a cation/anion pair;
    or non-ionic photoacid generators mixed with the inorganic crystals, wherein the surfaces of the inorganic crystals are charge-balanced by the inorganic anions,
    the method comprising:
    irradiating a first portion of the film with radiation, wherein the interaction between the radiation and the photosensitive photoacid generator cations or the photosensitive non-ionic photoacid generators results in the chemical modification of the film, while preventing a second portion of the film from being irradiated by the radiation; and
    contacting the film with a solvent that dissolves the second portion of the film, but not the first portion of the film.

21. The method of claim 20, wherein the solid film comprises the photosensitive photoacid generator cations.

22. The method of claim 20, wherein the radiation comprises ultraviolet radiation.

23. The method of claim 20, wherein the radiation comprises an electron beam.

24. The film of claim 1, wherein the film comprises the photosensitive non-ionic photoacid generators.

25. The film of claim 24, wherein the photosensitive non-ionic photoacid generators are N-hydroxy-5-norbornene-2,3-dicarboximide perfluoro-1-butanesulfonate, 2-(4-methoxystyryl)-4,6-bis(trichloromethyl)-1,3,5-triazine, 4-N,N-dimethylaminophenyl p-toluenesulfonate, methyl trifluoromethane sulfonate, phenyl trifluoromethanesulfonate, 2-naphthyl trifluoromethanesulfonate, and 4-nitrophenyl trifluoromethanesulfonate, or a combination of two or more thereof.

26. The method of claim 20, wherein the film comprises the photosensitive non-ionic photoacid generators.

* * * * *